(12) United States Patent
Enomoto et al.

(10) Patent No.: US 7,411,260 B2
(45) Date of Patent: Aug. 12, 2008

(54) SEMICONDUCTOR DEVICE AND MANUFACTURING METHOD THEREOF

(75) Inventors: Hiroyuki Enomoto, Musashino (JP); Taro Asai, Hamura (JP); Shuntaro Machida, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/774,004

(22) Filed: Jul. 6, 2007

(65) Prior Publication Data

US 2008/0079099 A1 Apr. 3, 2008

(30) Foreign Application Priority Data

Sep. 29, 2006 (JP) ............................. 2006-266282

(51) Int. Cl.
*H01L 29/78* (2006.01)
(52) U.S. Cl. ............... 257/414; 257/416; 257/E29.324; 257/E21.002
(58) Field of Classification Search ................. 257/414, 257/416, E29.324, E21.002; 438/51
See application file for complete search history.

(56) References Cited

U.S. PATENT DOCUMENTS

| | | | |
|---|---|---|---|
| 6,271,620 B1 | 8/2001 | Ladabaum | |
| 6,320,239 B1 | 11/2001 | Eccardt et al. | |
| 6,562,650 B2 | 5/2003 | Ladabaum | |
| 6,571,445 B2 | 6/2003 | Ladabaum | |

OTHER PUBLICATIONS

J. Knight et al., "Fabrication and Characterization of cMUTs for Forward Looking Intravascular Ultrasound Imaging," 2003 IEEE Ultrasonics Symposium, 2003, pp. 577-580.

*Primary Examiner*—Evan Pert
*Assistant Examiner*—Tan N Tran
(74) *Attorney, Agent, or Firm*—Miles & Stockbridge P.C.

(57) ABSTRACT

A method for improving productivity when manufacturing a semiconductor device. A lower electrode, insulating films, an upper electrode and insulating films are formed on a semiconductor substrate in a sensor region. A cavity is formed between the insulator films above the lower electrode. The lower electrode, insulating film, the cavity and insulating film, and an upper electrode form a variable capacity sensor. The cavity is formed by etching a sacrificial pattern between the insulation films by way of a hole formed in a pair of insulation films. Other than in the above sensor region, a dummy lower electrode and four insulating films are formed on the TEG region on the semiconductor substrate; and a dummy cavity is formed between a pair of insulation films above the lower electrode however no conductive layer on the same layer as the upper electrode is formed on the dummy cavity.

17 Claims, 31 Drawing Sheets

FIG. 10
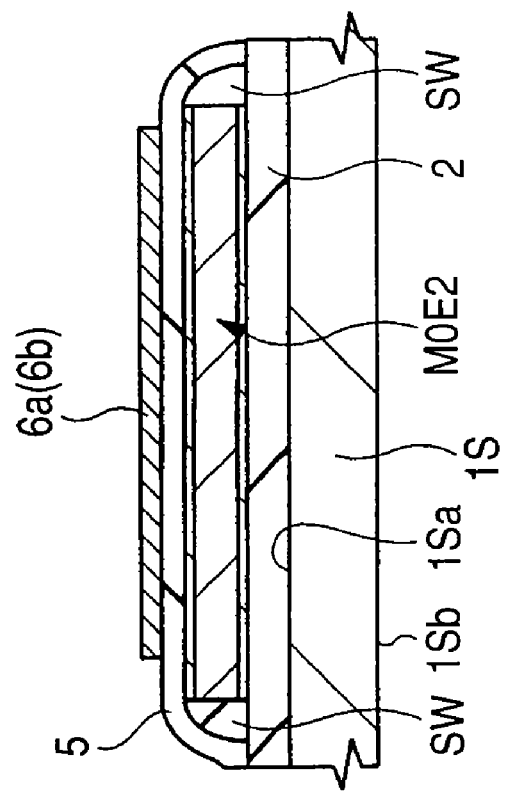
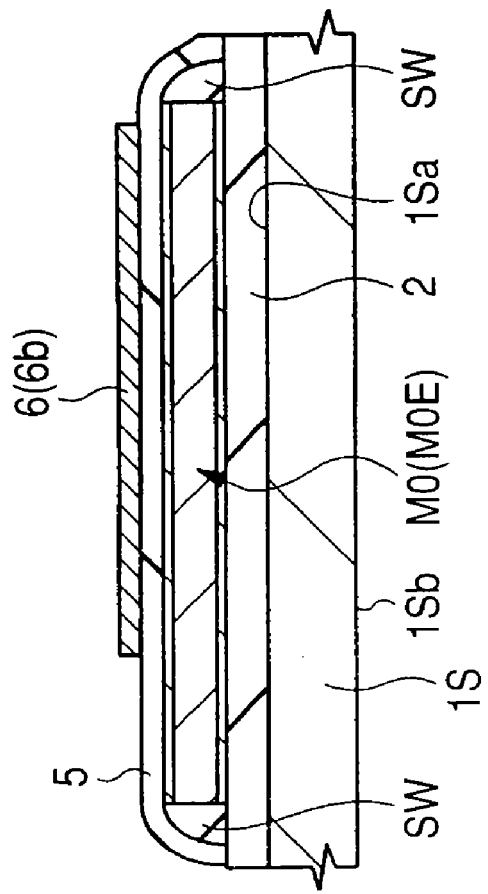

SENSOR REGION SA

TEG REGION TA1

SENSOR REGION SA

TEG REGION TA1

SENSOR REGION SA

TEG REGION TA1

SENSOR REGION SA

TEG REGION TA1

SENSOR REGION SA

TEG REGION TA1

SENSOR REGION SA

TEG REGION TA1

SEMICONDUCTOR DEVICE AND MANUFACTURING METHOD THEREOF

CLAIM OF PRIORITY

The present application claims priority from Japanese application JP 2006-266282 filed on Sep. 29, 2006, the content of which is hereby incorporated by reference into this application.

FIELD OF THE INVENTION

The present invention relates to a semiconductor device and a manufacturing method for that semiconductor device, and relates in particular to technology for ultrasonic sensors manufactured by MEMS (Micro Electro Mechanical System) technology and a manufacturing method for that ultrasonic sensor.

BACKGROUND OF THE INVENTION

Ultrasonic sensors are utilized in diverse equipment including medical ultrasonic wave echo diagnostic equipment and ultrasonic flaw detection equipment for non-destructive testing.

Up until now ultrasonic sensors mainly utilized an oscillating piezoelectric element but progress has been made in developing capacitive-detection type ultrasonic sensors using MEMS technology that has made significant advances in recent years.

This capacitive detection type ultrasonic sensor utilizes an oscillator made up of a cavity between mutually opposing electrodes formed on a semiconductor substrate. Applying overlapping (multiplexing) direct current and alternating current voltages to each electrode causes a membrane to oscillate in the vicinity of the resonant frequency to generate ultrasonic waves. Current research efforts are attempting to apply this principle to develop electrode structures to contrive 1.5 dimensional arrays for short axial variable focusing and two-dimensional arrays for real-time 3D imaging.

Technology for this type of ultrasonic sensor is disclosed for example in U.S. Pat. No. 6,320,239B1. This specification discloses technology for a capacitive detection type ultrasonic transducer utilizing a lower electrode on the silicon substrate.

Technology was also disclosed for a capacitive detection type ultrasonic transducer formed above the patterned lower electrode (See for example, U.S. Pat. No. 6,271,620B1, "2003 IEEE Ultrasonics Symposium" (USA), 2003, p. 577-580).

Moreover, U.S. Pat. No. 6,571,445B2 and U.S. Pat. No. 6,562,650B2 disclose technology for a capacitive detection type ultrasonic transducer on the upper layer of a signal processor circuit formed on a silicon substrate.

SUMMARY OF THE INVENTION

A study by the present inventors revealed the following.

The ultrasonic sensor studied by the present inventors is a capacitive type ultrasonic sensor utilizing MEMS technology. Multiple ultrasonic sensor cells (oscillators) clustered in a honeycomb shape are formed on the main surface of the semiconductor chip forming this ultrasonic sensor.

These ultrasonic sensors are mainly a capacitive type cell structure including a lower electrode formed on the main surface of a semiconductor chip; and an upper electrode formed to face that lower electrode via a cavity. In ultrasonic sensors with this type of structure, a multiplexed voltage made up of direct current and alternating current is applied to the lower electrode and the upper electrode to cause a static electrical force to vibrate a membrane at a position above the cavity, at the resonant frequency and generate ultrasonic waves.

This type of ultrasonic sensor, a sacrificial layer is formed between the insulating films, and a cavity is formed by etching the sacrificial layer away by way of a hole formed in the insulating film. It is important at this time, to prevent any of the sacrificial layer from remaining after the etching. If any of the sacrificial layer remains after etching then the cavity cannot be formed in the specified shape when producing the ultrasonic sensor, the membrane positioned above the cavity cannot vibrate adequately so that the ultrasonic sensor cannot deliver full performance. A sacrificial layer that remains after etching therefore causes a drop in productivity when manufacturing the semiconductor equipment (ultrasonic sensor). A residual sacrificial layer from the etching also causes a drop in the ultrasonic sensor (semiconductor equipment) performance.

However, in the process where the cavity is gradually formed by etching the sacrificial layer away from the peripheral area around it while in a state where the upper electrode is formed above the sacrificial layer, it was found that this upper electrode blocks the view of the cavity so that the presence or absence of a residual sacrificial layer after etching cannot be confirmed by observation with an optical metal microscope, etc.

In order to avoid this problem, a method for forming the cavity prior to forming the upper electrode above the sacrificial layer was considered. However, forming the upper electrode after first forming the cavity, required using an insulating film such as silicon oxide to block the pre-formed hole for making the cavity. Since this insulating film was formed above the cavity, the upper electrode was placed even higher above this insulating film, so that the distance between the upper electrode and the lower electrode increased by an amount equal to the film thickness of this insulating film. This additional distance was found to cause the problem that the ultrasonic sensor (semiconductor device) transmit/receive sensitivity (performance) deteriorated.

This invention therefore has the object of providing a technology to improve the manufacturing productivity of the semiconductor device.

This invention has the further object of providing a technology for improving the semiconductor device performance.

The above and other objects as well as unique features of this invention will become apparent from the description of this invention and the attached drawings.

A simple description of the typical aspects disclosed in the specifications of this invention is given as follows.

This invention is a semiconductor device containing a sensor region formed from multiple sensor cells on the main surface and including: a semiconductor substrate, a first insulating film formed on the semiconductor substrate, a second insulating film formed on the first insulating film, a patterned first conducting layer formed on the second insulating film, a third insulating film formed to cover the first conducting layer on the second insulating film, a fourth insulating film formed on the third insulating film, and each of the multiple sensor cells include a first cavity formed between a first insulating film and a second insulating film, and a first electrode formed from a first conducting layer above the first cavity on the sensor region and, a first opening penetrating through the second and the third insulating film to reach the first cavity is formed on the second and third insulating films, and this first opening is blocked by a fourth insulating film, and a second cavity is formed between the first insulating film and the second insulating film on a first region other than the sensor region on the main surface of the semiconductor device and, a second opening penetrating through the second and the third insulating films to reach the second cavity is formed on the second and the third insulating films, and the second opening is blocked by the fourth insulating film, and among these second cavities, there is no first conducting layer formed above the position farthest from the second opening.

This invention includes a method for manufacturing a semiconductor device containing a sensor region formed from multiple sensor cells on the main surface and including: (a) a process for forming a first insulating film on the semiconductor substrate, (b) a process for forming a sacrificial pattern for forming a cavity on the first insulating film, (c) a process for forming a second insulating film so as to cover the sacrificial pattern on the first insulating film, (d) a process for forming a patterned first conducting layer on the second insulating film, (e) a process for forming a third insulating film so as to cover the first conducting layer on the second insulating film, (f) a process for forming an opening so as to expose a portion of the sacrificial pattern on the second and the third insulating films, (g) a process for forming a cavity between the first insulating film and the second insulating film by selectively etching the sacrificial pattern by way of the opening, (h) a process for forming a fourth insulating film so as to block the opening on the third insulating film after the (g) process; and each of the multiple sensor cells includes a cavity, and a first electrode formed above the cavity and made from the first conducting layer in the sensor region, and in the (b) process a first sacrificial pattern among the sacrificial patterns is formed on the sensor region, and second sacrificial pattern among the sacrificial patterns is formed on a first region other than the sensor region; and in the (f) process, a first opening is formed so as to expose a portion of the first sacrificial pattern, and a second opening is formed so as to expose a portion of the second sacrificial pattern, on the second and the third insulating films; and in the (g) process, the etched state of the second sacrificial pattern on the first region is observed after selectively etching the first and the second sacrificial patterns by way of the first and the second opening.

A simple description of the typical effects rendered by the invention disclosed in these specifications is described next.

This invention is capable of improving the productivity of the semiconductor device during manufacture.

This invention is moreover capable of improving the performance of the semiconductor device.

BRIEF DESCRIPTION OF THE DRAWINGS

FIG. 10 is an essential cross sectional view during the manufacturing process for the semiconductor device continuing from FIG. 9;

DETAILED DESCRIPTION OF THE PREFERRED EMBODIMENTS

Figure 1:
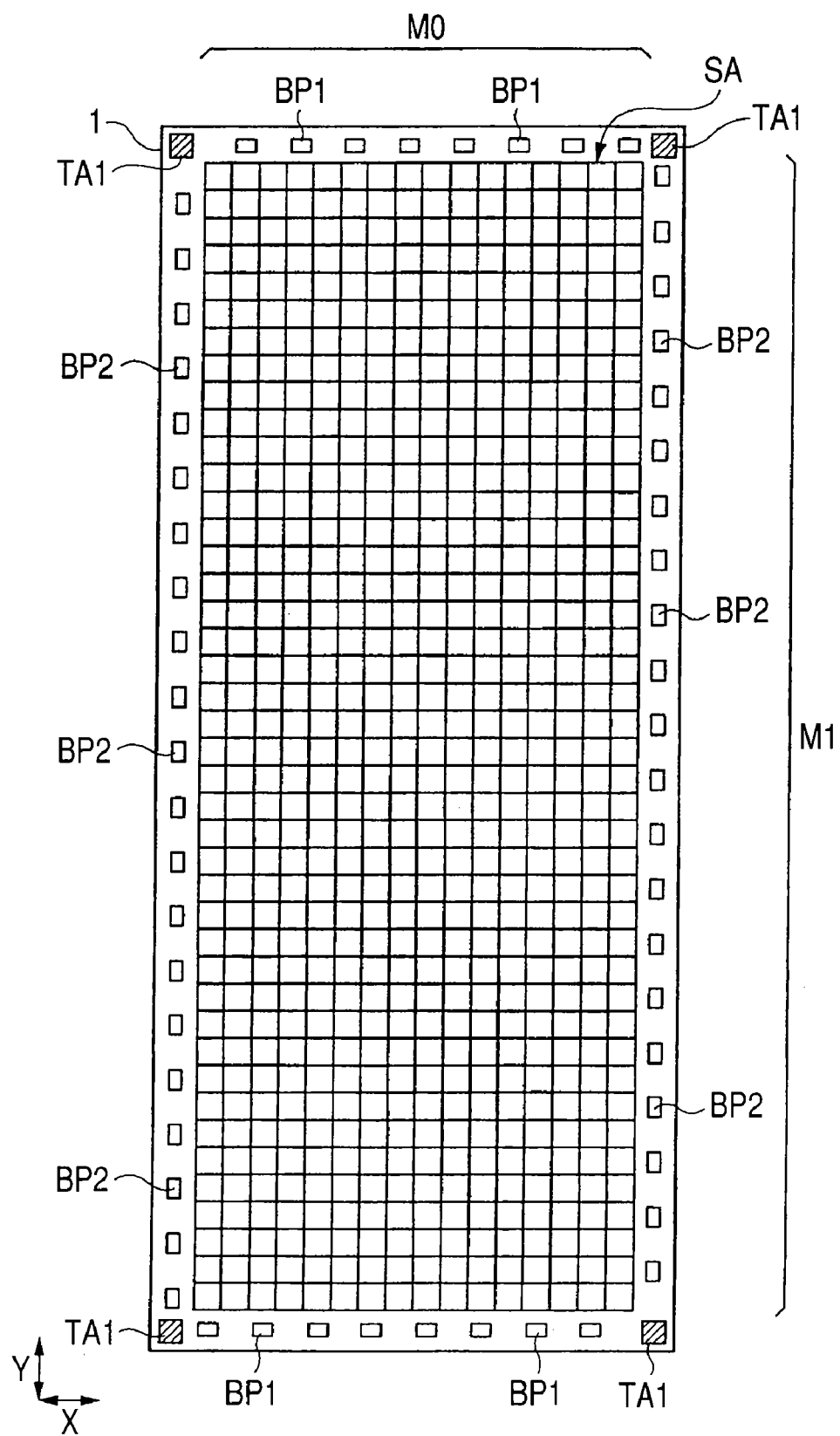
FIG. 1 is an overall flat view of the semiconductor chip forming the semiconductor device of the first embodiment.

The semiconductor substrate as referred to here, is a semiconductor single crystal substrate of silicon or other substrate including quartz substrate, sapphire substrate, glass substrate other insulators or non-insulators or semiconductor substrate as well as composites of those substrates utilized in the manufacture of semiconductor integrated circuits.

The following embodiments are described as multiple sections or separated in the embodiments as needed for purposes of convenience. However, unless specifically mentioned otherwise these are not mutually unrelated items, and to the contrary are related in part or in whole to the adaptation examples, detailed, and supplementary descriptions, etc. Moreover, when referring to the quantity of an element (including the pieces, numerical values, quantity, range, etc.) in the following embodiments, unless specified otherwise and unless clearly and basically limited to a specific quantity; then the invention is not limited to a specific quantity and may be less than or more than the specified quantity. Further, unless specified otherwise and unless necessary to clearly and basically limited to a specific quantity; then these structural elements are not necessarily required in the following embodiments. In the same way, when referring to the positional relation, and/or shape of the structural elements (including element steps) in the following embodiments, then except for cases where particularly specified or cases where basically and clearly not so, then structural elements substantially close to or resembling that shape or positional relation and so on may also be included. The same is also true for the above numerical values and range.

The embodiments of this invention are described next in detail while referring to the drawings. In all drawings for describing the embodiments, identical reference numerals are attached to members with the same functions and repeated descriptions are omitted. Unless specifically required, descriptions of the same or similar sections in the following embodiments are not usually repeated.

In the drawings for the following embodiments, cross-hatching is sometimes omitted in order to make the drawing easier to view even if a cross section. Moreover, cross-hatching is sometimes added in order to make the drawing easier to view even if a flat section.

First Embodiment

The semiconductor device of these embodiments is an ultrasonic transmitting/receiver sensor manufactured by utilizing MEMS (Micro Electro Mechanical System) technology.

FIG. 1 is an overall flat view of the semiconductor chip 1 forming the semiconductor device of these embodiments. FIG. 1 is a flat view but cross-hatching is applied to the TEG region TA1 in order to make the drawing easier to view.

The semiconductor chip 1 includes a first main surface (upper surface, front surface) and a second main surface (lower surface, rear surface) positioned on mutually opposite sides along the direction of thickness. FIG. 1 shows a flat surface view (namely an upper view) of the first main surface on the semiconductor chip.

The flat surface shape of the semiconductor chip 1 as shown in FIG. 1 is formed for example in a rectangular shape. The length of the semiconductor chip 1 in the longitudinal direction (second direction Y) is for example about 4 centimeters, and in the short dimension direction (first direction X) is for example about 1 centimeter. However, the flat surface dimensions of the semiconductor chip 1 are not limited to these dimensions and are changeable. The sensor may be various sizes and for example may be a length of approximately 8 centimeters in the longitudinal direction (second direction Y), and approximately 1.5 centimeters in the short dimension direction (first direction X).

A sensor area (sensor cell array, oscillator array) SA, and multiple bonding pads (hereafter called pads) BP1, BP2, and TEG regions TA1 (first region) are formed on the first main surface of the semiconductor chip 1.

Multiple lower electrode wiring M0 and, multiple upper electrode wiring M1 intersecting it (M0 wiring) and multiple oscillators (sensor cells, corresponding to oscillators 20 described later on) are formed on the sensor region SA.

The multiple lower electrode wiring M0 are respectively formed to extend in the longitudinal direction (second direction Y) of the semiconductor chip 1; and formed for example arrayed in 16 channels (channels is hereafter abbreviated to ch) along the short dimension direction (first direction X) of semiconductor chip 1.

The multiple lower electrode wiring M0 are respectively electrically connected to the pads BP1. The pads BP1 are on the outer circumference of the sensor region SA. Multiple pads BP1 are formed at both longitudinal ends (second direction Y) on semiconductor chip 1 and arrayed along the short dimension direction of semiconductor chip 1 in order to correspond to the lower electrode wiring M0.

The multiple upper electrode wiring M1 are respectively formed to extend in the short dimension direction (first direction X) of the semiconductor chip 1, and formed arrayed for example in 192 channels in the longitudinal direction (second direction Y) of semiconductor chip 1.

The multiple upper electrode wiring M1 are respectively electrically connected to the pads BP2. The pads BP2 are on the outer circumference of the sensor region SA. The multiple pads BP2 are formed at both ends on the short dimension direction (first direction X) of semiconductor chip 1, and arrayed along the longitudinal sides of the semiconductor chip 1 in order to correspond to the lower electrode wiring M1.

The oscillators (corresponding to oscillator 20 described later on) are for example a static variable capacitive structure, and formed at the intersections of the upper electrode wiring M1 and the lower electrode wiring M0. In other words, the multiple oscillators (corresponding to oscillator 20 described later on) are formed arrayed regularly in a matrix (matrix array) within the sensor region SA. Fifty oscillators are for example arrayed in parallel at the intersection of the upper electrode wiring M1 and the lower electrode wiring M0 within the sensor region SA.

The sensor region SA is therefore a sensor region made up of multiple sensor cells (corresponding to oscillator 20 described later on). The semiconductor chip 1 is a semiconductor device containing a sensor region SA made up of multiple sensor cells (corresponding to oscillator 20 described later on) on the main surface (first main surface) of the semiconductor chip 1.

The TEG region TA1 is formed on the outer circumference (in other words, a region other than the sensor region SA) of the sensor region SA on the first main surface of the semiconductor chip 1, and may be formed for example near the corner of the first main surface of the semiconductor chip 1. The flat dimensions of the TEG region TA1 may be for example approximately 1 mm×1 mm. The TEG region TA1 is a region formed with a TEG (Test Element Group) pattern for verifying the wafer process. In this embodiment, a dummy oscillator (corresponding to dummy oscillator 20a described later on) utilized for preventing the sacrificial pattern 6 (described later on) from remaining after etching, is formed on the TEG region TA1.

Figure 2:
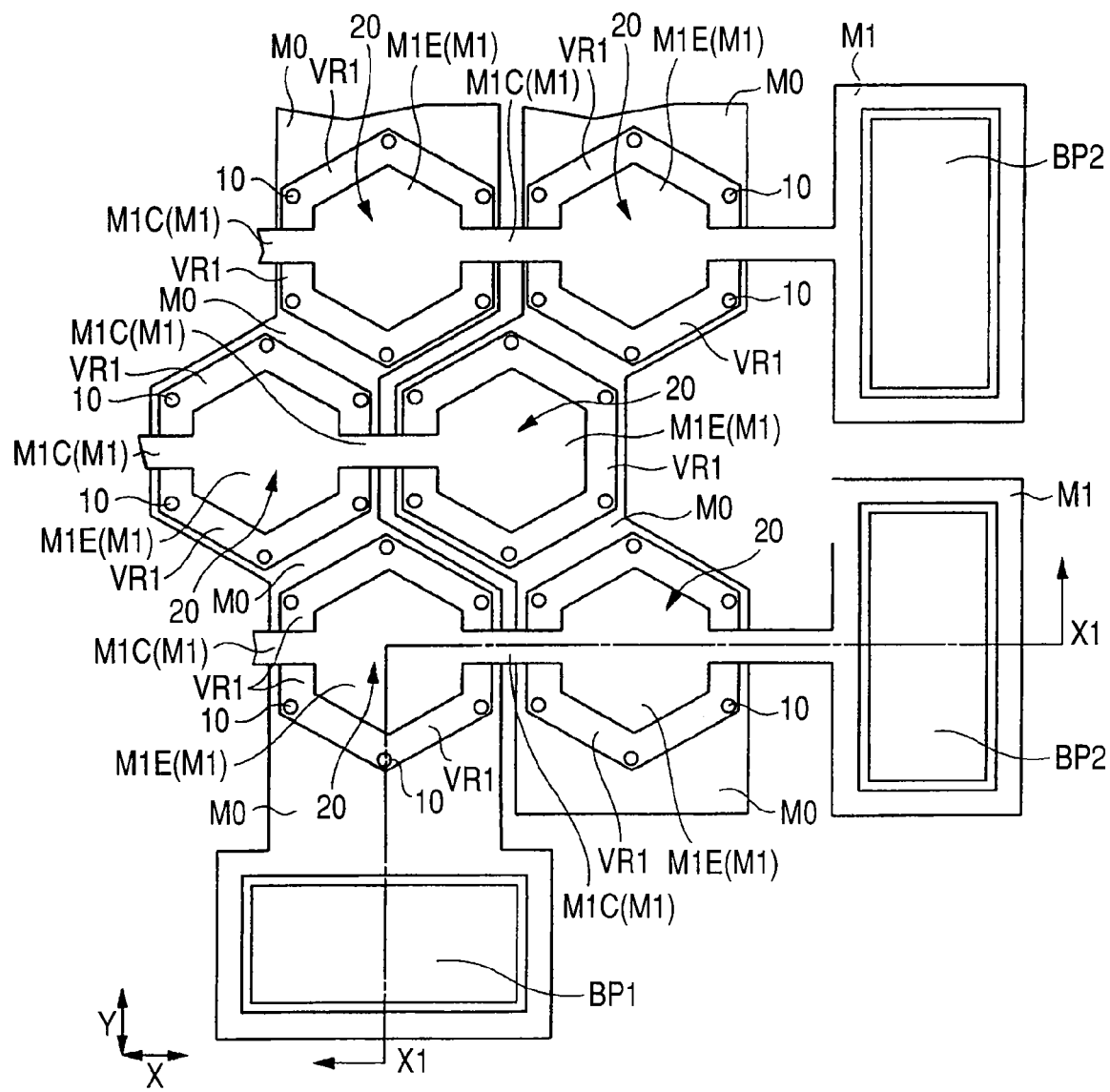
FIG. 2 is an enlarged flat view of the semiconductor chip in FIG. 1.
Figure 3:
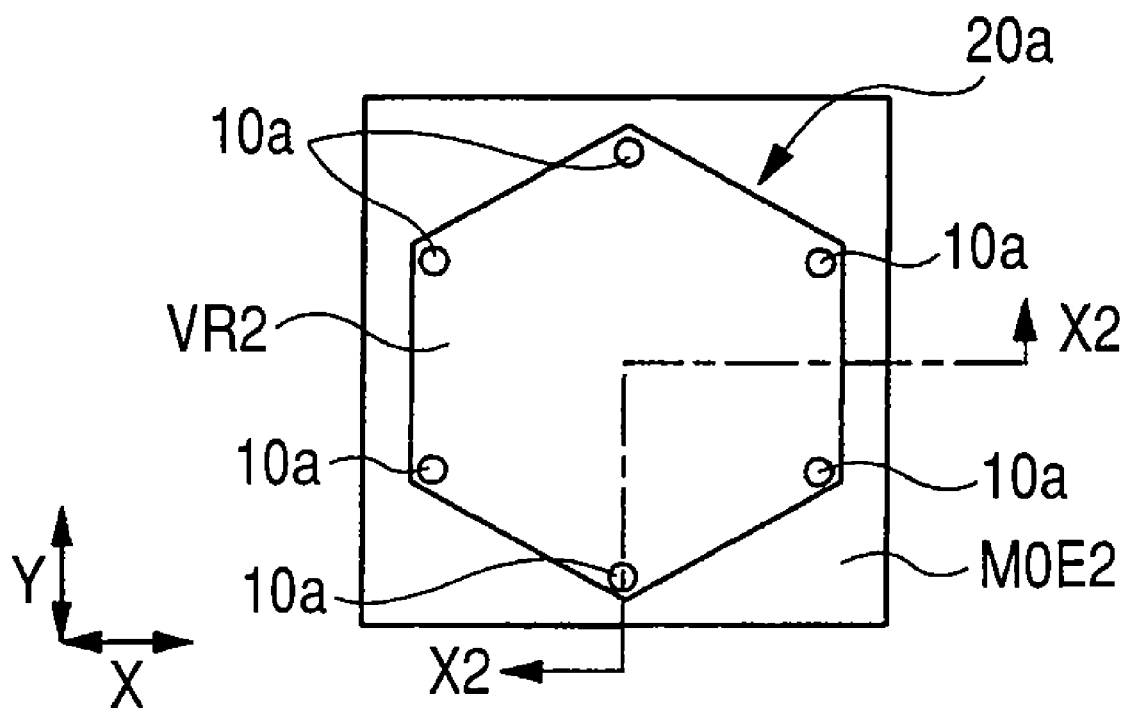
FIG. 3 is an enlarged flat view showing the semiconductor chip in FIG. 1.
Figure 4:
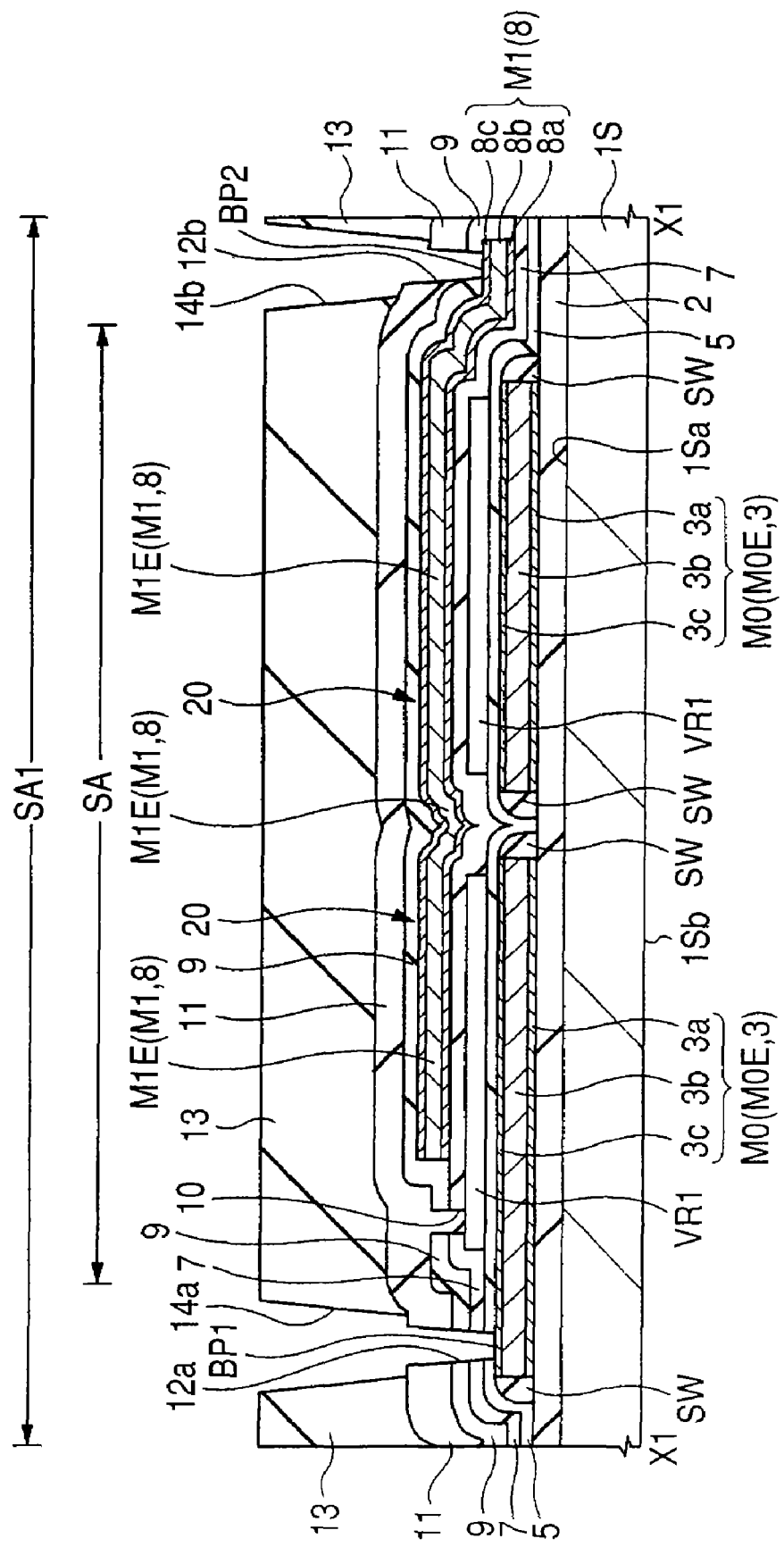
FIG. 4 is a cross sectional view taken along lines X1-X1 of FIG. 2.
Figure 5:
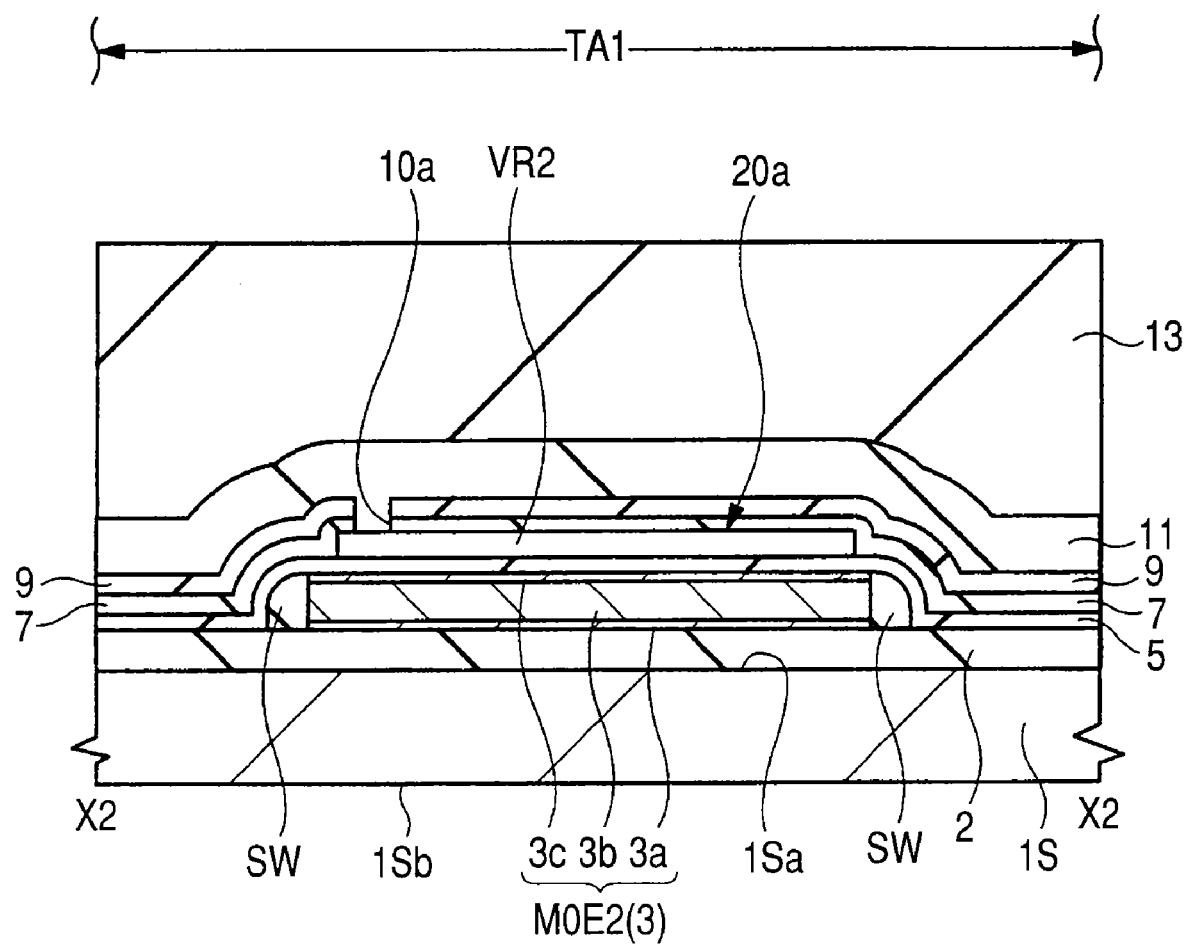
FIG. 5 is a cross sectional view taken along lines X1-X1 of FIG. 3.

FIG. 2 and FIG. 3 are flat (essential enlarged flat views) views showing an essential portion of the semiconductor chip 1. FIG. 4 and FIG. 5 are cross sectional views showing an essential section of the semiconductor chip 1. FIG. 2 and FIG. 4 show a flat view of an essential section and a cross sectional view of an essential section of main region SA1 (region combining both sensor region SA and the bonding pad BP1, BP2 forming regions) on semiconductor chip 1. FIG. 3 and FIG. 5 show a flat view of an essential section and a cross sectional view of an essential section of the TEG region TA1 on semiconductor chip 1. FIG. 4 is a cross-sectional view taken largely upon lines X1-X1 of FIG. 2. FIG. 5 is a cross sectional view taken largely upon lines X2-X2 of FIG. 3. FIG. 2 is a flat view showing one oscillator formed at the intersection of the upper electrode wiring M1 and the lower electrode wiring M0. For purposes of simplicity, the case in the flat view shown FIG. 2 (this region) utilizes 2 channels of lower electrode wiring M0, 3 channels of upper electrode wiring M1, and one oscillator 20 positioned at the intersection of each upper electrode wiring M1 and the lower electrode wiring M0. One dummy oscillator 20a is also shown in FIG. 3 (TEG region TA1)

A semiconductor substrate 1S that forms the semiconductor chip 1 is made for example from single crystal silicon (Si). The semiconductor substrate 1S respectively includes a first main surface (top surface, front surface) 1Sa and a second main surface (bottom surface, rear surface) 1Sb mutually positioned on opposite sides of the substrate thickness direction. Multiple oscillators 20 are positioned (formed) by way of an insulating film 2 made from silicon oxide ($SiO_2$, etc.) on the first main surface 1Sa of the semiconductor substrate 1S, as shown in FIG. 2 and FIG. 4.

The multiple oscillators 20 are formed for example in a hexagonal shape as shown in FIG. 3 and arrayed for example in a honeycomb shape. The multiple oscillators 20 can in this way be arrayed in a high density to improve the sensor performance.

The oscillators 20 include a lower electrode M0E, and an upper electrode M1E formed so as to face each other, and contain a cavity VR1 (first cavity) interposed between these electrodes.

The lower electrode M0E is formed so that the upper electrode wiring M1 flatly overlaps the lower electrode wiring M0 in localized sections. The lower electrode M0E of each oscillator 20 is in other words, formed from a section of the lower electrode wiring M0; and the sections of the lower electrode wiring M0 that flatly overlap sections of the upper electrode M1 (in other words, a section located below the upper electrode wiring M1) form the lower electrode M0E. The lower electrode M0E and the lower electrode wiring M0 are made from a conducting layer (laminated film 3) and are formed for example by laminating the layers sequence starting from the bottom layer in the order of titanium nitride (TiN) film 3a, aluminum (Al) film 3b and titanium nitride film 3c. Tungsten (W) film may be utilized instead of the titanium nitride film 3c.

In view of the need to reduce the step due to the thickness of lower electrode M0E and lower electrode wiring M0, a sidewall (side wall insulating film, side wall spacer) SW is formed for example from an insulating piece such as silicon oxide, on the side surface of the lower electrode M0E and lower electrode wiring M0. An insulating film 5 made for example from silicon oxide covers the surfaces of the lower electrode M0E, lower electrode wiring M0, insulating film 2, and the sidewall SW.

An insulating film 7 made for example from silicon oxide is deposited onto this insulating film 5. The upper electrode M1E is formed so as to face the lower electrode M0E on the insulating film 7.

The upper electrode M1E is formed so that the upper electrode wiring M1 flatly overlaps the lower electrode wiring M0 in localized sections. In other words, the upper electrode M1E of each oscillator 20 is formed from a section of the upper electrode wiring M1; and sections of the upper electrode wiring M1 that flatly overlap sections of the lower electrode wiring M0 (in other words, sections located above the lower electrode wiring M0) form the upper electrode M1E. The flat surface of upper electrode M1E is formed in a hexagonal shape. The upper electrode wiring M1 extends in the first direction X and is formed in a wider pattern than the connector section M1C that connects between the upper electrodes M1E. This upper electrode wiring M1 therefore includes multiple upper electrodes M1E and, a connector section M1C for connecting between the upper electrodes M1E that adjoin in the first direction X.

The upper electrode wiring M1 containing the upper electrodes M1E and the connector section M1C is made from a conducting layer (laminated film 8). The conducting layer is formed by depositing for example titanium nitride (TiN) film 8a, aluminum (Al) film 8b and titanium nitride (TiN) film 8c in sequence starting from the bottom layer. Tungsten (W) film may be utilized instead of the titanium nitride film 8c.

A cavity VR1 is formed between the lower electrode M0E and the upper electrode M1E (between insulating film 5 and insulating film 7) as described above. The flat shape of the cavity VR1 is formed into a hexagonal shape.

An insulating film 9 made from a film such as silicon nitride ($Si_3N_4$, etc.) is deposited on the insulating film 7 so as to cover the upper electrode wiring M1 including the upper electrode M1E and the connecting piece M1C. Holes (openings, contact holes, through-holes) 10 reaching the cavity VR1 are formed in the insulating films 7, 9 near the hexagonal section of the cavity VR1. These holes 10 as described later on, are holes (holes for forming cavity VR1) for etching the sacrificial pattern (sacrificial pattern 6 described later on) between the insulating films 5, 7 through the holes 10 and to form the cavity VR1.

An insulating film 11 made for example from silicon nitride film is deposited on the insulating film 9. A portion of this insulating film 11 fits inside the hole 10 and in this way blocks the hole 10.

An opening 12a reaching a portion of the lower electrode wiring M0 is formed on the insulating films 5, 7, 9, and 11. A portion of the lower electrode wiring M0 exposed from this opening 12a, forms the pad BP1. An opening 12b reaching a portion of the electrode wiring M1 is formed in the insulating film 9, 11. A portion of the upper electrode wiring M1 exposed from this opening 12b forms the pads BP2.

An insulating film (protective film) 13 for example, made from light-sensitive negative-type polyamide film, is deposited on the insulating film 11.

Openings 14a, 14b are formed on the insulating film 13. Of these openings, the opening 14a is formed with planar dimensions and at a position to enclose the opening 12a. A portion of the lower electrode wiring M0 exposed from the opening 14a forms the pad BP1. The opening 14b is formed with planar dimensions and at a position to enclose the opening 12b. A portion of the upper electrode wiring M1 exposed from the opening 14b forms the pad BP2. The pads BP1, BP2 are input/output terminals for the semiconductor chip 1. A bonding wire or other contrivance electrically connects to the pads BP1, BP2.

The insulating film 13 functions as a protective film to protect the multiple oscillators 20 on the first main surface of semiconductor chip 1 during the dicing process for cutting out the semiconductor chip 1 from the semiconductor wafer.

If unnecessary then forming of the insulating film 13 can be omitted, and the insulating film 11 utilized as the topmost film (protective film).

The oscillators 20 as described above are formed on the sensor region SA on the semiconductor chip 1. Moreover, as shown in FIG. 3 and FIG. 5, dummy oscillators 20a are positioned (formed) on the first main surface 1Sa of semiconductor substrate 1S, on a region other than the sensor region SA (here the TEG region TA1 is utilized) in the semiconductor chip 1 of this embodiment.

The dummy oscillator 20a possesses the same shape as the oscillator 20 and may for example be formed in a hexagonal shape. The dummy oscillator 20a includes a dummy lower electrode M0E2 and dummy cavity (second cavity) VR2 largely identical to the lower electrode M0E and cavity VR1 of oscillator 20. However the dummy oscillator 20 does not contain an upper electrode equivalent to the upper electrode M1E of oscillator 20.

The dummy lower electrode M0E2 is formed from a conducting layer (of the pattern) on the same layer as the lower electrode M0E (lower electrode wiring M0). The dummy cavity VR2 is formed from a cavity of the same layer as the cavity VR1. Therefore, when the lower electrode M0E and lower electrode wiring M0 are formed by laminations of titanium nitride (TiN) film 3a, aluminum (Al) film 3b and titanium nitride film 3c in order starting from the bottom layer as described above, then the dummy lower electrode M0E2 are also formed by film laminations of titanium nitride (TiN) film 3a, aluminum (Al) film 3b and titanium nitride film 3c in order starting from the bottom layer. Tungsten (W) film may be utilized instead of the titanium nitride film 3c.

A sidewall SW is formed on the side surface of the dummy lower electrode M0E2 the same as the lower electrode M0E and lower electrode wiring M0. An insulating film 5 cover the surfaces of the sidewall SW on the dummy lower electrode M0E2 and the its side surface. An insulating film 7 is deposited on the insulation film 5. The dummy cavity VR2 with the same contour (same dimensions) as the cavity VR1 is formed between the insulating film 5 and the insulating film 7 on the upper section of the dummy lower electrode M0E2. The cavity VR1 and the dummy cavity VR2 are essentially the same planar shape. The dummy cavity VR2 may therefore be formed for example in a hexagonal shape the same as the cavity VR1. The thickness (dimensions in a direction perpendicular to the main surface 1Sa of semiconductor substrate 1S) of the dummy cavity VR2 of the TEG region TA1 is also essentially the same as the cavity VR1 on the sensor region SA.

The upper electrode M1E is formed on the insulating film 7 so as to face the lower electrode M0E on the sensor region SA. However there is no electrode formed above the dummy lower electrode M0E2 on the TEG region TA1 that is equivalent to the upper electrode M1E.

An insulating film 9 is deposited on the insulating film 7. A hole (opening, connector hole, through hole) 10a reaching the dummy cavity VR2 is formed in the vicinity of the hexagonal section of the dummy cavity VR2 in the insulating films 7, 9 of the TEG region TA. The hole 10a as described later on, are holes (holes for forming a dummy cavity VR2) for etching a sacrificial pattern (sacrificial pattern 6a described later on) between the insulating films 5, 7 by way of the hole 10a to form the dummy cavity VR2. The position (forming position) of the hole 10 for the cavity VR1 is essentially the same as the position (forming position) of the hole 10a for dummy cavity VR2.

An insulating film 11 is deposited on the insulating film 9 in the TEG region TA1. A portion of this insulating film 11 fits inside the hole 10a and in this way blocks the hole 10a. An insulating film (protective film) 13 is deposited on this insulating film 11. If unnecessary as described above, then the forming of this insulating film 13 can be omitted, and the insulating film 11 utilized as the topmost film (protective film).

The semiconductor chip (semiconductor device) 1 of this embodiment is therefore a semiconductor device including a sensor region SA on which multiple sensor cells (oscillators 20) are formed on a main surface. The semiconductor chip 1 (or semiconductor device) includes semiconductor substrate 1S, an insulating film 5 (first insulating film) formed on this semiconductor substrate 1S, an insulating film 7 (second insulating film) formed on the insulating film 5, a patterned first conducting layer (here, a laminated film 8 of titanium nitride film 8a, aluminum film 8b and titanium nitride film 8c) that is formed on the insulating film 7 and, an insulating film 9 (third insulating film) formed so as to cover the first conducting layer on the insulating film 7 and, an insulating film 11 (fourth insulating film) formed on the insulating film 9. Each of the multiple sensor cells (oscillators 20) on the semiconductor chip 1 are made from a cavity VR1 (first cavity) formed between the insulating film 5 and insulating film 7 and, a first conducting layer (here, a laminated film 8 of titanium nitride film 8a, aluminum film 8b and titanium nitride 8c) on the sensor region SA1; and containing an upper electrode M1E (first electrode) formed on the upper section of the cavity VR1. A hole 10 (first opening) is formed in the insulating films 7, 9, and reaches the cavity VR1 by way of the insulating films 7, 9. The insulating film 11 blocks this hole 10. Further, a semiconductor chip 2 includes a dummy cavity VR2 (second cavity) formed between the insulating film 5 and the insulating film 7 on the first region (here, the TEG region TA1) other than the sensor region SA on the main surface containing the sensor region SA; and a hole 10a (second opening) penetrating through the insulating films 7, 9 and reaching the dummy cavity VR2 is formed on the insulating films 7, 9; and the insulating film 11 blocks the hole 10a. There is no first conducting layer (here the laminated film 8) formed above the position farthest from the hole 10a among the dummy cavities VR2 and in this embodiment there is no first conducting layer (here, laminated film 8) is formed on the upper section of the dummy cavity VR2; however a first conducting layer (laminated film 8) is formed above the dummy cavity VR2 in the second embodiment described later on).

The semiconductor chip 1 further includes a patterned second conducting layer (here, laminated film 3 of a titanium oxide film 3a, an aluminum film 3b and a titanium nitride film 3c) formed on the semiconductor substrate 1S and; the insulating film 5 is formed so at to cover the second conducting layer (here, the laminated film 3) on the semiconductor substrate 1S; and each of the multiple sensor cells (oscillators 20) on the semiconductor chip 1 is made from the second conducting layer (here, the laminated film 3) on the sensor region SA, and further includes a lower electrode M0E (second electrode) formed below the cavity VR1. The second conducting layer (here the laminated film 3) below the dummy cavity VR2, forms the lower electrode M0E2 of the dummy. Each of the multiple sensor cells (oscillators 20) on the semiconductor chip 2 are variable capacitive sensors formed from the lower electrode M0E (first electrode) and, the upper electrode M1E (second electrode) and, the insulating film 5 between the upper electrode M1E and the lower electrode M0E, and the cavity VR1 and the insulating film 7. The dummy cavity VR2 on the other hand is a cavity not utilized as a sensor; and the dummy lower electrode M0E2 is a dummy lower electrode not utilized as a sensor.

In ultrasonic send/receive sensors with this type of structure, a multiplexed voltage made up of direct current and alternating current is applied to the lower electrode wiring M0 (lower electrode M0E) and the upper electrode wiring M1 (upper electrode M1E) to cause a static electrical force to vibrate the membrane (membrane positioned above the cavity VR1) of each oscillator 20 to cause an oscillation due to a balance with the membrane spring force, in a direction (upper/lower direction in FIG. 3) intersecting the first main surface 1Sa on the semiconductor substrate 1S in the vicinity of the resonant frequency and generate ultrasonic waves of several megahertz (ultrasonic pulses). When receiving these ultrasonic waves, the pressure of the ultrasonic wave reaching the oscillator 20 membranes makes the membrane oscillate which allows detecting the ultrasonic wave by the change in static capacitance between the lower electrode M0E and the upper electrode M1E. In other words, the shift in intervals of the wave reflecting between the lower electrode M0E and the upper electrode M1E is detected as a change in the static capacitance (static capacitance of each oscillator 20).

The method for manufacturing the semiconductor device of this embodiment is described next while referring to FIG. 6 through FIG. 17. Here, FIG. 6 through FIG. 17 are essential cross sectional views of the process for manufacturing the semiconductor device of this embodiment, showing essential cross sectional views of the main region SA1 and the TEG region TA1. This region SA1 shown in FIG. 6 through FIG. 17 corresponds to the region shown in the left half of FIG. 4. The TEG region TA1 shown in FIG. 6 through FIG. 17 corresponds to the region shown in FIG. 5.

Figure 6:
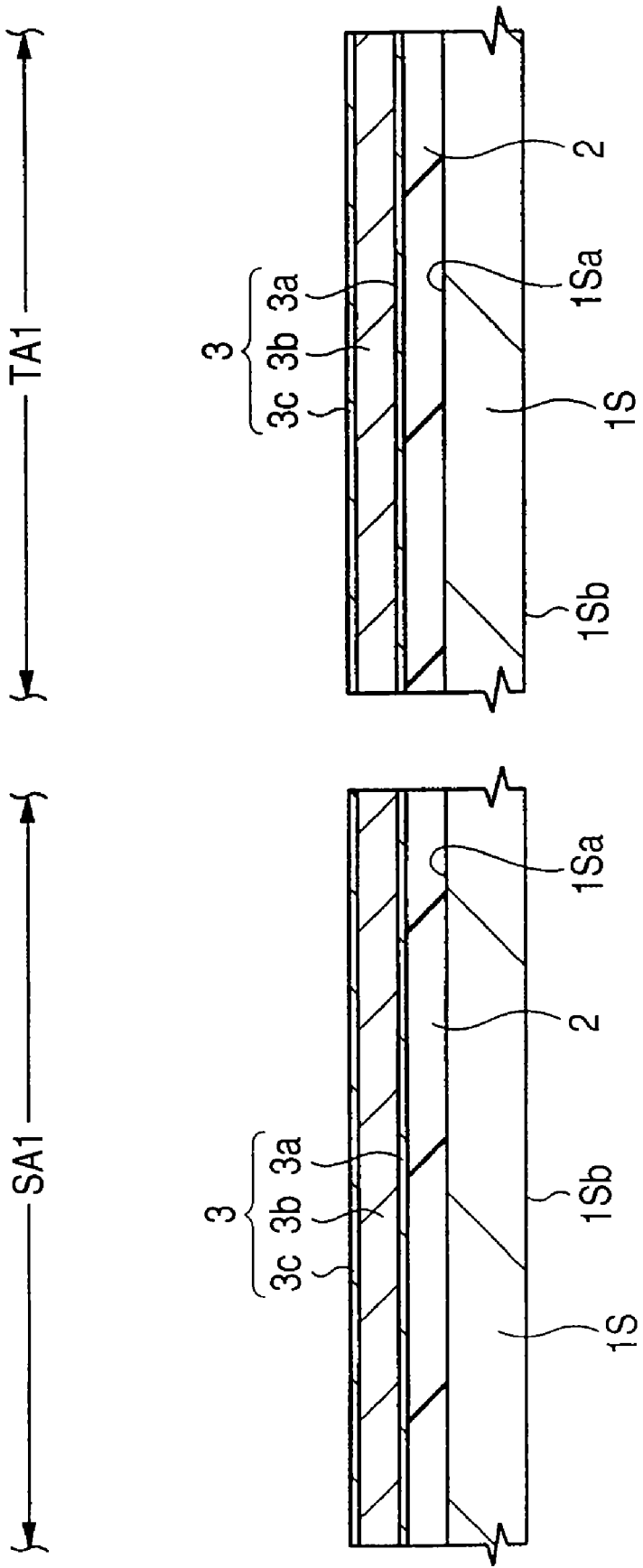
FIG. 6 is an essential cross sectional view of the manufacturing process for the semiconductor device of this embodiment.

In the process for manufacturing the semiconductor chip 1, first of all, a semiconductor substrate (at this stage, a flat circular-shaped thin semiconductor substrate called a semiconductor wafer) 1S is prepared as shown in FIG. 6. This semiconductor substrate 1S is a made for example from single crystal silicon, and includes a first main surface (upper surface, front surface) 1Sa and a second main surface (lower surface, rear surface) 1Sb positioned on mutually opposite sides along the direction of thickness.

An insulating film 2 made for example from silicon oxide ($SiO_2$, etc.) film, is formed (deposited) along the entire surface of the first main surface 1Sa of semiconductor substrate 1S. The thickness of the insulating film 2 may for example be approximately 400 nm thick.

A titanium nitride (TiN) film 3a is next formed on the insulating film 2, an aluminum (Al) film 3b is formed on the titanium nitride film 3a, and a titanium nitride (TiN) film 3c is formed on the aluminum film 3b. This process forms a laminated film (conducting layer, second conducting layer) 3 from the titanium nitride film 3a, the aluminum film 3b and the titanium nitride (TiN) film 3c. The aluminum film 3b is made from a conducting film using aluminum as the main element such as a single film of aluminum or an aluminum alloy. The titanium nitride film 3a, the aluminum film 3b and the titanium nitride (TiN) film 3c that form the laminated film 3 can be formed for example by the sputtering method. The aluminum film 3b is the main conductor film for the lower electrode wiring M0 and so the aluminum film 3b is thicker than the titanium nitride film 3a and the titanium nitride (TiN) film 3c. The film thickness of titanium nitride (TiN) film 3a for example may be about 50 nm, the thickness of aluminum film 3b may be about 500 nm, and the thickness of the titanium nitride (TiN) film 3c may be about 50 nm.

After forming the titanium (Ti) film on the insulating film 2, a titanium nitride film 3a can then be formed on that titanium film. Also, after forming titanium (Ti) film on the aluminum film 3b, a titanium nitride (TiN) film 3c can then be formed on that titanium film. Moreover, a film such as tungsten (w) film can be utilized instead of the titanium nitride films 3a, 3c.

Figure 7:
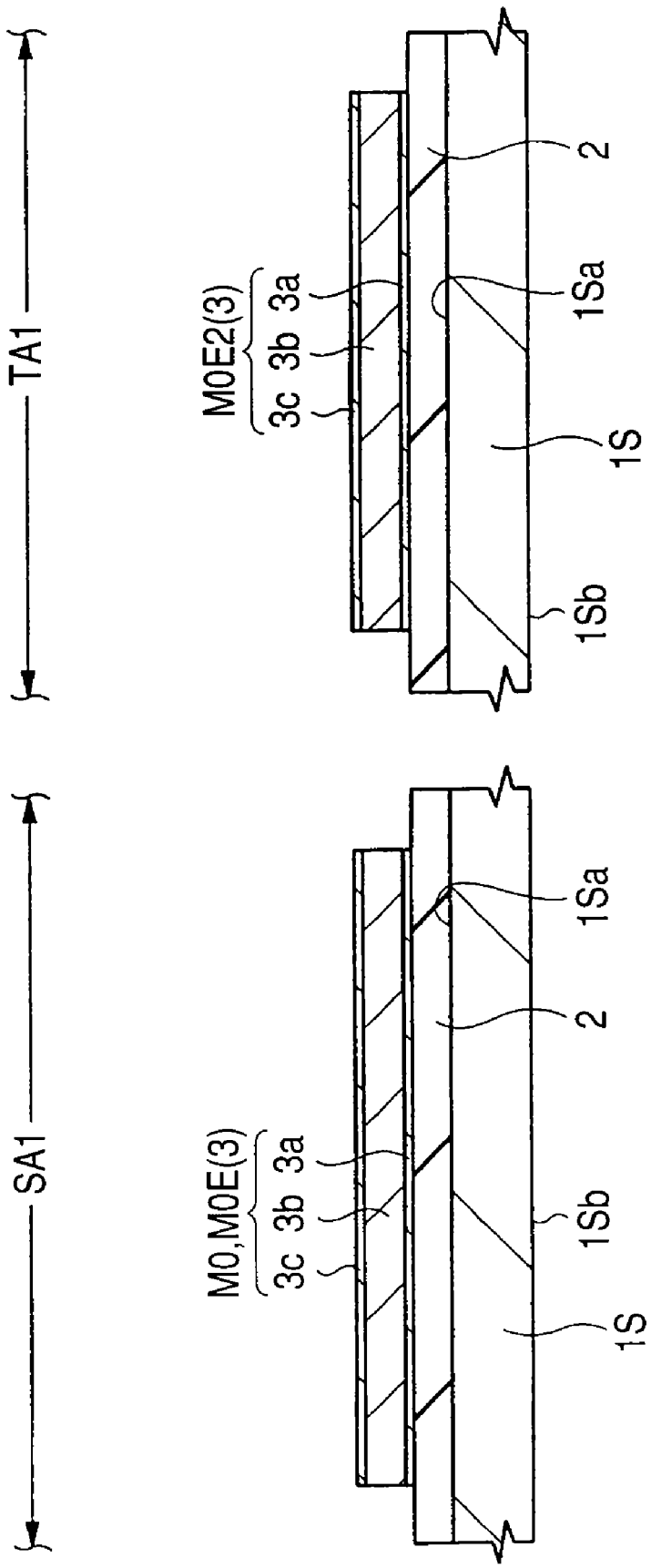
FIG. 7 is an essential cross sectional view during the manufacturing process for the semiconductor device continuing from FIG. 6.

Next, techniques such as lithography or dry etching may be used to pattern (process and selectively strip away) the laminated film 3 as shown in FIG. 7. Patterning the laminate film (conductive layer, second conductive layer) 3 forms the lower electrode wiring M0 (lower electrode M0E) and the dummy lower electrode M0E2.

The lower electrode wiring M0 and the dummy lower electrode M0E2 are in this way formed on the semiconductor substrate 1S (on the insulating film 2). This lower electrode wiring M0 and dummy lower electrode M0E2 are made from a conductive layer (here, laminated film 3) formed and patterned from the same layer on the semiconductor substrate 1S (on insulating film 2). The lower electrode wiring M0 and the dummy lower electrode M0E2 are made from a laminated film of metallic nitride film (titanium nitride films 3a, 3c) and metallic film (aluminum film 3b) patterned as described above and so are regarded as metallic film patterns.

In the lithography (or photolithography) method, a desired pattern is formed on a resist film by utilizing a patterning method in a process that coats a resist film (photoresist film), exposes the resist film to light and develops a desired pattern (resist pattern).

The titanium nitride film 3a which the bottommost layer in the laminated film 3 can function to improve the adhesion (sealing) between the insulating film 2 and the lower electrode wiring M0 (laminated film 3). The aluminum film 3b in the laminated film 3 is the main conductive film for the lower electrode wiring M0. The resistance of the lower electrode wiring M0 can be lowered by forming the aluminum film 3b in a conductive film where the main ingredient (element) is aluminum such as aluminum alloy or aluminum. The titanium nitride film 3c which is the topmost layer in the laminated film 3 can function as a reflection-preventive film in the light exposure process during the lithography (or photolithography) when patterning the laminated film 3. This titanium nitride film 3c which is the topmost layer in the laminated film 3 can also alleviate irregularities (concavities/protrusions) on the upper surface of the aluminum film 3b and function to enhance the planarity of the upper surface of lower electrode wiring M0

Figure 8:
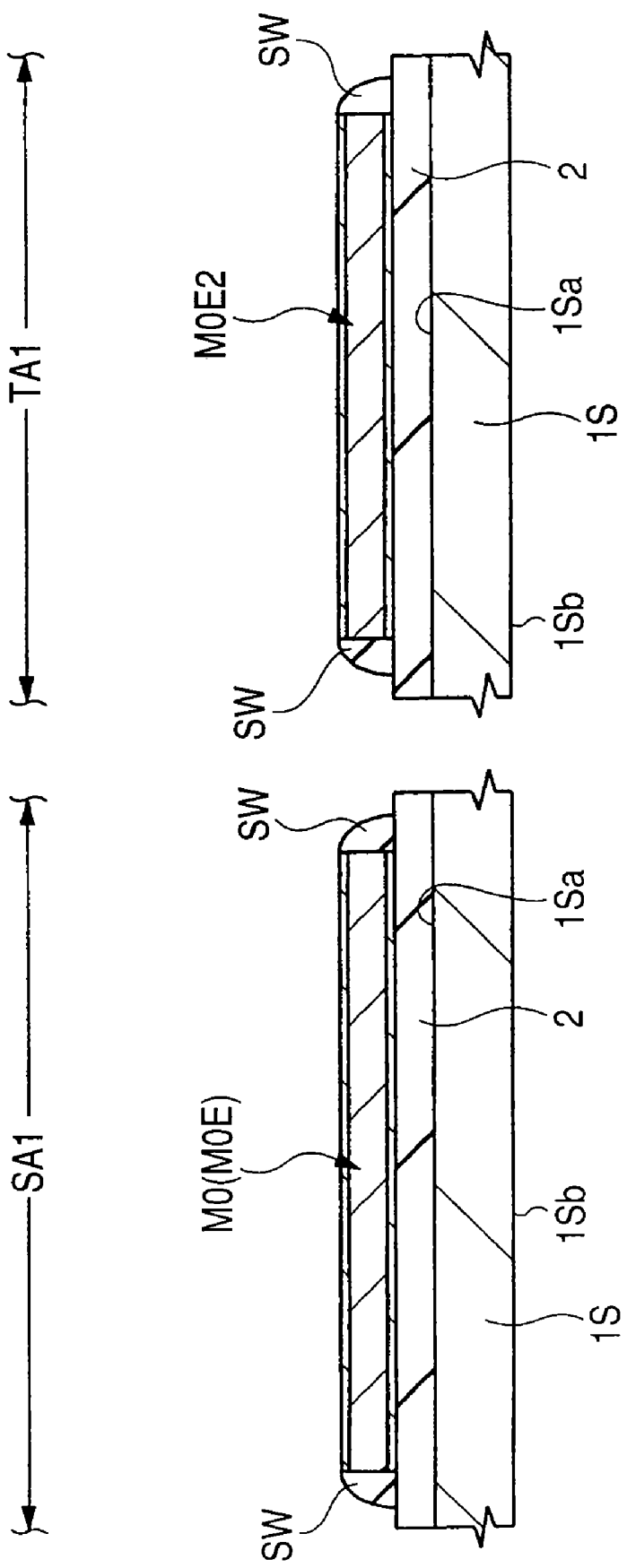
FIG. 8 is an essential cross sectional view during the manufacturing process for the semiconductor device continuing from FIG. 7.

By depositing an insulating film such as a silicon oxide film to cover the lower electrode wiring M0 and dummy lower electrode M0E2 across the entire surface (in other words, on insulating film 2) of the first main surface 1Sa on semiconductor wafer 1S (semiconductor wafer), and then etching back (etching the entire surface of) this insulating film by anisotropic dry etching, as shown in FIG. 8, an insulating film can be left remaining on the side surfaces (side wall) of the lower electrode wiring M0 (lower electrode M0E) and dummy lower electrode M0E2, and along with forming these sidewalls (sidewall insulating film) SW, the upper surfaces of lower electrode wiring M0 and dummy lower electrode M0E2 are exposed.

Figure 9:
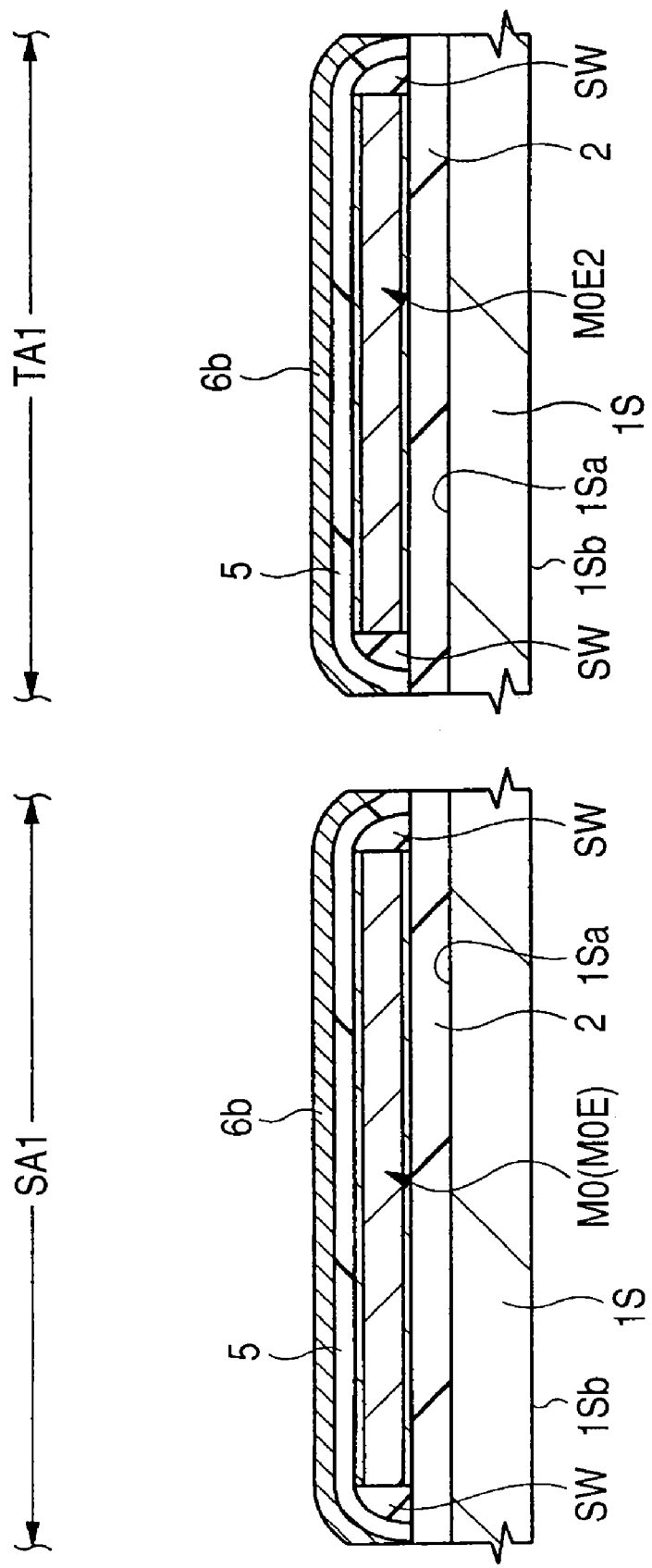
FIG. 9 is an essential cross sectional view during the manufacturing process for the semiconductor device continuing from FIG. 8.

Next, an insulating film 5 is formed (deposited) across the entire surface (namely, on insulating film 2) of the first main surface 1Sa on semiconductor substrate 1S so as to cover the surfaces of the lower electrode wiring M0 (lower electrode M0E), dummy lower electrode M0E2 and the sidewall SW as shown in FIG. 9. The insulating film 5 is made for example from silicon oxide film and can be formed by the CVD (chemical vapor deposition) method. The insulating film 5 thickness for example is approximately 200 nm.

A sacrificial film 6b made for example from polycrystalline silicon is next formed (deposited) across the entire surface of the insulating film 5 on the first main surface 1Sa of semiconductor substrate 1S as shown in FIG. 9. The sacrificial film 6b can be formed for example by the CVD method, and the thickness (deposit thickness) for example may be approximately 100 nm.

The sacrificial patterns (sacrificial pattern for forming cavities) 6, 6a are next formed from a patterned sacrificial film 6b by patterning this sacrificial pattern 6b by the lithography and dry etching methods as shown in FIG. 10. Among these, the sacrificial pattern (first sacrificial pattern) 6 is a pattern formed on the sensor region SA for forming the cavity VR1; and the sacrificial pattern (second sacrificial pattern) 6a is a pattern formed on a region (first region) other than the sensor region SA for forming the dummy cavity VR2 and here is formed on the TEG region TA1. The flat shape of the sacrificial pattern 6 is therefore formed in the same flat shape as the cavity VR1, and the flat shape of the sacrificial pattern 6a is therefore formed in the same flat shape as the dummy cavity VR2. The sacrificial pattern 6 is therefore formed on a region for the cavity VR1 on this region SA1 (of the sensor region SA) and, the sacrificial pattern 6a is therefore formed on a region for the dummy cavity VR2 on the TEG region TA1.

Figure 11:
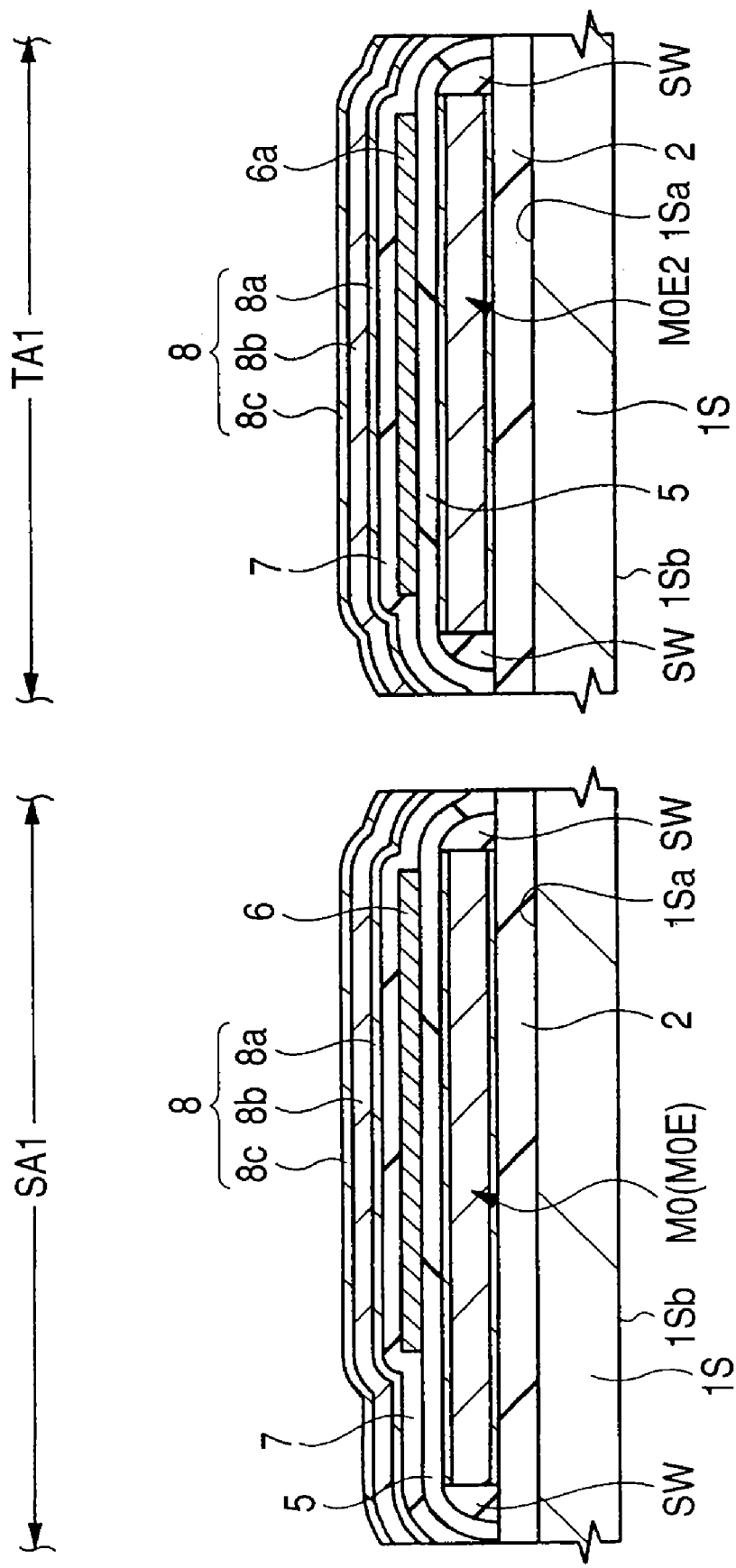
FIG. 11 is an essential cross sectional view during the manufacturing process for the semiconductor device continuing from FIG. 10.

An insulating film 7 is next formed (deposited) so as to cover the surfaces of the sacrificial patterns 6, 6a across the entire first main surface 1Sa on semiconductor substrate is as shown in FIG. 11. The insulating film 7 is made for example from silicon oxide film and may be formed using the CVD method, etc. The thickness of the insulating film 7 is for example approximately 200 nm.

A titanium nitride (TiN) film 8a is next formed on the insulating film 7, an aluminum (Al) film 8b is formed on the nitride titanium film 8a and, a titanium nitride (TiN) film 8c is formed on the aluminum film 8b. This process forms the laminated film (conducting layer, first conducting layer) 8 from the nitride titanium film 8a, the aluminum film 8b and the titanium nitride film 8c on the insulating film 7. The aluminum film 8b is made from conducting film with aluminum as the main element such as an aluminum compound or only aluminum film. The nitride titanium film 8a, the titanium nitride film 8c, and the aluminum film 8b can form the laminated film 8 by for example the sputtering method, etc. The aluminum film 8b is mainly a conductor film for the upper electrode wiring M1 and so its film is thicker than the nitride titanium films 8a, 8c. The laminated film 8 for forming the upper electrode wiring is thinner than the total thickness of the laminated film 3 for forming the lower electrode wiring and is for example approximately 400 nm. The nitride titanium film 8a, the aluminum film 8b and the titanium nitride film 8c may have respective film thicknesses of approximately 50 nm, 300 nm and 50 nm.

After forming the titanium (Ti) film on the insulating film 7, the titanium nitride film 8a can be formed on that titanium film. Also, after forming the titanium (Ti) film on the aluminum film 8b, a titanium nitride film 8c can be formed on that titanium film. A tungsten film (W) can be utilized instead of the titanium nitride films 8a, 8c.

Figure 12:
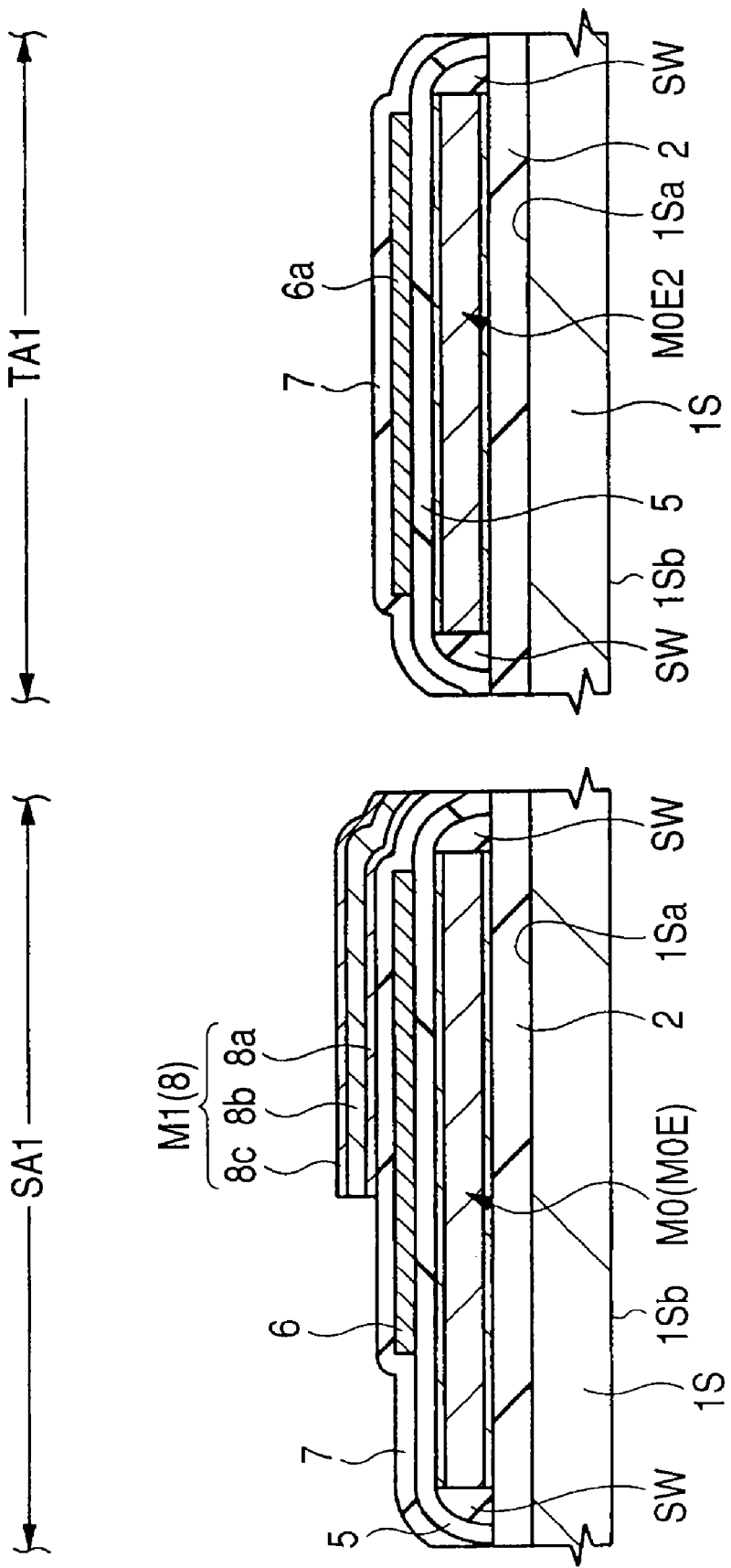
FIG. 12 is an essential cross sectional view during the manufacturing process for the semiconductor device continuing from FIG. 11.

Next, techniques such as lithography or dry etching are used to pattern (process and selectively strip away) the laminated film 8 as shown in FIG. 12. Patterning the laminated film (conductive layer, first conductive layer) 8 forms the upper electrode wiring M1 (upper electrode M1E and connector section M1C). The upper electrode wiring M1 is in this way formed on the insulating film 7. This upper electrode wiring M1 is made from a conductive layer (here, laminated film 8) formed and patterned on the insulating film 7. The upper electrode wiring M1 is made from a laminated film of metallic nitride film (titanium nitride films 8a, 8c) and metallic film (aluminum film 8b) patterned as described above and so is regarded as a metallic film pattern. In this embodiment, no laminated film 8 remains on the sacrificial pattern 6a on the TEG region TA1.

The respective functions of the nitride titanium film 8a, the aluminum film 8b, and the titanium nitride film 8c of the laminated film 8 are largely the same as those of nitride titanium film 3a, aluminum film 3b, and titanium nitride film 3c so a description is omitted here.

Figure 13:
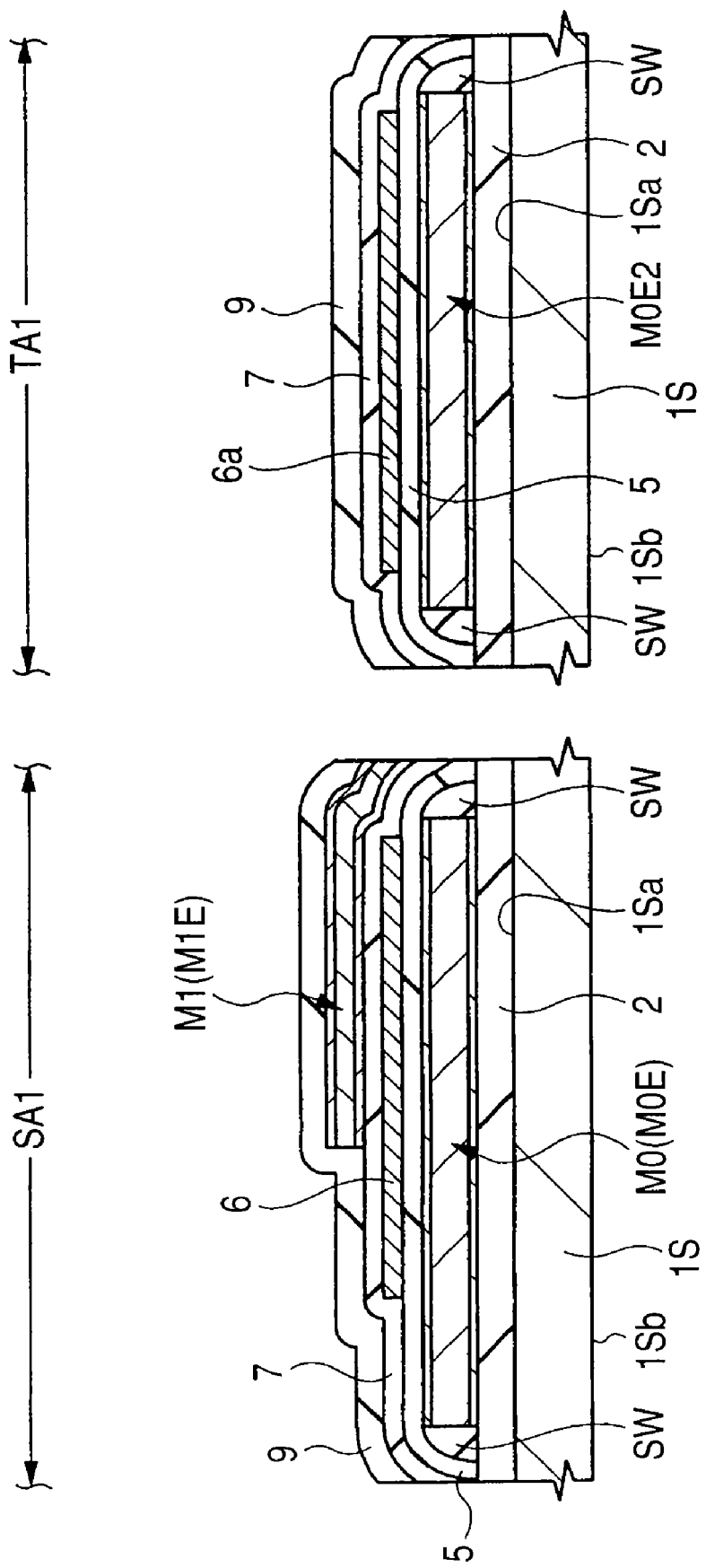
FIG. 13 is an essential cross sectional view during the manufacturing process for the semiconductor device continuing from FIG. 12.

An insulating film 9 is next formed (deposited) across the entire surface (namely, on insulating film 7) of the first main surface on semiconductor substrate 1S so as to cover the upper electrode wiring M1 (upper electrode M1E, patterned laminated film 8), as shown in FIG. 13. The insulating film 9 is made for example from silicon nitride film ($Si_3N_4$, etc.) and can be formed by the CVD (chemical vapor deposition) method. The insulating film 9 thickness for example may be approximately 500 nm.

Figure 14:
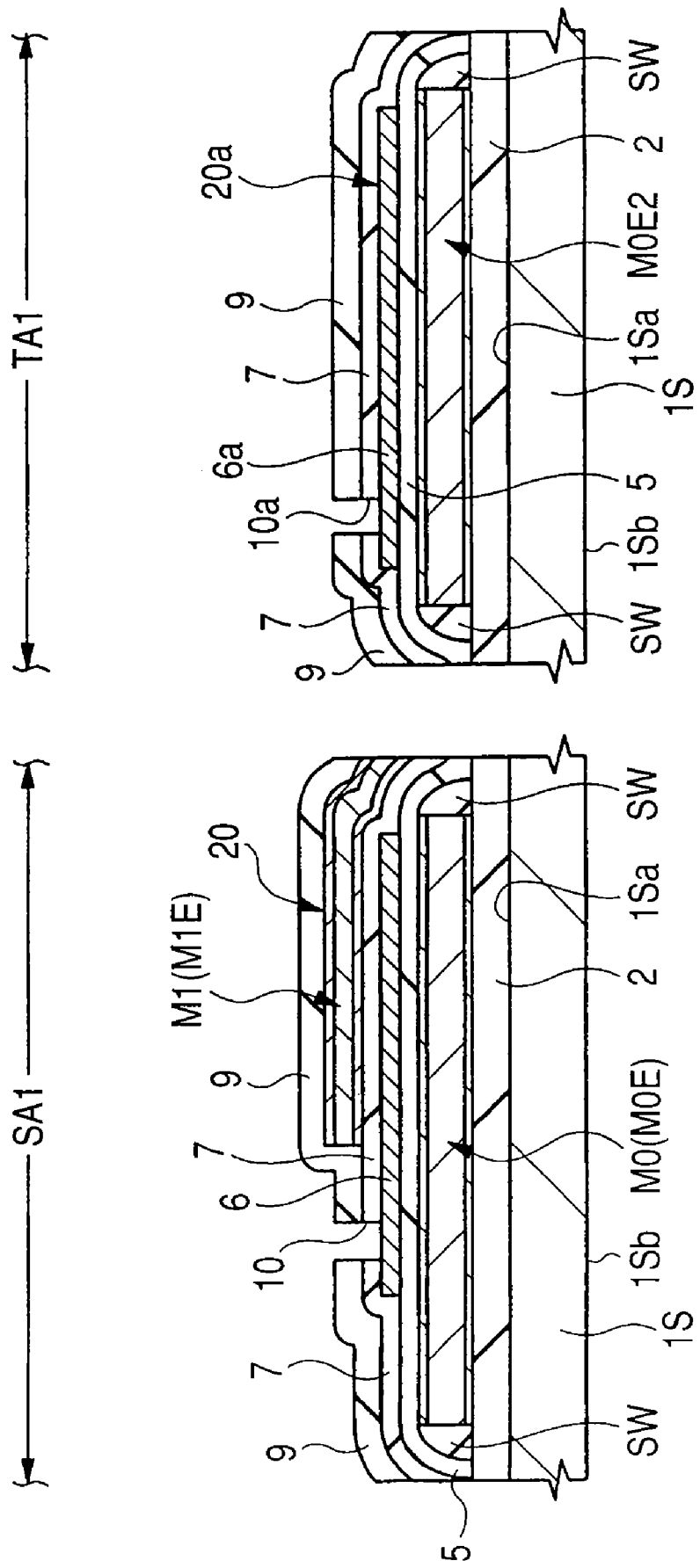
FIG. 14 is an essential cross sectional view during the manufacturing process for the semiconductor device continuing from FIG. 13.

The holes (opening) 10, 10a reaching to the sacrificial patterns 6, 6a to expose a portion of the sacrificial patterns 6, 6a is formed in the insulating films 9, 7 using the lithography method and dry etching method as shown in FIG. 14. The hole 10 (first opening) is formed at a position flatly overlapping on the sacrificial pattern 6, and a portion of the sacrificial pattern 6 is exposed at the bottom of hole 10. The hole 10a (second opening) is formed at a position flatly overlapping on the sacrificial pattern 6a and exposing a portion of the sacrificial pattern 6a the bottom of hole 10a.

Figure 15:
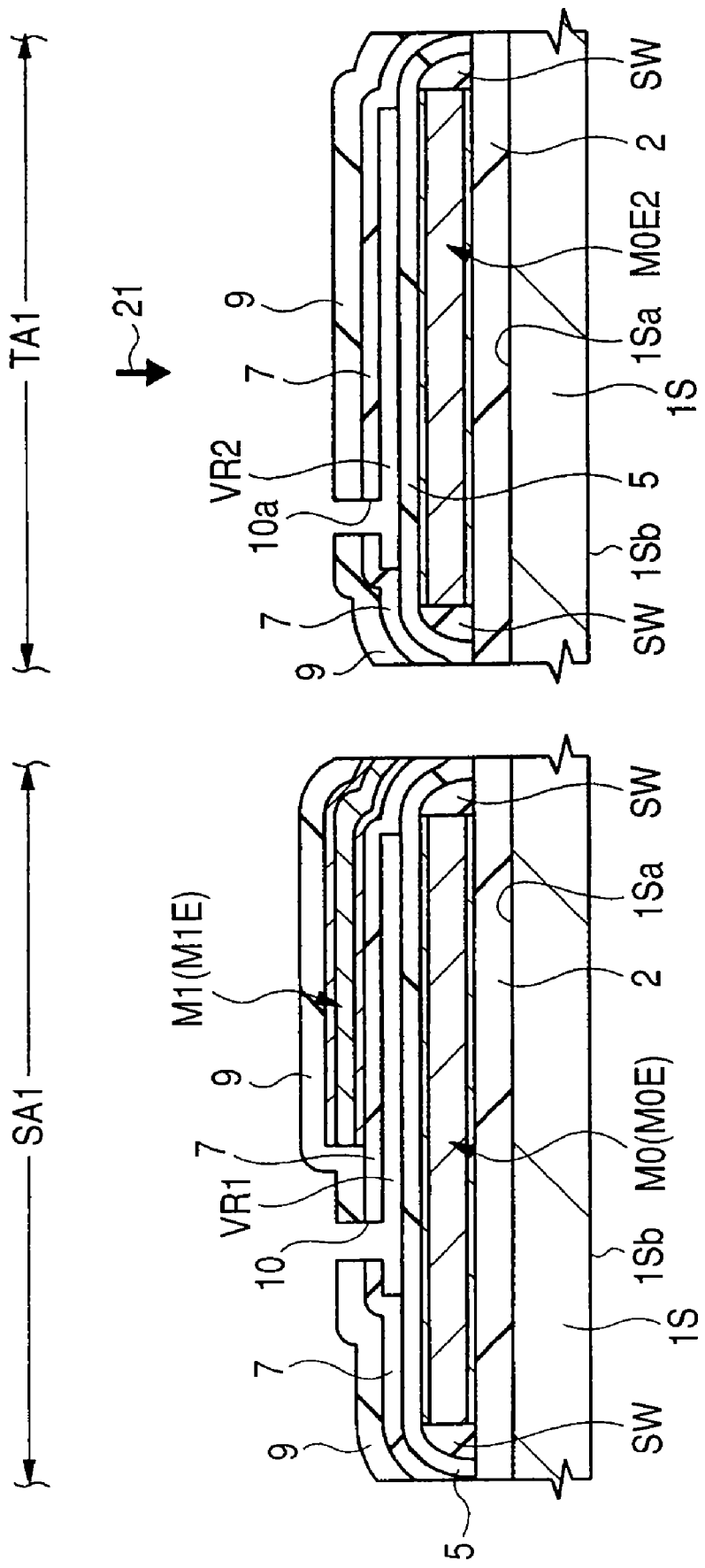
FIG. 15 is an essential cross sectional view during the manufacturing process for the semiconductor device continuing from FIG. 14.

A chemical solution such as potassium hydroxide then selectively wet etches the sacrificial patterns 6, 6a by way of the holes 10, 10a. This wet etching strips away the sacrificial patterns 6, 6a as shown in FIG. 15, to form the cavity (first cavity) VR1 and the dummy cavity (second cavity) VR2 between the insulating film 5 and insulating film 7. The region where the sacrificial pattern 6 remained becomes the cavity VR1, and the region where the sacrificial pattern 6a remained becomes the dummy cavity VR2.

In other words, a cavity VR1 is formed in the region (region where the sacrificial pattern 6 was removed) between the opposing lower electrode wiring M0 (lower electrode M0E) and upper electrode wiring M1 (upper electrode M1E) on this region SA1 (of the sensor region SA); and a dummy cavity VR2 is formed above the dummy lower electrode M0E2 on the TEG region TA1. Selectively etching the sacrificial patterns 6, 6a by way of the holes 10, 10a in this way forms the cavity VR1 and the dummy cavity VR1.

On the lower electrode wiring M0, the lower electrode M0E faces the upper electrode wiring M1 by way of the cavity VR1. On the upper electrode wiring M1, the upper electrode M1E faces the lower electrode wiring M0 by way of the cavity In this embodiment, after selectively etching (wet etching) the sacrificial pattern 6, 6a by way of the holes 10, 10a, the etched state of the sacrificial pattern 6a of the TEG region TA1 is observed and this is described in detail later on.

Figure 16:
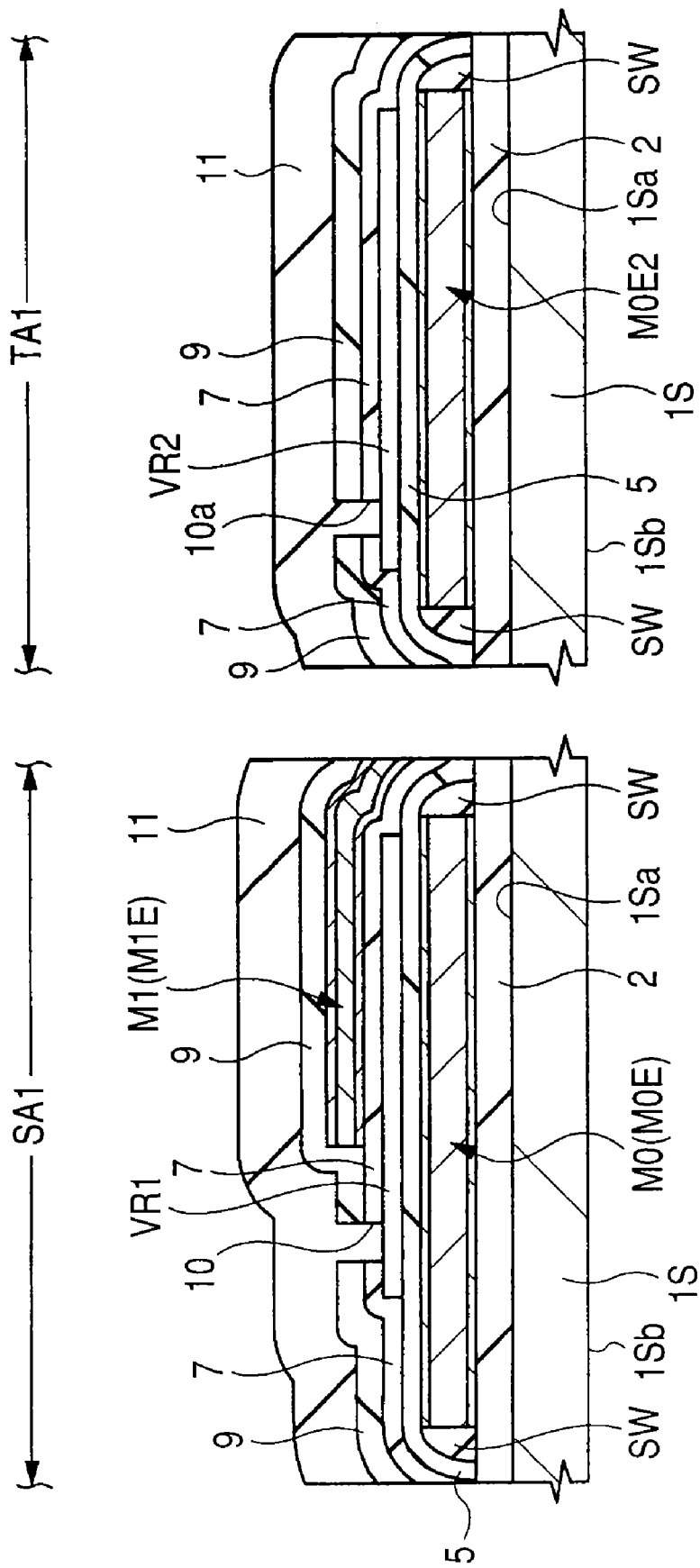
FIG. 16 is an essential cross sectional view during the manufacturing process for the semiconductor device continuing from FIG. 15.

Next, an insulating film 11 is formed (deposited) on the entire surface on the first main surface 1Sa (in other words, on insulating film 9) of the semiconductor substrate 1S as shown in FIG. 16. In this way, a portion of the insulating film 11 is embedded inside the holes 10, 10a, and can block the holes 10, 10a. The insulating film 11 is for example made of silicon nitride film and can be formed by the plasma CVD method. The thickness of the insulating film 11 is for example approximately 800 nm.

Figure 17:
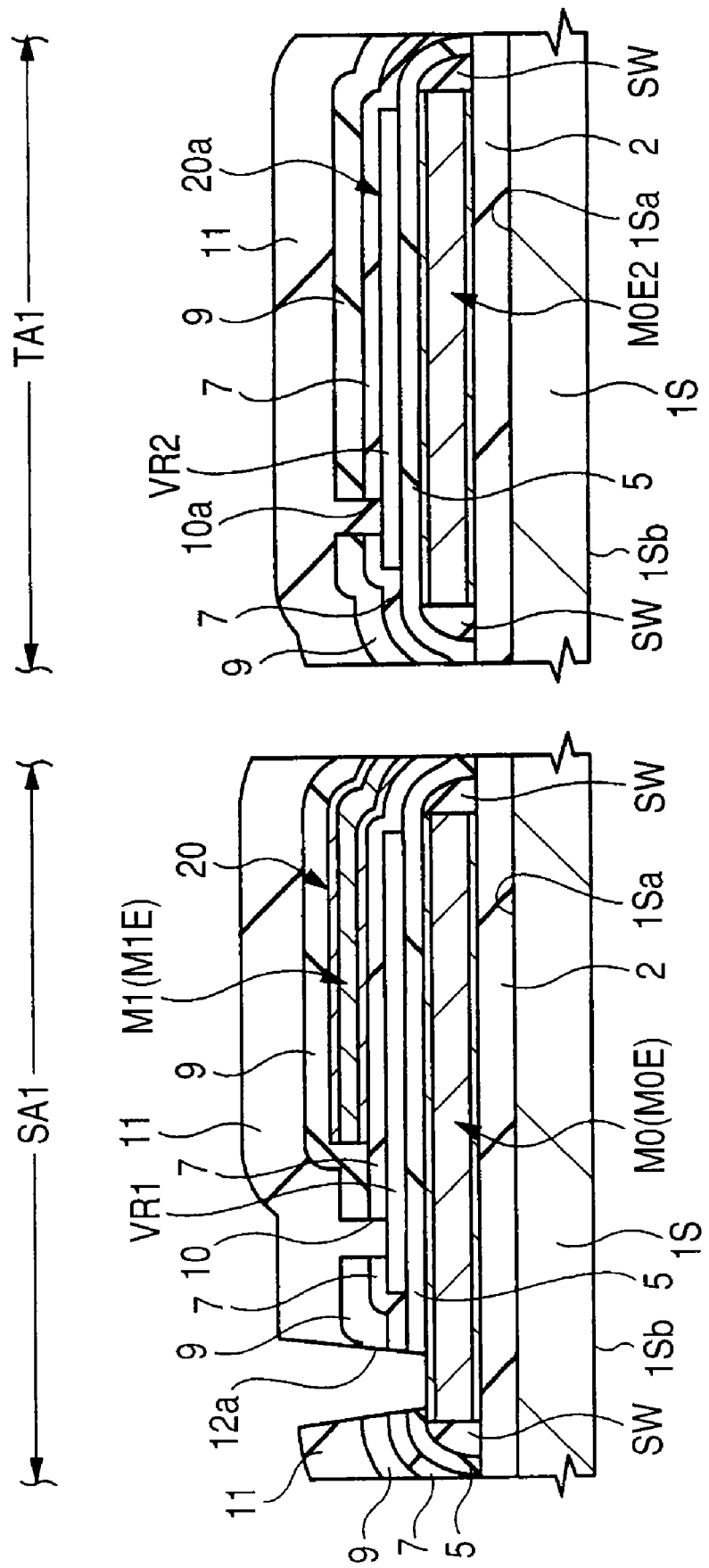
FIG. 17 is an essential cross sectional view during the manufacturing process for the semiconductor device continuing from FIG. 16.

As shown next in FIG. 17, an opening 12a for exposing a portion of the lower electrode wiring M0 is formed on the insulating films 11, 9, 7, 5 and an opening 12b (not shown in FIG. 17) is formed by the lithographic or photolithographic methods to expose a portion of the upper electrode wiring M1. A static variable capacitive oscillator 20 is formed in this way. The dummy lower electrode M0E and the dummy cavity VR1 above it form the dummy oscillator 20a, however this dummy oscillator 20a is not electrically used so there is no need to form an opening on the insulating films 11, 9, 7, 5 for exposing the dummy lower electrode M0E.

Next, an insulating film 13 made for example from light-sensitive negative-type polyamide film, is deposited across the entire first main surface 1Sa (namely, on insulating film 11) on the semiconductor substrate 1S as shown in FIG. 4 and FIG. 5. The openings 14a, 14b are formed such as by light-exposure and developing processes, to expose a portion of the upper electrode wiring M1 and the lower electrode wiring M0 on the insulating film 13. The portion of the upper electrode wiring M1 and the lower electrode wiring M0 exposed from the openings 14a, 14b forms the pads BP1, BP2.

The semiconductor chips 1 can then be manufactured by cutting out separate chip regions from the semiconductor substrate 1S (semiconductor wafer) by the dicing process.

Among the manufacturing processes, the process for wet etching the sacrificial patterns 6, 6a via the holes 10, 10a is now described in more detail.

Figure 18:
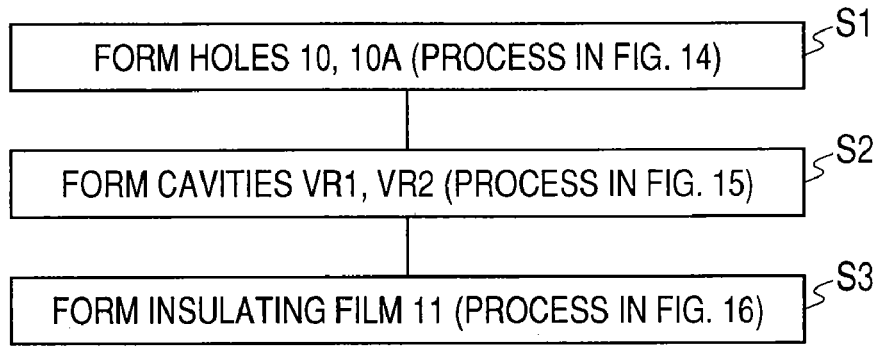
FIG. 18 is a manufacturing flow diagram of a portion of the manufacturing process for the semiconductor device of the first embodiment of this invention.
Figure 19:
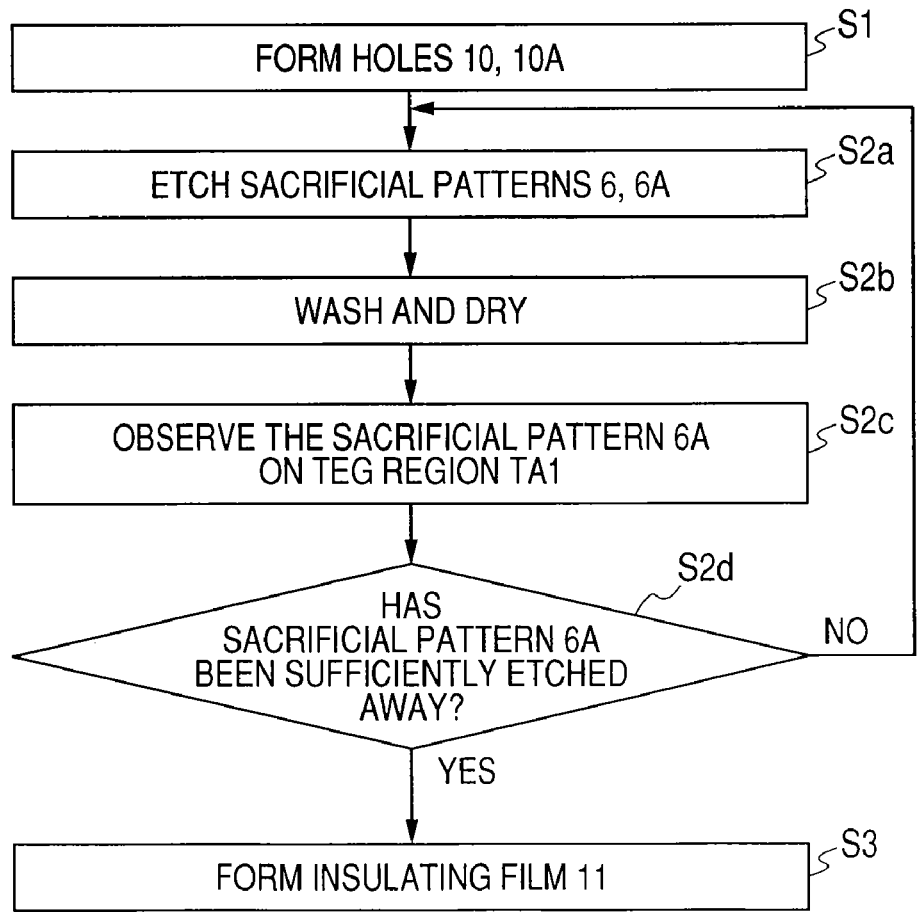
FIG. 19 is a manufacturing flow diagram showing in greater detail a portion of the manufacturing process for the semiconductor device of the first embodiment of this invention.
Figure 20A:
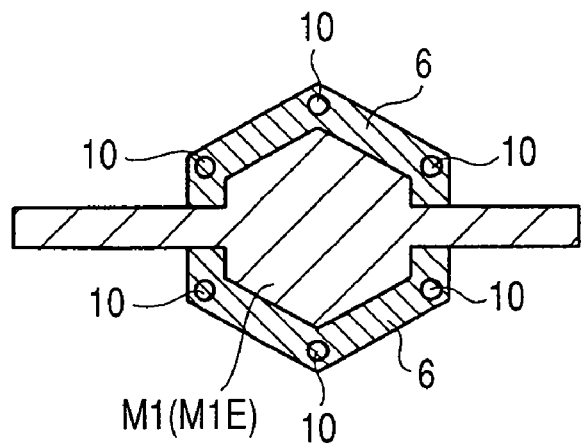
FIG. 20A is a flat view showing an essential portion during the manufacturing process for the semiconductor device of the first embodiment of this invention.
Figure 20B:
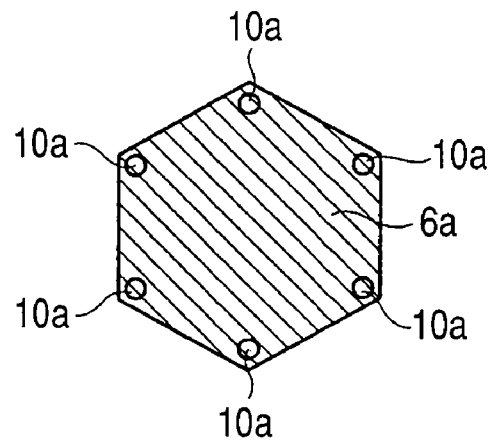
FIG. 20B is a flat view showing an essential portion during the manufacturing process for the semiconductor device of the first embodiment of this invention.
Figure 21A:
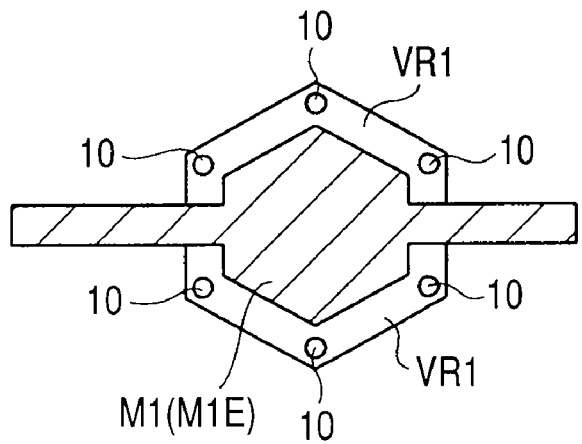
FIG. 21A is a flat view showing an essential portion during the manufacturing process for the semiconductor device of the first embodiment of this invention.
Figure 21B:
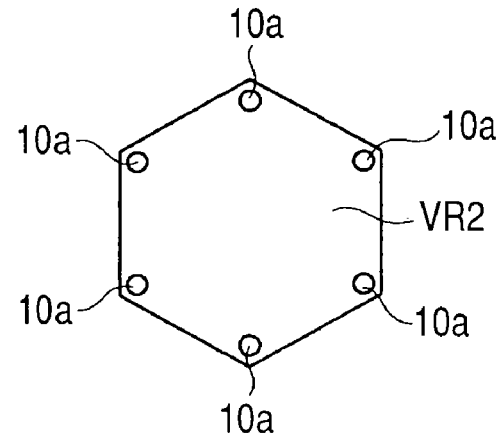
FIG. 21B is a flat view showing an essential portion during the manufacturing process for the semiconductor device of the first embodiment of this invention.

FIG. 18 is a drawing showing the manufacturing process flow in a portion of the processes (processes in FIG. 14 through FIG. 16) for manufacturing the semiconductor device of this embodiment. FIG. 19 is a manufacturing process flow drawing showing the process of FIG. 18 in further detail. FIG. 20 and FIG. 21 are flat views of essential section of the manufacturing process for the semiconductor device of this embodiment. FIG. 20 corresponds to the same process steps as FIG. 14; and FIG. 21 corresponds to the same process steps as FIG. 15.

The views in FIG. 20 and FIG. 21 show a region equivalent to one oscillator 20 formed on the sensor region SA, in the "(a) sensor region SA" at the left in the figure; and show a region equivalent to one dummy oscillator formed on the TEG region TA1 in the "(b) TEG region TA1" on the right side of the figure. FIG. 20 and the FIG. 21 shows a flat patterns of the elements sacrificial pattern 6, 6a, holes 10, 10a, upper electrode wiring M1 (upper electrode M1E), cavity VR1 and the dummy cavity VR2. Other structural elements are omitted from these figures. The insulating films 5, 7, 9 are therefore transparent (not shown) in FIG. 20 and FIG. 21. FIG. 20 and FIG. 21 are flat (plan) views but in order to make the drawings easier to view, cross-hatching is applied to the sacrificial patterns 6, 6a, the holes 10, 10a, and the upper electrode wiring M1 (upper electrode M1E).

The processes described while referring to FIG. 6 through FIG. 14, in other words, processes performed (up to step S1) for forming the holes 10, 10a reaching the sacrificial patterns 6, 6a in the insulating films 9, 7, yield the structures in FIG. 14 and the corresponding structure in FIG. 20.

A chemical solution such as potassium hydroxide then selectively wet etches the sacrificial patterns 6, 6a by way of the holes 10, 10a, to form the cavity VR1 and the dummy cavity VR2 (step S2). The structures in FIG. 15 and structures corresponding to it in FIG. 21 are obtained in this way.

The process for wet etching the sacrificial patterns 6, 6a in this step S2 to form the cavity VR1 and the dummy cavity VR2 is made up of the following steps S2a through S2d.

In other words, the etching time is set beforehand, and etching with the wet etching device performed only for the specified time to wet etch the semiconductor substrate (semiconductor wafer) 1S for example with potassium hydroxide, in order to selectively wet etch the sacrificial patterns 6, 6a by way of the holes 10, 10a (step S2a).

After completing the etching in step S2a, the semiconductor substrate (semiconductor wafer) 1S is washed (such as by water washing) and dried, and the semiconductor substrate (semiconductor wafer) 1S then extracted from the wet etching device (step S2b).

An instrument such as an optical microscope (optical type metal microscope) is utilized for observing (verifying) the etched state (etching amount, presence/absence of etching) on the sacrificial pattern 6a on the TEG region TA1 (step S2c). The amount of etching of sacrificial pattern 6a observed in step S2c is then judged (observed, decided) to be sufficient or insufficient (step S2d).

When decided in step S2d that the amount of etching of sacrificial pattern 6a is sufficient (in this case, there is assumed to be no non-etched remainder from etching of sacrificial pattern 6 in the sensor region SA) and the flow proceeds to the next process (process for forming insulating film 11) on semiconductor substrate (semiconductor wafer) 1S. When decided in step S2d that the amount of etching of sacrificial pattern 6a is insufficient (in this case, there is assumed to be a non-etched remainder from etching of sacrificial pattern 6 in the sensor region SA), then the semiconductor substrate (semiconductor wafer) 1S is returned again to the wet etching device, and the process in steps S2a through S2d is repeated.

The upper electrode wiring M1 (upper electrode M1E) is present above the sacrificial pattern 6 on the region SA so even if one attempts to observe the etched state (presence/absence of non-etched remainder) of the sacrificial pattern 6 from the front surface side of semiconductor substrate 1S (upper side of the first main surface 1Sa) by using an optical type metal microscope, the upper electrode wiring M1 blocks off (interferes) the light so that observing whether or not a sacrificial pattern 6 is remaining below the upper electrode wiring M1 is impossible. Observation is impossible because the metallic film reflects nearly 100 percent of the visible light so that seeing through the upper electrode wiring M1 which is made from metallic film, in order to observe the state (etching state of the sacrificial pattern 6) below the upper electrode wiring M1 is impossible.

However, on the TEG region TA1, there is no metallic pattern (pattern equivalent to upper electrode wiring M1) above the sacrificial pattern 6a. Light can therefore penetrate up to the interior of sacrificial pattern 6 and the dummy cavity VR2 when observing the etched state of the sacrificial patterns 6a from the surface side of the semiconductor substrate 1S (upper side of first main surface 1Sa) by using an optical type metallic microscope. Consequently, the etched state (presence/absence of a non-etched remainder) of sacrificial pattern 6a can be observed. The etched state of the sacrificial pattern 6a can therefore be observed in step S2c from the front surface side semiconductor substrate (semiconductor wafer) 1S (upper side of first main surface 1Sa) by using an optical microscope (optical type metallic microscope) or in other words from direction 21 shown by the arrow in FIG. 15, so that the etched state of the sacrificial pattern 6a can be observed, and the etched amount of the sacrificial pattern 6a (presence of non-etched remainder) can be judged.

In the present embodiment, non-etched remainder portions of the sacrificial pattern 6 remaining after etching can be observed visually with an instrument such as an optical metallic microscope so that the etching amount of the sacrificial pattern 6 (presence/absence of non-etched remainder) can be easily and accurately judged.

In this embodiment, the sacrificial pattern 6a on the TEG region TA1 is essentially the same shape and the same dimensions as the sacrificial pattern 6a of the sensor region SA. Further, the position of hole 10a on the sacrificial pattern 6 is essentially the same as the position of hole 10 on the sacrificial pattern 6. Therefore, when etching the sacrificial patterns 6, 6a in step S2a, the etched state of the sacrificial pattern 6a on the TEG region TA1 and the etching state of the sacrificial pattern 6 on the sensor region SA are largely the same. The etched state of the sacrificial pattern 6 in the sensor region SA can therefore be estimated by observing the sacrificial pattern 6 on the TEG region TA1 in step S2c. In other words, if there is no non-etched remainder from the sacrificial pattern 6a on TEG region TA1 as shown in FIG. 21, then it can be assumed there is no non-etched remainder on sacrificial pattern 6 on sensor region SA. When there is a non-etched remainder on the sacrificial pattern 6a of TEG region TA1, then one can assume the same degree of non-etched remainder will also occur on the sacrificial pattern 6 on sensor region SA. The sacrificial pattern 6a on the TEG region TA1 is formed to essentially the same shape and same dimensions as the sacrificial pattern 6 on sensor region SA and therefore the dummy cavity VR2 on TEG region TA1 and the cavity VR1 on the sensor region SA are essentially the same shape and the same dimensions on the semiconductor chip 1 manufactured in this embodiment. Thee position of the hole 10a in the dummy cavity VR2 of the TEG region TA1 is essentially the same as the position of the hole 10 on the cavity VR1 on the sensor region SA.

FIG. 22 is a flat view showing the etched state of the sacrificial pattern 6a on the TEG region TA1 in step S2a. FIG. 22A shows the state prior to starting the wet etching of sacrificial patterns 6, 6a on TEG region TA1. FIG. 22B, FIG. 22C, FIG. 22D show the state after starting the wet etching of the sacrificial patterns 6, 6a in step S2a. Among these drawings, FIG. 22B is the state where the sacrificial patterns 6, 6a etching time t is t1 (here t1>0), FIG. 22C is the state where the sacrificial patterns 6, 6a etching time t is t2 (here t2>t1), and FIG. 22D is the state where the sacrificial patterns 6, 6a etching time t is t3 (here t3>t2). In other words, these drawings show the state before and after wet etching of the sacrificial patterns 6, 6a in step S2a. The state gradually changes from the FIG. 22A (etching time t=0 state), to the FIG. 22B (etching time t=t1>0 state), to the FIG. 22C (etching time t=t2>t1 state) to the FIG. 22D (etching time t=t2>t1 state).

Figure 22A:
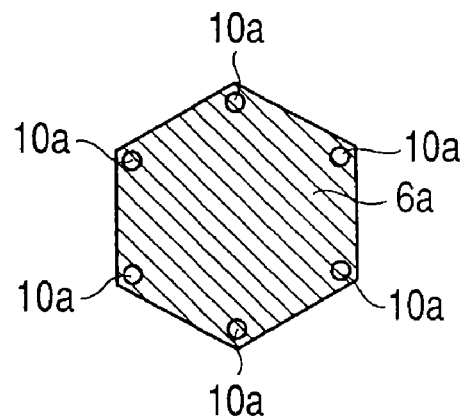
FIG. 22A is a flat view showing an etched state of the sacrificial pattern on the TEG region.
Figure 22B:
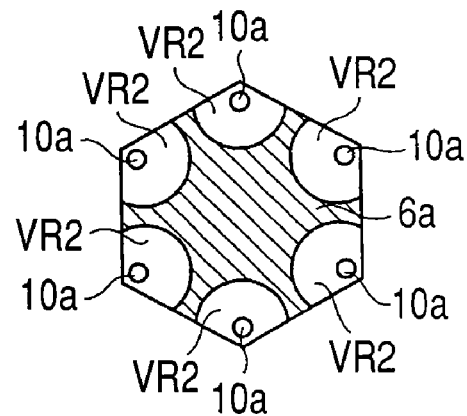
FIG. 22B is a flat view showing an etched state of the sacrificial pattern on the TEG region.
Figure 22C:
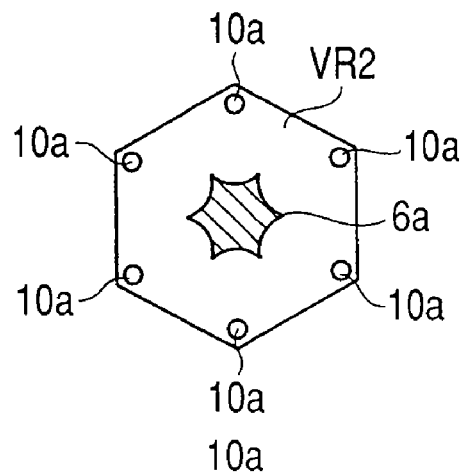
FIG. 22C is a flat view showing an etched state of the sacrificial pattern on the TEG region.
Figure 22D:
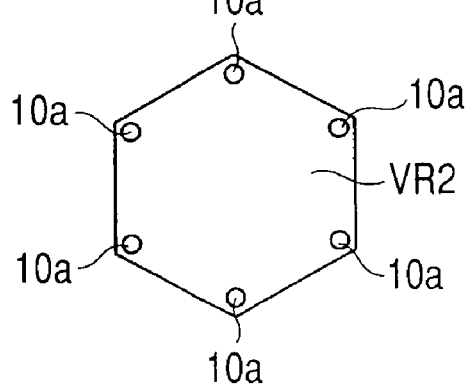
FIG. 22D is a flat view showing an etched state of the sacrificial pattern on the TEG region.

As shown in FIG. 22A, prior to starting wet etching of the sacrificial patterns 6, 6a in step S2a, the entire sacrificial patterns 6, 6a are present and the cavity VR1 and dummy cavity VR2 have not been formed yet. Then in step S2a, after wet etching of the sacrificial patterns 6, 6a begins, these sacrificial patterns 6, 6a are gradually stripped away by etching from the vicinity of the holes 10, 10a as shown in FIG. 22B and FIG. 22C, and the cavity VR1 and the dummy cavity VR2 gradually expand from the vicinity of these holes 10, 10a. Finally, the sacrificial patterns 6, 6a are completely stripped away as shown in FIG. 22D, which forms the cavity VR1 and the dummy cavity VR2 in a complete state between the insulating film 7 and the insulating film 5. FIG. 20 therefore corresponds to the state in FIG. 22A, and FIG. 21 corresponds to the state in FIG. 22D.

In step S2a, when the entire sacrificial pattern 6a has been removed by wet etching as shown by the state in FIG. 22D, and none of the etched sacrificial pattern 6a is remaining, then no non-etched remainder of the sacrificial pattern 6a is observed in step S2c, so the amount of etching of the sacrificial pattern 6a is judged sufficient in step S2d. In this case, it is impossible to observe if sacrificial pattern 6 still remains on the sensor region SA after etching. However, the sacrificial pattern 6 and the sacrificial pattern 6a are etched in the same way and since there is no non-etched remainder of sacrificial pattern 6a on the TEG region TA1, it can be assumed that there is no non-etched remainder of sacrificial pattern 6 on the sensor region SA after etching. The semiconductor substrate (semiconductor wafer) 1S is therefore transferred to the next process (process for forming the insulating film 11).

On the other hand, in step S2a, if wet etching has ended at the stage shown in FIG. 22B or FIG. 22C, then a portion of the sacrificial pattern 6a on the TEG region still remains after etching (i.e. a non-etched remainder). In this case, a portion of the non-etched remainder of the sacrificial pattern 6a can still be observed after etching in step S2c, and the amount of etching of the sacrificial pattern 6a is judged insufficient in step S2d. In this case, observing whether there is a sacrificial pattern 6a remaining on the sensor area SA after etching is impossible, but the sacrificial pattern 6 and the sacrificial pattern 6a are subjected to the same etching so that the sacrificial pattern 6a still remains on the TEG region TA1 after etching and therefore one can assume that the sacrificial pattern 6 also remains on the sensor region SA after etching. The semiconductor substrate (semiconductor wafer) 1S is therefore returned once again to the wet etching device and the process in steps S2a through S2d is repeated.

A state where there is no non-etched remainder of sacrificial pattern 6a still remaining after etching on the TEG region TA1, or in other words a state where there is no non-etched remainder of sacrificial pattern 6 still present on sensor region SA can therefore be assumed, and the semiconductor substrate (semiconductor wafer) 1S then sent to the next process (process for forming insulating film 11). A non-etched remainder of sacrificial pattern 6 on sensor region SA after etching is in this way prevented, and a cavity VR1 can be accurately formed on the sensor region SA. The productivity when manufacturing this semiconductor device can therefore be improved. Moreover, the performance and reliability of the semiconductor device is also improved.

On the semiconductor chip manufactured in this embodiment, the dummy cavity VR2 is formed between the insulating film 5 and the insulating film 7 on the TEG region TA1, the same as the cavity VR1 formed on the sensor region SA. Unlike the cavity VR1 on the sensor region SA however, the dummy cavity VR2 is not a cavity that functions as a sensor but is formed to allow observation of the etched state of sacrificial pattern 6a as described above and prevent the sacrificial pattern 6 from remaining on the sensor region SA after etching.

The semiconductor chip (semiconductor device) 1 of this embodiment is a semiconductor device containing multiple sensor cells (oscillators 20) formed in the sensor region SA on the main surface. Moreover, on the main surface that includes the sensor region SA, dummy cavities VR2 are formed on a first region (here, TEG region TA1) outside the sensor region SA, and a conducting layer and among the dummy cavities VR2 no conducting layer (here laminated film 8) is formed on the same layer as electrode wiring M1, on the section above the position farthest from the hole 10a. In the present embodiment in particular, there is no conducting layer (here, laminated film 8) formed on the same layer as upper electrode wiring M1 above the dummy cavity VR2. This state allows observing the etched state of the sacrificial pattern 6a for forming the dummy cavity VR2 when etching the sacrificial patterns 6, 6a to form the cavity VR1 and the dummy cavity VR2. The etched state of the sacrificial pattern 6 for the cavity VR1 can then be assumed from the etched state of the sacrificial pattern 6a for forming the dummy cavity VR2, and therefore the sacrificial pattern 6 is prevented from remaining on sensor region SA after etching and a cavity VR1 can be accurately formed. Therefore, the productivity when manufacturing this semiconductor device can be improved. Moreover, the performance and reliability of the semiconductor device is also improved.

In this embodiment, absolutely no metallic film (upper electrode wiring M1) is formed on (above) the sacrificial pattern 6a (dummy cavity VR1) of the TEG region TA1. The etched state of the sacrificial pattern 6a can therefore be observed in detail, and the ongoing etching states of sacrificial pattern 6a can be distinguished from each other in fine detail. The state in FIG. 22B for example can be distinguished from the state in FIG. 22C. Consequently, the minimum amount of etching needed for etching the sacrificial patterns 6, 6a can be easily set. Moreover, over-etching can be prevented during etching of the sacrificial patterns 6, 6a.

In this embodiment, the sacrificial patterns 6 and sacrificial pattern 6a are formed by patterning of the same sacrificial film 6b to form the sacrificial pattern 6 and the sacrificial pattern 6a using the same material and to the same thickness. By forming the sacrificial patterns 6 and sacrificial pattern 6a from film of the same thickness and the same material, the etching of the sacrificial patterns 6 and the sacrificial pattern 6a can progress under the same conditions in the wet etching process for these patterns 6, 6a performed via the holes 10, 10a, and the reliability for estimating the etching state of sacrificial pattern 6 from the etching status of the pattern 6a can be enhanced. These sacrificial patterns 6, 6a are in this way formed from essentially the same materials and to the same thickness so that if the curvature (irregularity deformation) of the membrane (film on cavities VR1, VR2) can be ignored, then the thickness (dimensions in a direction perpendicular to the first main surface 1Sa of semiconductor substrate 1S) of the cavity VR1 and dummy cavity VR2 that were formed is essentially the same.

Along with forming the sacrificial pattern 6 (cavity VR1) via the insulating film 5 on the upper part of the lower electrode M0E in the sensor region SA, a dummy lower electrode M0E2 the same as AND the lower electrode M0E is formed on the TEG region TA1, and the sacrificial pattern 6a (dummy cavity VR2) is formed by way of insulating film 5 on the dummy lower electrode M0E2. The laminated structure including the lower electrode M0E, the insulating film 5, the sacrificial pattern 6 and the insulating film 7 on the sensor region SA; and the laminated structure including the dummy lower electrode M0E2, the insulated film 5, the sacrificial pattern 6a, and the insulating film 7 can in this way be formed with the same structure. Moreover the etching conditions when etching the sacrificial patterns 6, 6a in steps S2a can be set to the same conditions for the sacrificial pattern 6 of sensor region SA and the sacrificial pattern 6a of TEG region TA1. The etching state of the sacrificial pattern 6a on TEG region TA1, and the etching state of the sacrificial pattern 6 on sensor region SA can in this way be made to approach a similar state during etching of sacrificial patterns 6, 6a in step S2a; and the etching state of the sacrificial pattern 6 on the sensor region SA can be estimated with greater accuracy, from the etching state of the sacrificial pattern 6a on the TEG region TA1. Moreover, if the dummy lower electrode M0E2 has become exposed from removal of the insulating film 5 due to over-etching during step S2a when etching the sacrificial pattern 6a, then that exposure can be observed in step S2c so that a judgment can be made on whether the lower electrode M0E is exposed due to over-etching.

The insulating films 7, 9 are formed on the sacrificial pattern 6; and in step S2c the etching state of the sacrificial pattern 6a below these insulating films 7, 9 must be observed by viewing it through these insulating films 7, 9. These insulating films 7, 9 are preferably structures made from an insulating film that allows visible light to easily transmit through (possessing light transmittance). Silicon oxide film and silicon nitride film are largely permeable to visible light so these insulating films 7, 9 are more preferably structures made from silicon oxide film or silicon nitride film.

The etched state of the sacrificial pattern 6a becomes impossible to observe in step S2c if the sacrificial pattern 6a allows too much visible light to pass through it and therefore the sacrificial pattern 6a preferably has a lower visible light transmittance rate than the insulating films 7, 9.

Therefore, by forming the insulating films 7, 9 from material (such as silicon oxide or silicon nitride) that visible light can easily transmit through, and by forming the sacrificial patterns 6, 6a from a material (such as silicon) possessing a visible light transmittance rate smaller than the visible light transmittance rate of the insulating films 7, 9, the etching state of the sacrificial pattern 6a in step S2c can be accurately observed. Moreover, the sacrificial patterns 6, 6a can be formed from a metallic film other than silicon film (polycrystalline silicon film). If the sacrificial patterns 6, 6a are formed from a metallic film, then these sacrificial patterns 6, 6a will reflect largely 100 percent of the visible light so that the etching state of the sacrificial patterns 6, 6a can be easily observed with an optical microscope, etc.

In step S2a, the sacrificial patterns 6, 6a must be selectively etched while inhibiting (preventing) etching of the insulating films 5, 7, and 9. The wet etching of the sacrificial patterns 6, 6a in step S2a must therefore be performed under the condition of an etching speed of sacrificial patterns 6, 6a that is higher than the etching speed of the insulating films 5, 7, and 9. By forming the sacrificial patterns 6, 6a from silicon film (polycrystalline silicon film), the sacrificial patterns 6, 6a can be selectively etched while inhibiting (suppressing) etching of the insulating films, 5, 7, 9 instep S2a. Moreover, if forming the sacrificial patterns 6, 6a from material such as metallic material, the etching fluid utilized in the wet etching of the sacrificial patterns 6, 6a in step S2a, can be chosen according to that metallic material, to selectively etch the sacrificial patterns 6, 6a while inhibiting (preventing) etching of the insulating films, 5, 7, 9.

Applying the semiconductor device (semiconductor chip 1) of this embodiment to an ultrasonic echo diagnosis apparatus is described next.

Figure 23:
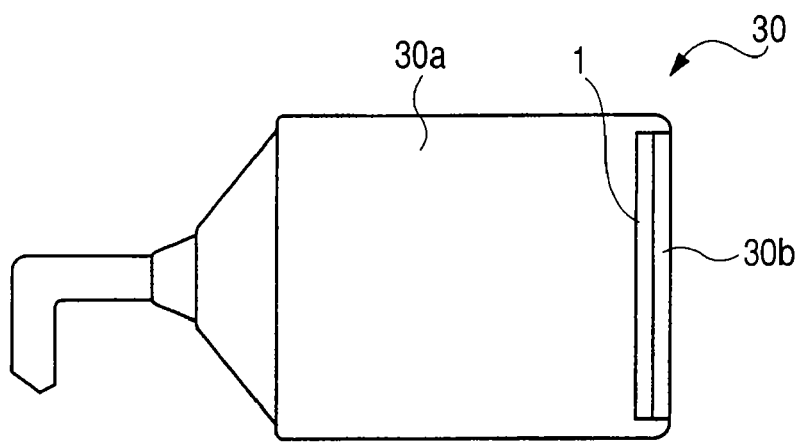
FIG. 23 a drawing for describing the probe for this ultrasonic echo diagnosis apparatus as applied to the semiconductor device of the first embodiment of this invention.

Ultrasonic echo diagnosis apparatus utilize the transmitting (permeating) characteristics of sound waves by utilizing ultrasonic waves that exceed the range of human hearing to allow medical diagnostic devices to provide medical visual real-time images of internal states within the body that cannot be seen externally. FIG. 23 shows the probe for this ultrasonic echo diagnosis apparatus A probe 30 is the sending/receiving unit for the ultrasonic waves. The first main surface (surface formed from multiple oscillators 20) of the semiconductor chip 1 is installed in a state facing outward at the tip of the probe case 30a forming the probe 30 as shown in FIG. 23. Moreover, an acoustic lens 30b is attached to the first main surface of this semiconductor chip 1.

During an ultrasonic diagnosis, the tip of the probe 30 (side of acoustic lens 30b) is held against the body surface (surface of the body), to scan the body while gradually shifting the probe position in tiny amounts. The probe 30 held against the body at this time emits ultrasonic wave pulses at some dozen megahertz, into the body and receives waves (reflected waves or echoes) reflected from tissue boundaries of differing acoustic impedances. A tomographic image of the body tissues is obtained in this way, and information on the test subject can be found. Information on the distance from the body is obtained by way of the time intervals between sending the ultrasonic waves to receiving the reflected ultrasonic waves. Information on the presence of a body reflecting these waves or the matter making up that body can be obtained from the outer shape reflected from the body or level of the reflected waves.

Utilizing the semiconductor chip 1 of this embodiment in the probe 30 of this type of ultrasonic echo diagnosis apparatus, improves the performance and reliability of the probe 30.

Second Embodiment

Figure 24:
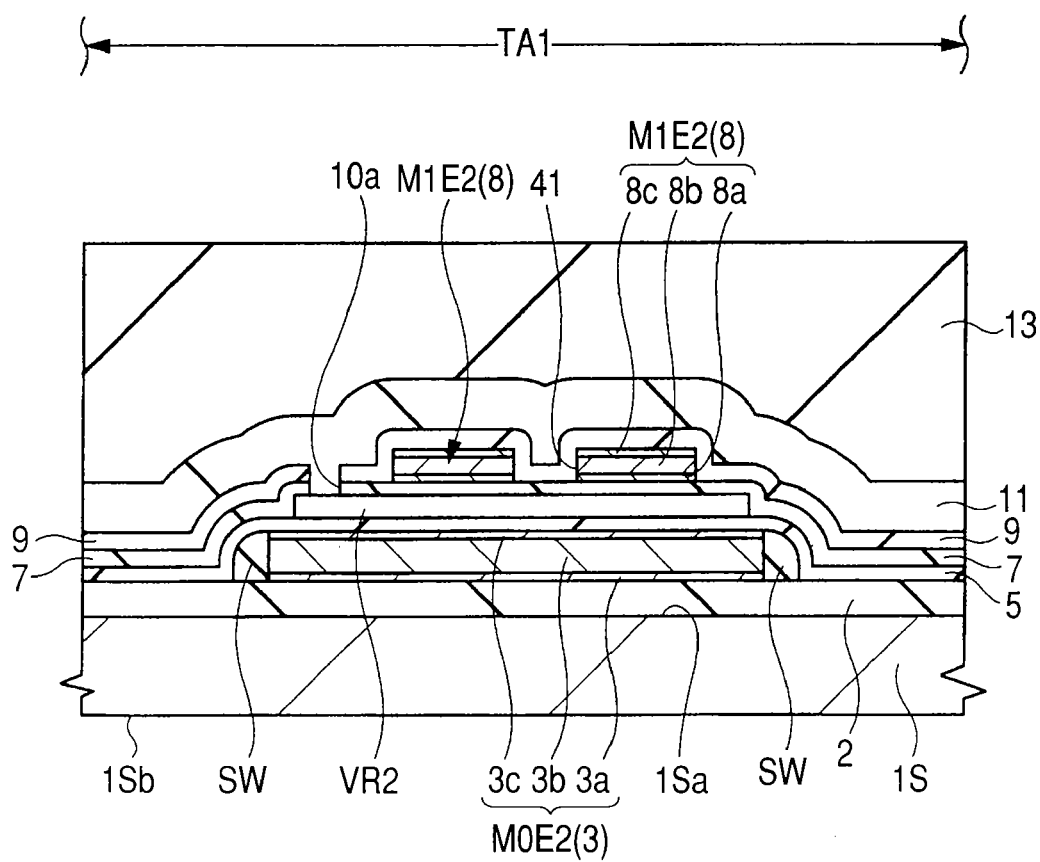
FIG. 24 is a cross sectional view showing an essential portion of the semiconductor device of the second embodiment of this invention.
Figure 25A:
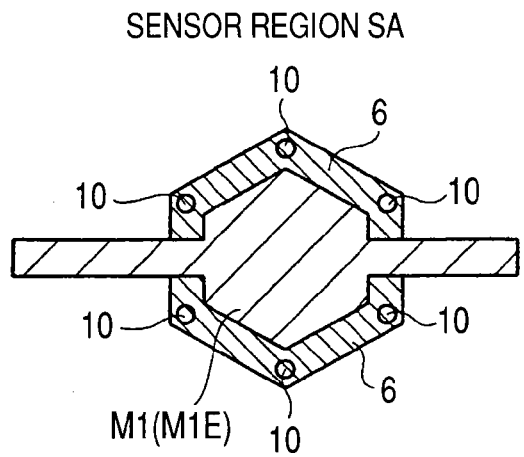
FIG. 25A is a flat view of an essential portion during the manufacturing process for the semiconductor device of the second embodiment of this invention.
Figure 25B:
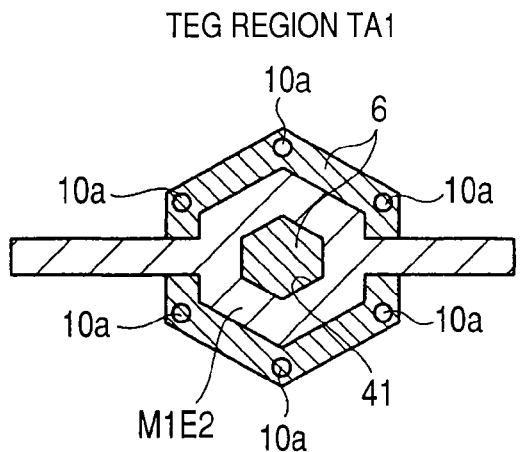
FIG. 25B is a flat view of an essential portion during the manufacturing process for the semiconductor device of the second embodiment of this invention.
Figure 26A:
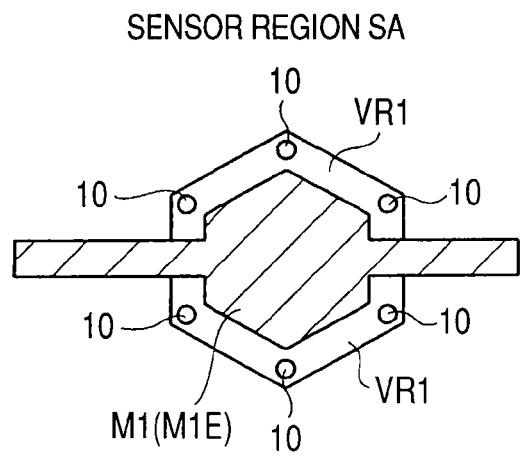
FIG. 26A is a flat view of an essential portion during the manufacturing process for the semiconductor device of the second embodiment of this invention.
Figure 26B:
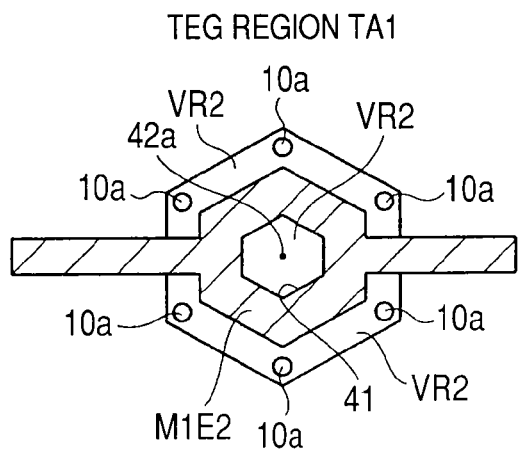
FIG. 26B is a flat view of an essential portion during the manufacturing process for the semiconductor device of the second embodiment of this invention.

FIG. 24 is a cross sectional view (essential cross sectional view of the TRG region TA1) showing an essential portion of the semiconductor device of this embodiment. FIG. 25 and FIG. 26 are flat (plan) view of essential sections during the process for manufacturing the semiconductor device of this embodiment. FIG. 24 corresponds to FIG. 5 of the first embodiment, while FIG. 25 and FIG. 26 respectively correspond to FIG. 20 and FIG. 21 of the first embodiment.

Other than the forming of a dummy upper electrode M1E2 made from a metallic layer (here, the laminated film 8) that is the same layer as the upper electrode wiring M1, on (above) the dummy cavity VR2 (sacrificial pattern 6a) on the TEG region TA1, the structure of the semiconductor device of this embodiment is identical to that of the first embodiment and therefore a description of that structure is omitted. The structure of the sensor region SA of the semiconductor device of this embodiment is also identical to the first embodiment. Other than the forming of the dummy upper electrode M1E2 made from a metallic layer (here, the laminated film 8) that is the same layer as the upper electrode wiring M1, above the sacrificial pattern 6a on the TEG region TA1, the process for manufacturing the semiconductor device of this embodiment is identical to that of the first embodiment.

In the first embodiment as shown in FIG. 5, there is no metallic layer that has the same layer as the upper electrode wiring M1, on (above) the entire dummy cavity VR2 (sacrificial pattern 6a) on the TEG region TA1. In the present embodiment on the other hand, as shown in FIG. 24, a dummy upper electrode M1E2 made from metallic film (here, the laminated film 8) is the same layer as the upper electrode wiring M1, on (above) the dummy cavity VR2 (sacrificial pattern 6a) on the TEG region TA1. This electrode wiring M1 and the dummy upper electrode M1E2 are made from the same conductive layer (here, laminated film 8) patterned and formed on the semiconductor substrate 1S (on insulating film 2).

In the process in this embodiment for patterning the laminated film 8 in order to form an upper electrode wiring M1 (processes in FIG. 11 and FIG. 12), the laminated film 8 is patterned so that it remains as the dummy upper electrode M1E2 even on the sacrificial pattern 6a of the TEG region TA1. Therefore, as shown in FIG. 25, along with forming an upper electrode wiring M1 on the sacrificial pattern 6a on region SA, a dummy upper electrode M1E2 is also formed on the sacrificial pattern 6a on the TEG region TA1. However, when the dummy upper electrode M1E2 completely covers the entire sacrificial pattern 6a, this dummy upper electrode M1E2 becomes an obstruction so that the etched state of the sacrificial pattern 6a on the TEG region TA1 cannot be observed in the step S2c process. Therefore, in this embodiment the dummy upper electrode M1E2 is formed to cover the sacrificial pattern 6a in localized sections. However, among these sacrificial patterns 6a, in particular no dummy upper electrode M1E2 is formed, above the position 42a located farthest from where hole 10a reaches that particular sacrificial pattern 6a. Therefore, in the semiconductor device of the present embodiment, the dummy upper electrode M1E2 covers the dummy cavity VR2 in localized sections; and among these dummy cavities VR2, the dummy upper electrode M1E2 in particular is formed not cover the section above the position 42a located farthest from where the hole 10a reaches that particular dummy cavity VR2.

In FIG. 25 and FIG. 26, a dummy upper electrode M1E2 is formed over the sacrificial patterns 6a (dummy cavities VR2). However among these sacrificial patterns 6a (dummy cavities VR2) a window (opening) 41 is formed in the dummy upper electrode M1E2, above the center section of a sacrificial pattern 6a (dummy cavity VR2) at a position equivalent to position 42a farthest from the hole 10a; and no dummy upper electrode M1E2 (laminated film 8) is formed there. Forming a dummy upper electrode M1E2 can in this way be avoided by forming a window 41 above position 42a farthest from the hole 10a reaching that particular sacrificial pattern 6a (dummy cavity VR2) among these sacrificial patterns 6a (dummy cavities VR2).

In FIG. 25 and FIG. 26 for example, the circumscribed diameter of the sacrificial pattern 6a (dummy cavity VR2) is set at approximately 50 μm, the distance between holes 10a at approximately 46 μm; and the circumscribed diameter of the dummy upper electrode M1E2 above the center section of the sacrificial pattern 6a (dummy cavity VR2) is set to approximately 35 μm, and the diameter of the window 41 on the dummy upper electrode M1E2 can be set to approximately 5 μm.

In the state shown in FIG. 25, the sacrificial patterns 6, 6a can be selectively removed in step S2 by wet etching, so that a cavity VR1 and a dummy cavity VR2 can be formed in the regions where the sacrificial patterns 6, 6a still remain.

When observing the etched state of the sacrificial patterns 6a on the TEG region TA1 in step S2c, and a non-etched remainder is found after having selectively etched the sacrificial patterns 6, 6a by way of the holes 10, 10a in step S2a; this non-etched remainder of the sacrificial pattern 6a was observed from window 41 of the dummy upper electrode M1E2. The amount of etching of the sacrificial pattern 6a can therefore be judged as insufficient in step S2d. In this case, a non-etched remainder can also be assumed on sacrificial pattern 6 in the sensor region SA so that the processes in steps S2a-S2d are repeated to eliminate the non-etched remainder on the sacrificial pattern 6 in the sensor region SA.

On the other hand, when there is no non-etched remainder on the sacrificial patterns 6, 6a, after selectively wet etching these sacrificial patterns 6, 6a by way of the holes 10, 10a in step S2a, then when the etched state of the sacrificial pattern 6a is observed in the TEG region TA1 in step S2c, then the sacrificial pattern 6a is not observed from the window 41 of the dummy upper electrode M1E2. The etching quantity of sacrificial pattern 6a is therefore judged as sufficient in step S2d. In this case, it can be assumed that there is no non-etched remainder of the sacrificial pattern 6 in the sensor region SA, and so the semiconductor substrate (semiconductor wafer) 1S can be sent on to the process of step S3.

The sacrificial patterns 6, 6a are wet etched by way of the holes 10, 10a in step S2a so that these sacrificial patterns 6, 6a are etched from the regions near the holes 10, 10a. Therefore, the sacrificial pattern 6a at position 42a farthest from the hole 10a (formed to reach these sacrificial patterns 6a is the last sacrificial pattern 6a to be etched. Consequently, being able to observe whether or not a non-etched reminder of the sacrificial pattern 6a has occurred at position 42a farthest from the hole 10a formed to reach the sacrificial pattern 6a (dummy cavity VR2) is necessary in order to judge whether or not a non-etched remainder has occurred on the sacrificial pattern 6a. In other words, among these sacrificial patterns 6a, if there is no non-etched remainder of the sacrificial pattern 6a at the position 42a (corresponding to the center section of the sacrificial pattern 6a (dummy cavity VR2) in the case of FIG. 25 and FIG. 26) farthest from the hole 10a formed to reach the sacrificial pattern 6a, then the sacrificial pattern 6a has been completely removed and the fact that no non-etched exists is confirmed.

Therefore in this embodiment, a dummy upper electrode M1E2 formed from metallic layer that is the same layer as the upper electrode wiring M1 is formed on the sacrificial pattern 6a in the TEG region TA1. Also, among these sacrificial patterns 6a, a window 41 is formed above position 42a farthest from the hole that 10a is formed to reach; and no dummy upper electrode M1E2 is formed. A dummy upper electrode M1E2 formed from metallic film (here, laminated film 8) that is the same layer as upper electrode wiring M1 is therefore formed on the dummy cavity VR2 of the TEG region TA1. However among these dummy cavities VR2, a window 41 is formed above the position 42a farthest from the hole that 10a is formed to reach the dummy cavity VR2, and no dummy upper electrode M1E2 is formed. In this way since the sacrificial pattern 6a has been entirely removed instep S2a, it can be confirmed in step S2c that there is no non-etched remainder. By confirming that there is no non-etched remainder of sacrificial pattern 6a on TEG region TA1, it can be assumed that there is no non-etched remainder of sacrificial pattern 6 on the sensor region SA, and therefore the semiconductor substrate (semiconductor wafer) 1S can be sent onto the next process (process for forming the insulating film 11) in a state where assumed that there is no non-etched remainder of sacrificial pattern 6 on the sensor region SA. In this way, a non-etched remainder of sacrificial pattern 6 on the sensor region SA can be prevented, and the cavity VR1 can be accurately formed on the sensor region SA. The productivity when manufacturing this semiconductor device is improved. Moreover, the performance and reliability of the semiconductor device is also improved.

In the case of the first embodiment, the etched state of the sacrificial pattern 6a can be observed in detail since there is absolutely no metal layer formed as the same layer as upper electrode wiring M1, above the sacrificial pattern 6a (dummy cavity VR2) on the TEG region TA1. The etched states of the sacrificial pattern 6a can also be identified in detail while the etching is in progress.

Accordingly in this embodiment, if forming a dummy upper electrode M1E2 on the sacrificial pattern 6a (dummy cavity VR2) on the TEG region TA1 then it is necessary that no metallic layer (dummy upper electrode M1E2) be formed as the same layer as upper electrode wiring M1 above the position 42a farthest from hole 10a among the sacrificial patterns 6a (dummy cavities VR2). Moreover, in order to identify the etched state of the sacrificial pattern 6a in finer detail, then the same as in the first embodiment, preferably no metallic layer (conducting layer) is formed as the same layer as the upper electrode M1 above the sacrificial pattern 6a (dummy cavity VR2) on the TEG region TA1. In the first embodiment, besides the location above the position farthest from hole 10a among the sacrificial patterns 6a (dummy cavities VR2) on the TEG region TA1; no metallic layer (dummy upper electrode M1E2) that is the same layer as upper electrode wiring M1 is formed on the entire sacrificial pattern 6a (dummy cavity VR2) on the TEG region TA1.

Third Embodiment

Figure 27A:
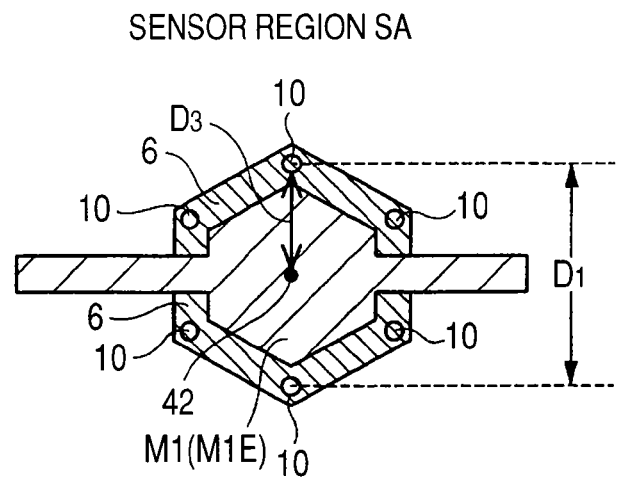
FIG. 27A is a flat view of an essential portion during the manufacturing process for the semiconductor device of the third embodiment of this invention.
Figure 27B:
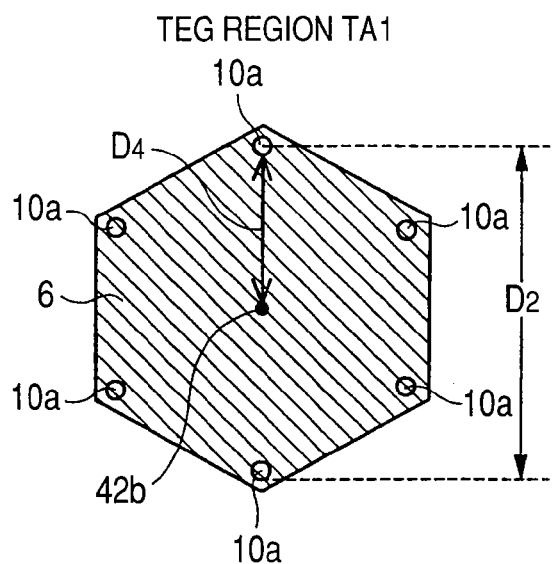
FIG. 27B is a flat view of an essential portion during the manufacturing process for the semiconductor device of the third embodiment of this invention.
Figure 28A:
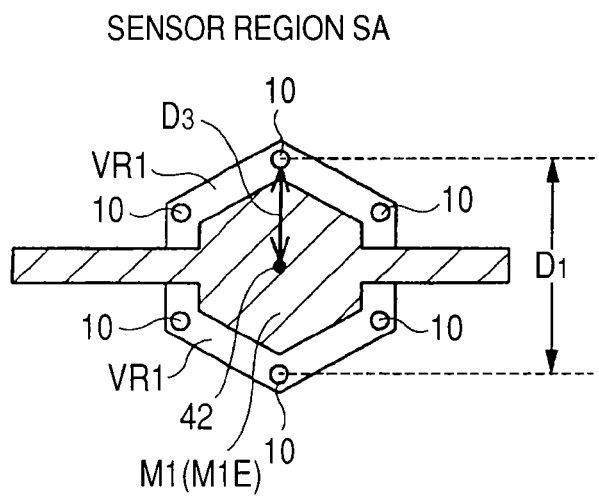
FIG. 28A is a flat view of an essential portion during the manufacturing process for the semiconductor device of the third embodiment of this invention.
Figure 28B:
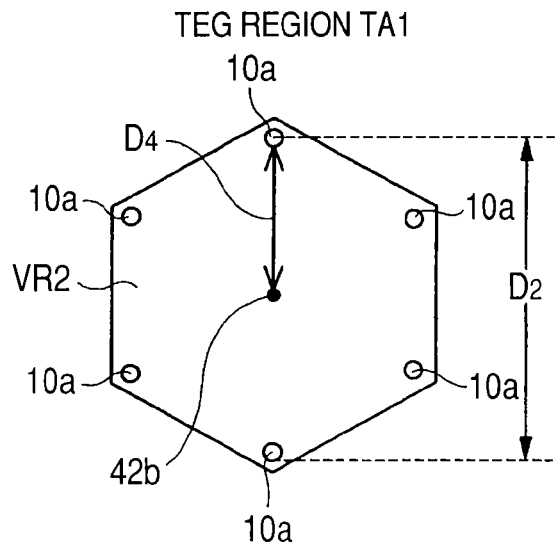
FIG. 28B is a flat view of an essential portion during the manufacturing process for the semiconductor device of the third embodiment of this invention.

FIG. 27 and FIG. 28 are flat views showing essential section during the process for manufacturing the semiconductor device of this embodiment. FIG. 27 and FIG. 28 respectively correspond to FIG. 20 and FIG. 21 of the first embodiment.

In the first embodiment, the dimensions and flat shape of the sacrificial pattern 6a on the TEG region TA1 are formed to essentially the same dimensions and flat shape as the sacrificial pattern 6 on the sensor region SA; and therefore the dimensions and flat shape of dummy cavity VR2 on TEG region TA1 are formed to essentially the same dimensions and flat shape as the cavity VR1 on the sensor region SA. In contrast, in this embodiment, the flat shape of sacrificial pattern 6a on TEG region TA1 is a similar shape to the flat shape of sacrificial pattern 6 on sensor region SA as shown in FIG. 27. The sacrificial pattern 6a on TEG region TA1 also possesses larger flat dimensions than the sacrificial pattern 6 on sensor region SA. Therefore as shown in FIG. 28, the flat shape of the dummy cavity VR2 on the TEG region TA1 is a shape similar to the flat shape of the cavity VR1 on sensor region SA, and the cavity VR2 on the TEG region TA1 possesses larger flat dimensions than the cavity VR1 on sensor region SA. In other words, in contrast to the first embodiment where the cavity VR1 and the dummy cavity VR2 are the same flat shape (same flat shape and same dimensions); in this embodiment the cavity VR1 and the dummy cavity VR2 are similar shapes but the dummy cavity VR2 is larger than the cavity VR1.

As shown in FIG. 27 and FIG. 28, the relative forming positions of the hole 10 versus the sacrificial pattern 6 (cavity VR1), are essentially the same as the relative forming positions of the hole 10a versus the sacrificial pattern 6a (dummy cavity VR2). In other words, the sacrificial pattern 6 (cavity VR1) and the sacrificial pattern 6a (dummy cavity VR2) can be regarded as similar on a flat plane including the forming positions of the hole 10, 10a.

In the case of FIG. 27 and FIG. 28, the circumscribed diameter of the sacrificial pattern 6a (dummy cavity VR2) on the TEG region TA1 is make larger than the circumscribed diameter of the sacrificial pattern 6 (cavity VR1) on the sensor region SA. Also, the distance between the holes 10a formed to reach the sacrificial pattern 6a of the TEG region TA1 is made longer than the distance between the holes 10 formed to reach the sacrificial pattern 6 (cavity VR1) on region SA. The circumscribed diameter of the sacrificial pattern 6 (cavity VR1) on the sensor region SA for example is about 50 µm and, the distance $D_1$ between the holes 10 formed so as to reach the sacrificial pattern 6 (cavity VR1) on the sensor region SA is about 46 µm and, circumscribed diameter of the sacrificial pattern 6a (dummy cavity VR2) on the TEG region TA1 is about 60 µm and, the distance $D_2$ between the holes 10a formed so as to reach the sacrificial pattern 6a (dummy cavity VR2) on the TEG region TA1 is about 56 µm.

Other than forming the sacrificial pattern 6a (dummy cavity VR2) on the TEG region TA1 to a larger flat shape than the sacrificial pattern 6 (cavity VR1) on the sensor region SA, the structure of the semiconductor device of this embodiment is identical to the structure of the first embodiment, and therefore a description of those identical sections is omitted. The structure of the sensor region SA of this semiconductor device of this embodiment is therefore the same as the first embodiment. The process for manufacturing the semiconductor device of this embodiment is also essentially the same as the first embodiment and so a description is omitted here.

In this embodiment, the sacrificial pattern 6 on the sensor region SA, and the sacrificial pattern 6a on the TEG region TA1 are made to similar shapes and, the sacrificial pattern 6a on the TEG region TA1 is made to a larger flat shape than the sacrificial pattern 6 on the sensor region SA. Also, on the sacrificial pattern 6a on the TEG region TA1, the distance $D_4$ (second distance) from the position 42b (second position) farthest from hole 10a to the hole 10a nearest the position 42b (second position) is larger than the distance $D_3$ (first distance) from the position 42 (first position) farthest from hole 10 to the hole 10 nearest the position 42 (first position) on the sacrificial pattern 6 on sensor region SA (in other words $D_4 > D_3$).

Therefore in the semiconductor device manufactured in this embodiment, the cavity VR1 on the sensor region SA and the dummy cavity VR2 on the TEG region TA1 are made to similar flat shapes and, the dummy cavity VR2 on the TEG region TA1 is made to a larger flat shape than the cavity VR1 on the sensor region SA. Moreover, on the dummy cavity VR2 on the TEG region TA1, the distance $D_4$ (second distance) from the position 42b (second position) farthest from hole 10a to the hole 10a nearest the position 42b (second position) is larger than the distance $D_3$ (first distance) from the position 42 (first position) farthest from hole 10 to the hole 10 nearest the position 42 (first position) on the cavity VR1 on the sensor region SA (in other words $D_4 > D_3$).

In the case of the patterns in FIG. 27 and FIG. 28, the distance $D_3$ is equivalent to $D_1/2$ and, the distance $D_4$ is equivalent to $D_2/2$.

In step S2a, the sacrificial patterns 6, 6a are wet etched by way of the holes 10, 10a and so the sacrificial patterns 6, 6a are etched from the regions nearest the holes 10, 10a. The sacrificial pattern 6 on the sensor region SA which is at position 42 farthest from the hole 10 is therefore etched last and the sacrificial pattern 6a on the TEG region TA1 which is at position 42b farthest from the hole 10a is etched last. By making the distance $D_4$ (second distance) larger than the distance $D_3$ (first distance) ($D_4 > D_3$) as described above, in step S2a, the time required for completely etching the sacrificial pattern 6a on the TEG region TA1 can be made longer than the time required for completely etching the sacrificial pattern 6 on the sensor region SA. Therefore, in steps S2c, S2d, if no non-etched remainder occurs on the sacrificial pattern 6a on the TEG region TA1, then one assume with even greater reliability that no non-etched remainder will occur on the sacrificial pattern 6 on the sensor region SA. By performing the above, the sacrificial pattern 6 on the sensor region SA will become over-etched at the point in time that the sacrificial pattern 6a on the TEG region TA1 is completely removed, and so a state with no non-etched remainder on the sacrificial pattern 6 on the sensor region SA can be checked with even higher accuracy. A non-etched remainder on the sacrificial pattern 6 on the sensor region SA can in this way be prevented and the cavity VR1 on sensor region SA can be formed with greater accuracy. The productivity when manufacturing the semiconductor device is therefore improved and the performance and reliability of the semiconductor device is further enhanced.

This embodiment can be combined with the second embodiment to allow forming a dummy upper electrode M1E2 above the dummy cavity VR2 (sacrificial pattern 6a)

on the TEG region TA1. However in this case, the same as with the second embodiment, among the sacrificial patterns 6a (dummy cavity VR2), no dummy upper electrode M1E2 is formed above the position 42b farthest from the hole 10a reaching that particular sacrificial pattern 6a (dummy cavity VR2).

Fourth Embodiment

Figure 29A:
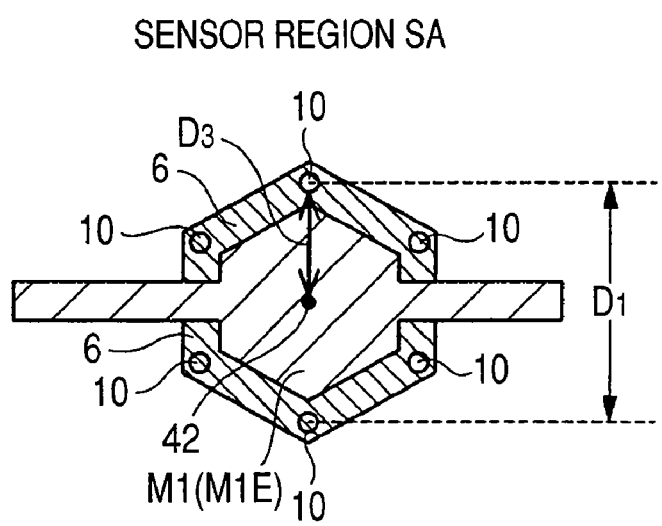
FIG. 29A is a flat view of an essential portion during the manufacturing process for the semiconductor device of the third embodiment of this invention.
Figure 29B:
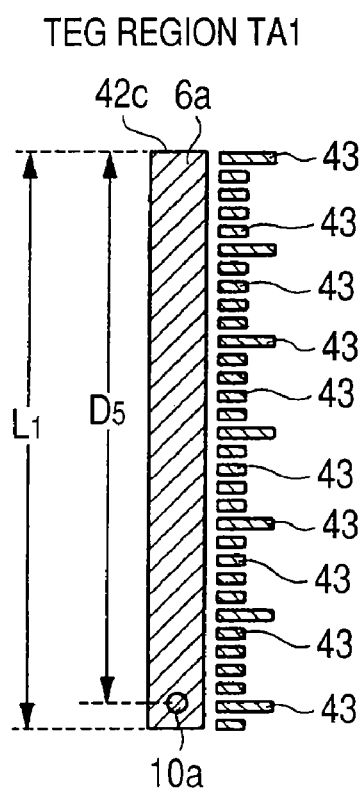
FIG. 29B is a flat view of an essential portion during the manufacturing process for the semiconductor device of the fourth embodiment of this invention.
Figure 30A:
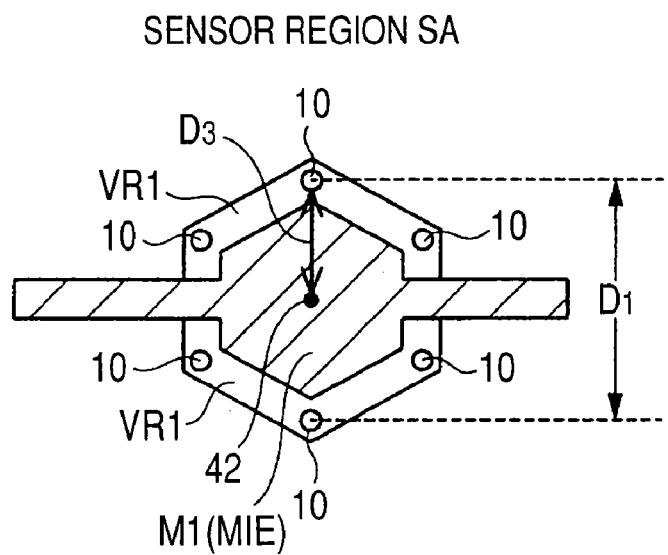
FIG. 30A is a flat view of an essential portion during the manufacturing process for the semiconductor device of the fourth embodiment of this invention.
Figure 30B:
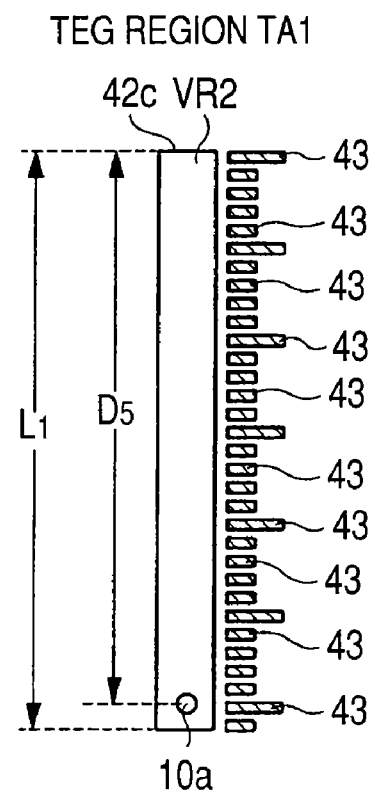
FIG. 30B is a flat view of an essential portion during the manufacturing process for the semiconductor device of the fourth embodiment of this invention.

FIG. 29 and FIG. 30 are flat views showing essential portions in the process for manufacturing the semiconductor device of this embodiment. FIG. 29 and FIG. 30 respectively correspond to the first embodiment in FIG. 20 and FIG. 21.

In the first embodiment, the flat shape and dimensions of the sacrificial pattern 6a (dummy cavity VR2) on the TEG region TA1 were substantially the same flat shape and dimensions as the sacrificial pattern 6 (dummy cavity VR1) on the sensor region SA. In the second embodiment, the flat shape of the sacrificial pattern 6a (dummy cavity VR2) on the TEG region TA1 was made similar to the flat shape of the sacrificial pattern 6 (dummy cavity VR1) on the region SA. In contrast, in this embodiment, the flat shape and dimensions of the sacrificial pattern 6a (dummy cavity VR2) on the TEG region TA1 are not the same, and differ from the flat shape and dimensions of the sacrificial pattern 6 (dummy cavity VR1) on the region SA as shown in FIG. 29 and FIG. 30. In this embodiment, the sacrificial pattern 6a (dummy cavity VR2) on the TEG region TA1 possesses a flat shape extending in one direction as shown in FIG. 29 and FIG. 30, and a hole 10a is formed near the end.

In this embodiment, a scaled pattern 43 is formed in the vicinity of the sacrificial pattern 6a on the TEG region TA1. The scaled pattern 43 is therefore formed (placed) in the vicinity of the dummy cavity VR2 on the TEG region TA1 on the semiconductor device produced in this embodiment. This scaled pattern 43 is formed from a pattern of material film (sacrificial pattern 6b) as the same layer as the sacrificial patterns 6, 6a. This scaled pattern 43 is formed in order to allow quantifying the etching amount of the sacrificial pattern 6a and is therefore a pattern arrayed at regular intervals (uniform intervals).

In the case of FIG. 29 and FIG. 30, the sacrificial pattern 6 on the sensor region SA (cavity VR1) is set for example to a circumscribed diameter of 50 μm, the distance $D_1$ between the holes 10 formed to reach the sacrificial pattern 6 (dummy cavity VR1) on the sensor region SA is set to 46 μm and, the maximum length (length L1 along the direction the sacrificial pattern 6a extends) of the sacrificial pattern 6a (cavity VR2) on the TEG region TA1 is set to 310 μm and, among the sacrificial patterns 6a (dummy cavities VR2), the distance $D_5$ from the hole 10a formed near the end of the sacrificial pattern 6a of the TEG region TA1 (dummy cavity VR2), to the position 42c farthest from that hole 10a, is set to about 300 μm.

Other than the change in shape of the sacrificial pattern 6a on the TEG region TA1 (dummy cavity VR2) and the forming of a scaled pattern 43, the structure of the semiconductor device of this embodiment is identical to the structure of the first embodiment and so a description is omitted here. Accordingly, the structure of the sensor region SA in the semiconductor device of this embodiment is identical to that in the first embodiment. Moreover, when patterning the sacrificial film 6b using the photolithography methods and dry etching methods in the process (namely the processes in FIG. 9 and FIG. 10) for manufacturing the semiconductor device of this embodiment, the processes are the same as the first embodiment except for the forming of sacrificial patterns 6, 6a and so a description is omitted here.

In this embodiment, the sacrificial pattern 6a on the TEG region TA1 possesses a flat shape extending in one direction. A hole 10a is formed to reach this sacrificial pattern 6a (dummy cavity VR2) near the end of the sacrificial pattern 6a. Also, the distance $D_5$ (second distance) from the position 42c (second position) farthest from that hole 10a to the hole 10a nearest the position 42c (second position) on the sacrificial pattern 6 on the TEG region TA1; is larger than the distance $D_3$ (first distance) from the position 42 (first position) farthest from hole 10 to the hole 10 nearest the position 42 (first position) on the sacrificial pattern 6 on the sensor region SA (in other words, $D_5 > D_3$).

Therefore, in the semiconductor device manufactured in this embodiment, the dummy cavity VR2 on the TEG region TA1 possesses a flat shape extending in one direction, and a hole 10a is formed to reach that dummy cavity VR2, near the end of the dummy cavity VR2. Moreover, the distance $D_5$ (second distance) from the position 42c (second pattern) farthest from that hole 10a to the hole 10a nearest the position 42c (second position) on the dummy cavity VR2 on the TEG region TA1; is larger than the distance $D_3$ (first distance) from the position 42 (first position) farthest from hole 10 to the hole 10 nearest the position 42 (first position) on the sacrificial pattern 6 on sensor region SA (in other words, $D_5 > D_3$).

In step S2a, the sacrificial patterns 6, 6a are wet etched by way of the holes 10, 10a so that the sacrificial patterns 6, 6a are etched from the regions nearest the holes 10, 10a. The sacrificial pattern 6 on the sensor region SA at the position 42 farthest from hole 10 is therefore etched last; and the sacrificial pattern 6a on the TEG region TA1 at the position 42c farthest from hole 10a is therefore etched last. By making the distance $D_5$ (second distance) larger than the distance $D_3$ (first distance) ($D_5 > D_3$) as described above, the time required for completely etching the sacrificial pattern 6a on the TEG region TA1 can be made longer than the time required for completely etching the sacrificial pattern 6 on the sensor region SA. In this way, if no non-etched remainder occurred on the sacrificial pattern 6a on the TEG region TA1 in steps S2c, S2d, then one can estimate with even higher reliability that no non-etched remainder occurred on the sacrificial pattern 6 of the sensor region SA. Moreover, by extending the flat shape of sacrificial pattern 6a (dummy cavity VR2) on the TEG region TA1 in one direction, and forming a hole 10a near the end of the sacrificial pattern 6a (dummy cavity VR2), the etched amount on the sacrificial pattern 6a (dummy cavity VR2) on the TEG region TA1 can be monitored, and one can assume (confirm) with even higher accuracy that there is no non-etched remainder of sacrificial pattern 6 on the sensor region SA.

Also in this embodiment, a scaled pattern 43 is formed (placed) in the vicinity of the (adjoining) sacrificial pattern 6a (dummy cavity VR2) on the TEG region TA1 so that the etching amount of the sacrificial pattern 6a can be quantified during the observation in step S2c. The etching amount in the etching process of the sacrificial pattern 6a in step S2a can therefore be quantitatively observed (judged) in step S2c so that the accuracy (reliability) can be further enhanced when judging whether the sacrificial pattern 6a was sufficiently etched or not in step S2d. In this way, a non-etched remainder of sacrificial pattern 6 on the sensor region SA can be more accurately prevented and the cavity VR1 can formed more accurately on the sensor region SA. The productivity when manufacturing this semiconductor device is therefore improved. Moreover, the performance and reliability of the semiconductor device is also improved.

This embodiment can be combined with the second embodiment to allow forming a dummy upper electrode M1E2 above the dummy cavity VR2 (sacrificial pattern 6a) on the TEG region TA1. In this case, the same as with the second embodiment, among the sacrificial patterns 6a (dummy cavity VR2), there is no dummy upper electrode M1E2 formed above the position farther than the distance D3 (first distance) from the hole 10a reaching that particular sacrificial pattern 6a (dummy cavity VR2).

In the present embodiment, the sacrificial pattern 6a (dummy cavity VR2) on the TEG region TA1 is made a flat shape extending in one direction to allow monitoring the etching amount of sacrificial pattern 6a on the TEG region TA1, so that more preferably nothing equivalent to the dummy upper electrode M1E2 is formed above the sacrificial pattern 6a on the TEG region TA1 (dummy cavity VR2). The etched state of sacrificial pattern 6a on the TEG region TA1 can in this way be observed in more detail, and the state of the etching in progress on the sacrificial pattern 6a can be identified even more precisely.

Fifth Embodiment

Figure 31:
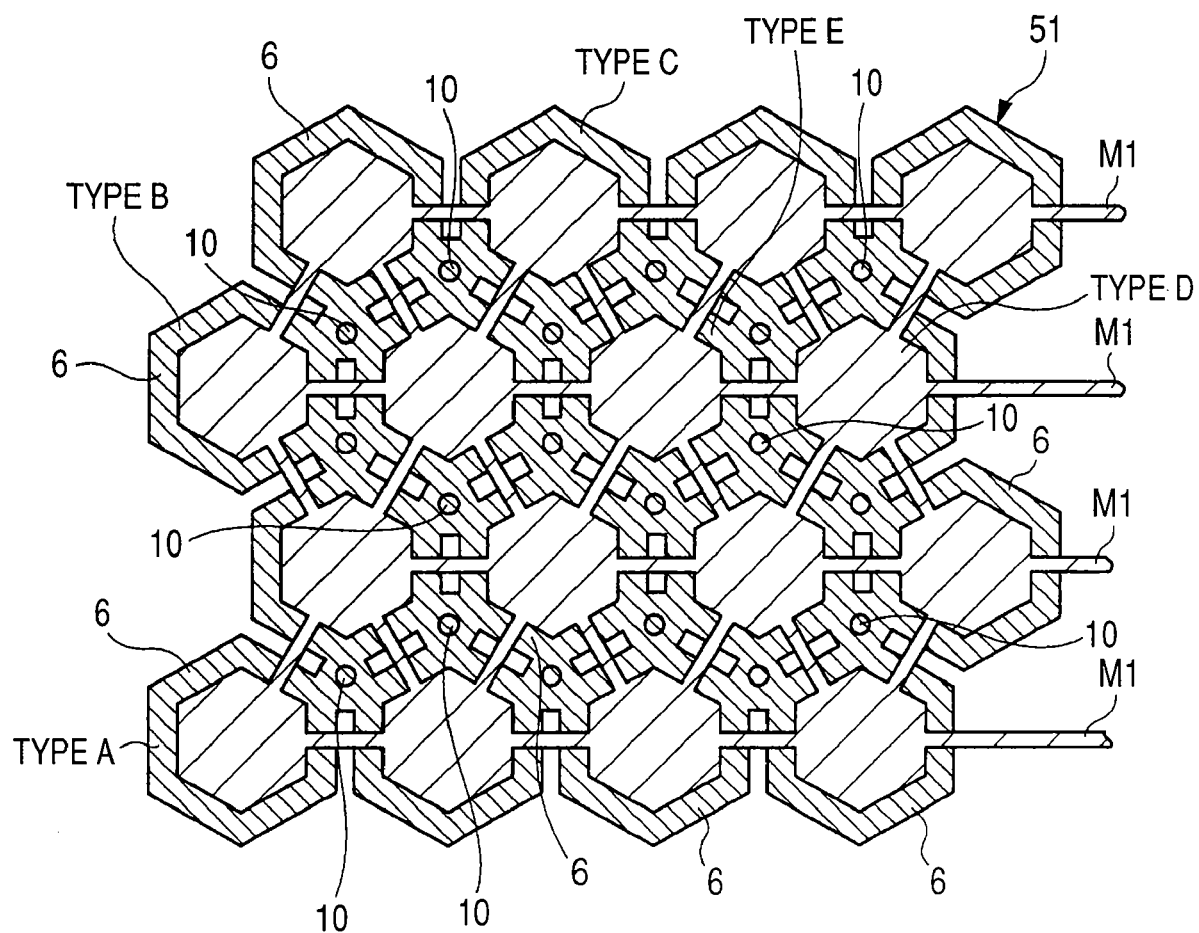
FIG. 31 is a flat view of an essential portion during the manufacturing process for the semiconductor device of the fifth embodiment of this invention.
Figure 32:
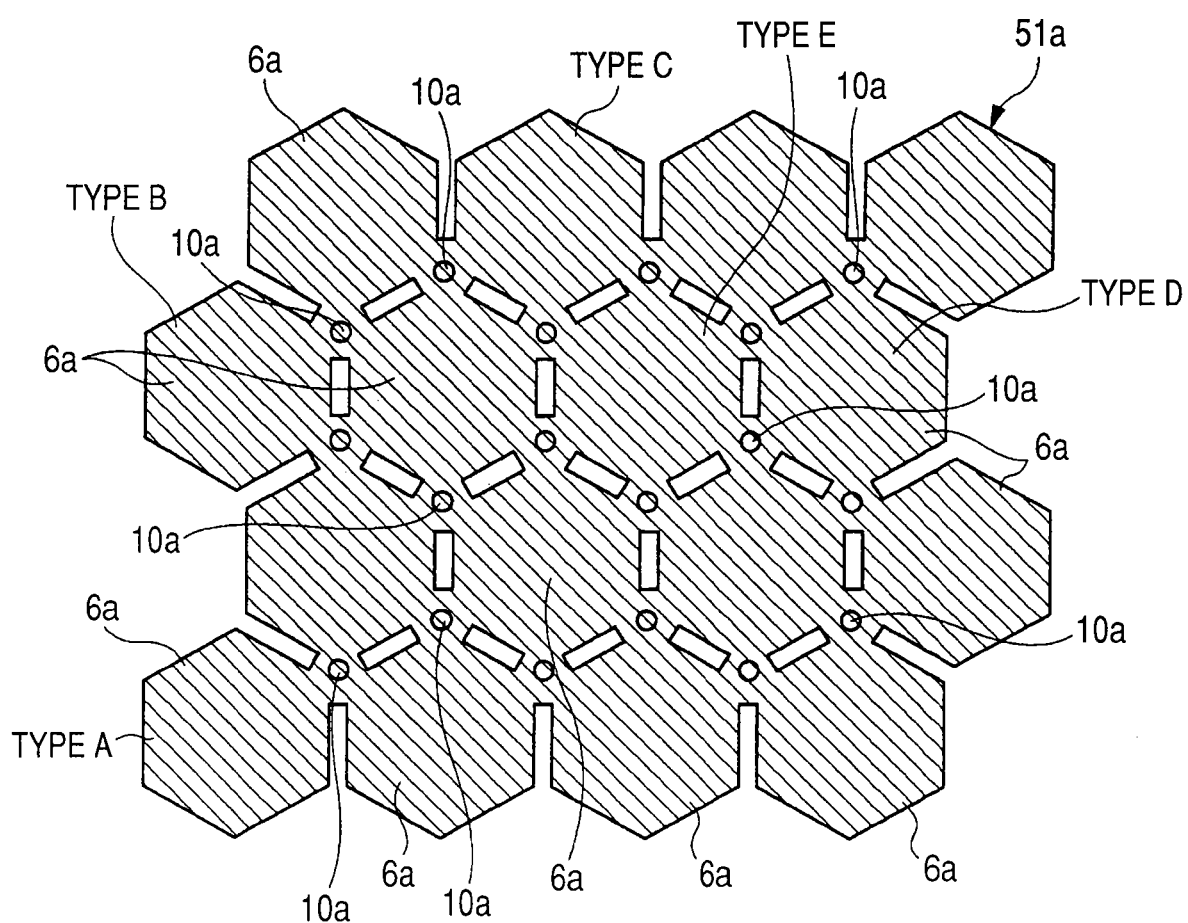
FIG. 32 is a flat view showing an essential portion during the manufacturing process for the semiconductor device of the fifth embodiment of this invention.
Figure 33:
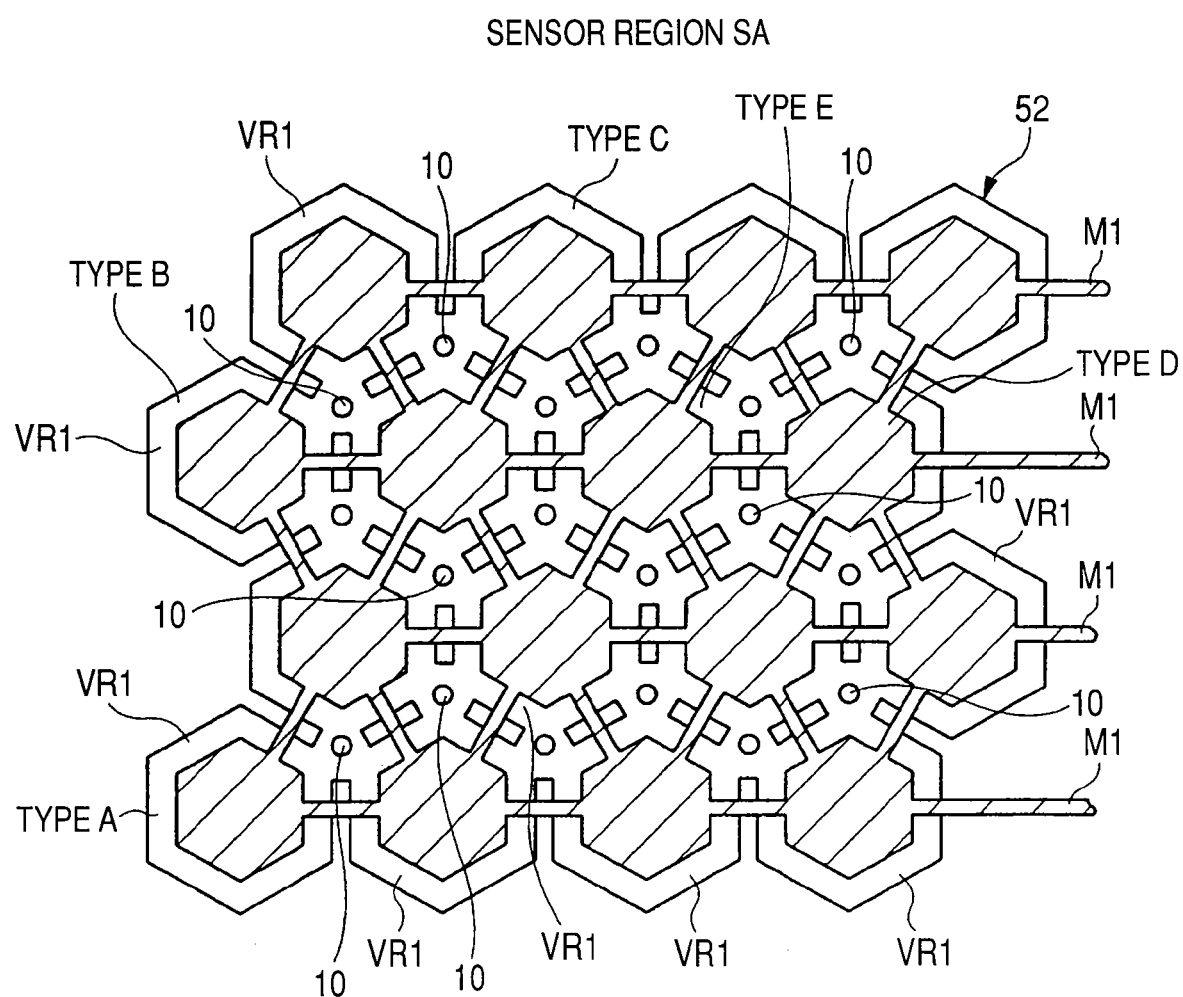
FIG. 33 is a flat view showing an essential portion during the manufacturing process for the semiconductor device of the fifth embodiment of this invention.
Figure 34:
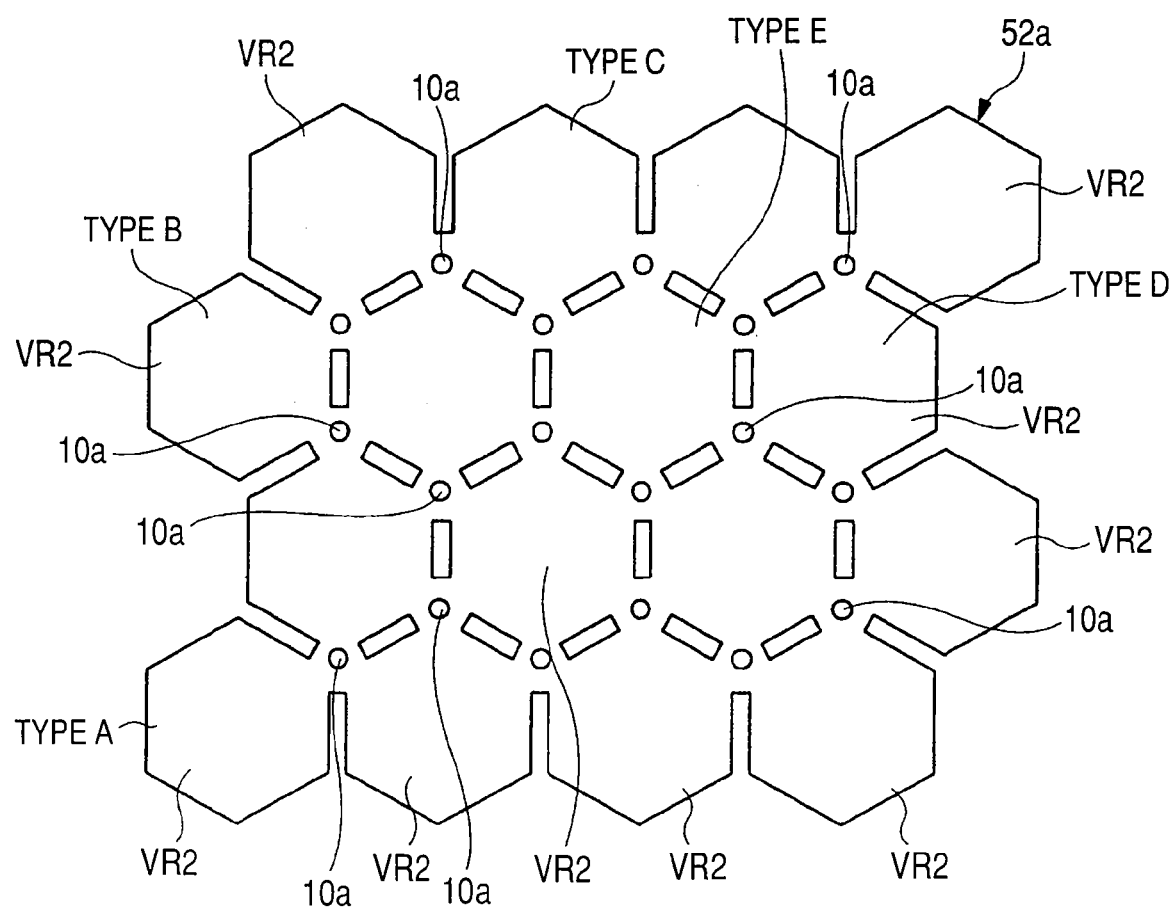
FIG. 34 is a flat view showing an essential portion during the manufacturing process for the semiconductor device of the fifth embodiment of this invention.

FIG. 31 through FIG. 34 are flat views showing essential portions in the process for manufacturing the semiconductor device of this embodiment. FIG. 31 corresponds to FIG. 20A of the first embodiment, FIG. 32 corresponds to FIG. 20B of the first embodiment, FIG. 33 corresponds to FIG. 21A of the first embodiment, and FIG. 34 corresponds to FIG. 21B of the first embodiment. Namely, FIG. 31 and FIG. 33 show flat views of essential portions of the sensor region SA; and FIG. 32 and FIG. 34 show flat views of essential portions on the TEG region TA1. The same as with FIG. 20, the FIG. 31 and FIG. 32 also correspond to the same process stage as in FIG. 14. Also, the same as with FIG. 21, the FIG. 33 and FIG. 34 correspond to the same process stage as in FIG. 15.

In this embodiment, when there are multiple types of pattern placements (relative positions) between the holes 10 and sacrificial patterns 6 on the sensor region SA, the oscillator group (group made up of multiple oscillators 20) positioned at the cross point between the upper electrode wiring M1 and the lower electrode wiring M0 are regarded as 1 set; and one set of the sacrificial patterns 51a of the same type (same shape) as the one set of sacrificial patterns 51 on the sensor region SA, are formed on the TEG region TA1.

In other words, during the patterning of the sacrificial film 6b in this embodiment, a sacrificial pattern 51 made up of multiple connected sacrificial patterns 6, is formed in the sensor region SA; and a sacrificial pattern 51a made up of multiple connected sacrificial patterns 6a, and identical in shape to the sacrificial pattern 51, is formed in the TEG region TA1 and; when forming the holes 10, 10a, the position (relative positions) of the holes 10 on sacrificial pattern 51, are made identical to the position (relative position) of the holes 10a on the sacrificial pattern 51a.

Therefore, in the semiconductor device manufactured in this embodiment, a cavity pattern 52 (first cavity pattern) of multiple connected cavities VR1 (first cavity) forming respective oscillators 20 (sensor cells) are formed on the sensor region SA; and a dummy cavity pattern 52a (second cavity pattern) of multiple connected dummy cavities VR2 (second cavity) and of the same shape as the cavity pattern 52 is formed on the TEG region TA1. Also, the position of the hole 10 (first opening) position (relative position) for the cavity pattern 52, is made to the same position as the hole 10a (second opening) position (relative position) for the dummy cavity pattern 52a.

In the case for example in FIG. 31 and FIG. 33, there are five types of positioning patterns (relative positions) between the hole 10 and the sacrificial pattern 6 (cavity VR1) These five types are Type A, Type B, Type C, Type D and Type E. A sacrificial patterns 51 (cavity pattern 52) is formed that is made up of these 5 types (Types A-E) of connected sacrificial patterns 6 (cavity VR1). This sacrificial pattern 51 (cavity pattern 52) is formed on the sensor region SA at the cross points of the lower electrode wiring M0 and the upper electrode wiring M1. This sacrificial pattern 51a (dummy cavity pattern 52a) possessing the same shape as sacrificial pattern 51 is therefore formed on the TEG region TA1 as shown in FIG. 32 and FIG. 34. There are accordingly five types of patterns including Type A, Type B, Type C, Type D and Type E that make up placement patterns (relative positions) between the hole 10a and sacrificial patterns 6a among the individual sacrificial patterns 6a of (dummy cavity pattern VR2) making up the sacrificial pattern 51a (dummy cavity pattern 52a). Also, there is no metallic film as the same layer as upper electrode wiring M1, formed above the sacrificial pattern 51a (dummy cavity pattern 52a) on the TEG region TA1.

Other than in the above description, the structure of the semiconductor device of this embodiment is identical to the structure of the first embodiment and so a description is omitted here. The process for manufacturing the semiconductor device of this embodiment is identical to that in the first embodiment and so a description is omitted here.

There are multiple types (here, the types A-E) of placement patterns (relative positions) between the holes 10 and the sacrificial patterns 6 as shown in FIG. 31, and sacrificial patterns 51 made up of these multiple connected sacrificial patterns 6 are formed on the sensor region SA. In step S2a, the sacrificial pattern 51 is etched from the region near the hole 10. Therefore, the multiple sacrificial patterns 6 making up the sacrificial pattern 51 are etched differently among each of the types A-E, and the time required for etching is also different.

Therefore in this embodiment, the sacrificial pattern 51a (dummy cavity pattern 52a) with a shape identical to the sacrificial pattern 51 (cavity pattern 52) on the sensor region SA, is formed on the TEG region TA1. Also, the hole 10 position (relative position) for the sacrificial pattern 51 (cavity pattern 52), and the hole 10a position (relative position) for the sacrificial pattern 51a (dummy cavity pattern 52a) are made the same. The etched state of the sacrificial pattern 51 on sensor region SA, and the etched state of the sacrificial pattern 51a on the TEG region TA1 can therefore be made the same in the etching process in step S2a. The etching state of the sacrificial pattern 51 on sensor region SA can be estimated more accurately, by observing the etched state of sacrificial pattern 51a on the TEG region TA1 in step S2c, so that the overall etched state of the sacrificial patterns 51, 51a can therefore be confirmed at a glance. Non-etched remainders on the entire sacrificial pattern 51 of multiple sacrificial patterns 6 can therefore be prevented, and the cavity patterns 51 of multiple connected cavities VR1 can be formed with greater accuracy. The productivity when manufacturing this semiconductor device can therefore be improved. Moreover, the performance and reliability of the semiconductor device is also improved.

However, this embodiment requires a TEG region TA1 surface area that is larger than the surface area of the first through fourth embodiments.

Sixth Embodiment

Figure 35:
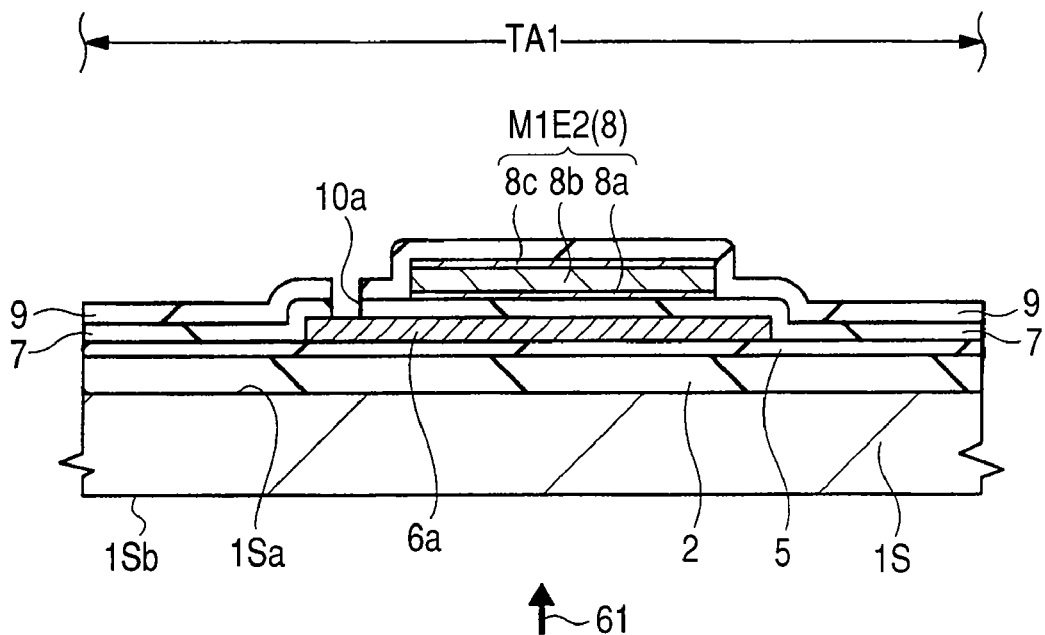
FIG. 35 is a cross sectional view showing an essential portion during the manufacturing process for the semiconductor device of the sixth embodiment of this invention.
Figure 36:
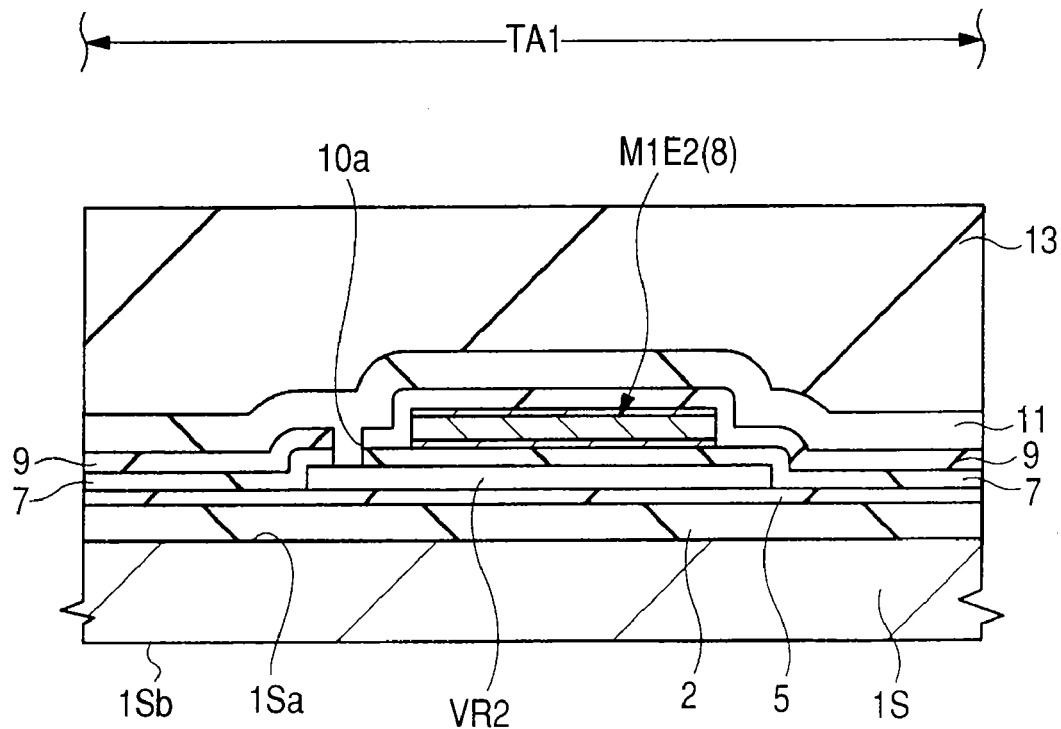
FIG. 36 is a cross sectional view showing an essential portion of the semiconductor device of the fifth embodiment of this invention.

FIG. 35 is a cross sectional view (essential cross sectional view of the TEG region TA1) showing an essential portion of the process for manufacturing the semiconductor device of this embodiment. FIG. 36 is a cross sectional view (essential cross sectional view of TEG region TA1) of the semiconductor device of this embodiment. FIG. 36 corresponds to FIG. 5 of the first embodiment. FIG. 35 shows the same region as FIG. 36 but is an essential cross sectional view of stages in the process corresponding to FIG. 14 of the first embodiment.

In the first embodiment, in step S2c, the etched state of the sacrificial pattern 6a on the TEG region TA1 is observed from the front (top) surface of the semiconductor substrate (semiconductor wafer) 1S (in other words, the main surface for forming the oscillators 20) namely from the direction 21 in FIG. 15. In this embodiment on the other hand, the etched state of sacrificial pattern 6a on the TEG region TA1 is observed in step S2c, from the rear surface side 1Sb of the semiconductor substrate (semiconductor wafer) 1S (in other words, the main surface on the side opposite the main surface for forming the oscillators 20), namely from the direction 61 shown by the arrow in FIG. 35.

In this embodiment, the etched state of the sacrificial pattern 6a on the TEG region TA1 is observed in step S2c, from the rear surface side of the semiconductor substrate (semiconductor wafer) 1S (namely from direction 61 in FIG. 35) so that the semiconductor substrate 1S must be transparent in order to observe the etched state of the sacrificial pattern 6a on the TEG region TA1. Therefore the semiconductor substrate (semiconductor wafer) 1S preferably allows light to pass through (is transparent). For example, the semiconductor substrate (semiconductor wafer) 1S in this embodiment may be made from a quartz substrate, etc. Making the semiconductor substrate (semiconductor wafer) 1S transparent to light, makes the semiconductor substrate (semiconductor wafer) 1S transparent when viewed in step S2c from the rear side of semiconductor substrate (semiconductor wafer) 1S so that the etched state of the sacrificial pattern 6a on the TEG region TA1 can be accurately observed.

In the first embodiment, in step S2c, the etched state of the sacrificial pattern 6a on the TEG region TA1 was observed, from the front (top) side of the semiconductor substrate (semiconductor wafer) 1S (namely from direction 21 in FIG. 15). Therefore, there is no metallic layer possessing the same layer as the upper electrode wiring M1 above the sacrificial pattern 6a (dummy cavity VR2) on the TEG region TA1.

In contrast, in this embodiment, in step S2c, the etched state of sacrificial pattern 6a on the TEG region TA1 is observed from the rear surface side of the semiconductor substrate (semiconductor wafer) 1S, so in order to prevent interfering with the observation, there is no metallic layer (equivalent to the dummy lower electrode M0E2) that is the same layer as the lower electrode wiring M0 (lower electrode M0E) below the sacrificial pattern 6a (dummy cavity VR2) on the TEG region TA1 as shown in FIG. 35 and FIG. 36. The etched state of the sacrificial pattern 6a on the TEG region TA1 can in this way be observed in step S2c from the rear side of the semiconductor substrate (semiconductor wafer) 1S.

By therefore verifying in step S2c that there is no non-etched remainder on the sacrificial pattern 6a on the TEG region TA1, one can estimate that there is no non-etched remainder on the sacrificial pattern 6 on the sensor region SA. The semiconductor substrate (semiconductor wafer) 1S can therefore be sent to the next process (process for forming the insulating film 11) in a state where no non-etched remainders are present on the sacrificial pattern 6 on the sensor region SA. Non-etched remainders can in this way be prevented on the sacrificial pattern 6 on the sensor region SA, and a cavity VR1 can be accurately formed on the sensor region SA. Consequently, the productivity when manufacturing this semiconductor device is improved, and the performance and reliability of the semiconductor device also improved.

In FIG. 35 and FIG. 36, a metallic layer (dummy upper electrode M1E2) that is the same layer as the upper electrode wiring M1 was formed, above the sacrificial pattern 6a (dummy cavity VR2) on the TEG region TA1, however that structure can be omitted. Moreover, when forming the dummy upper electrode M1E2 above the sacrificial pattern 6a (dummy cavity VR2) on the TEG region TA1, a window 41 such as formed in the second embodiment may be formed or not formed on the dummy upper electrode M1E2 of this embodiment. The reason for this is that in this embodiment the etched state of the sacrificial pattern 6a is observed from the rear (back) side and not the front surface side of the semiconductor substrate (semiconductor wafer) 1S, so that there is no problem in observing the etched state of sacrificial pattern 6a regardless of whether there is a window 41 or not on the dummy upper electrode M1E2.

In all other respects the structure of the semiconductor device of this embodiment is identical to the first embodiment so a description is omitted here. The structure of the sensor region SA of the semiconductor device of this embodiment is also identical to the first embodiment. Other than the fact that the etched state of the sacrificial pattern 6a on the TEG region TA1 is observed in step S2c from a different direction, the process for manufacturing the semiconductor device of this embodiment is essentially identical to the first embodiment so a description is omitted here.

In this embodiment, defects such as due to scratches and foreign objects adhering to sensor surface (sensor region SA) formed on the front surface side of semiconductor substrate (semiconductor wafer) 1S must be prevented during observation of the etched state of the sacrificial pattern 6a on the TEG region TA1 from the rear side of the semiconductor substrate (semiconductor wafer) 1S in step S2c.

This embodiment can also be combined with the third through the fifth embodiments.

Seventh Embodiment

Figure 37:
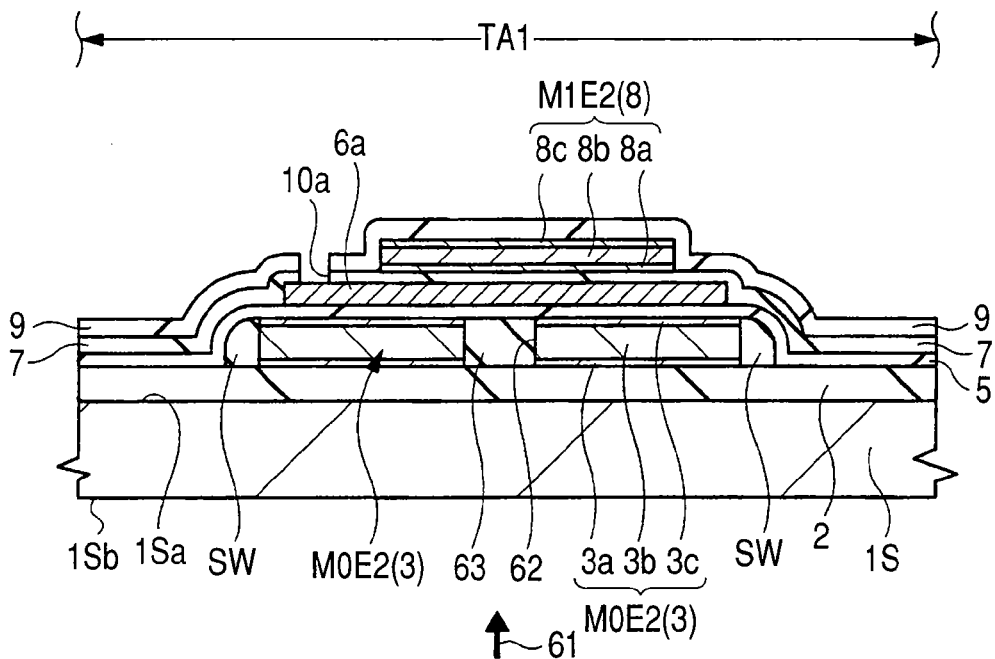
FIG. 37 is a cross sectional view showing an essential portion during the manufacturing process for the semiconductor device of the sixth embodiment of this invention.
Figure 38:
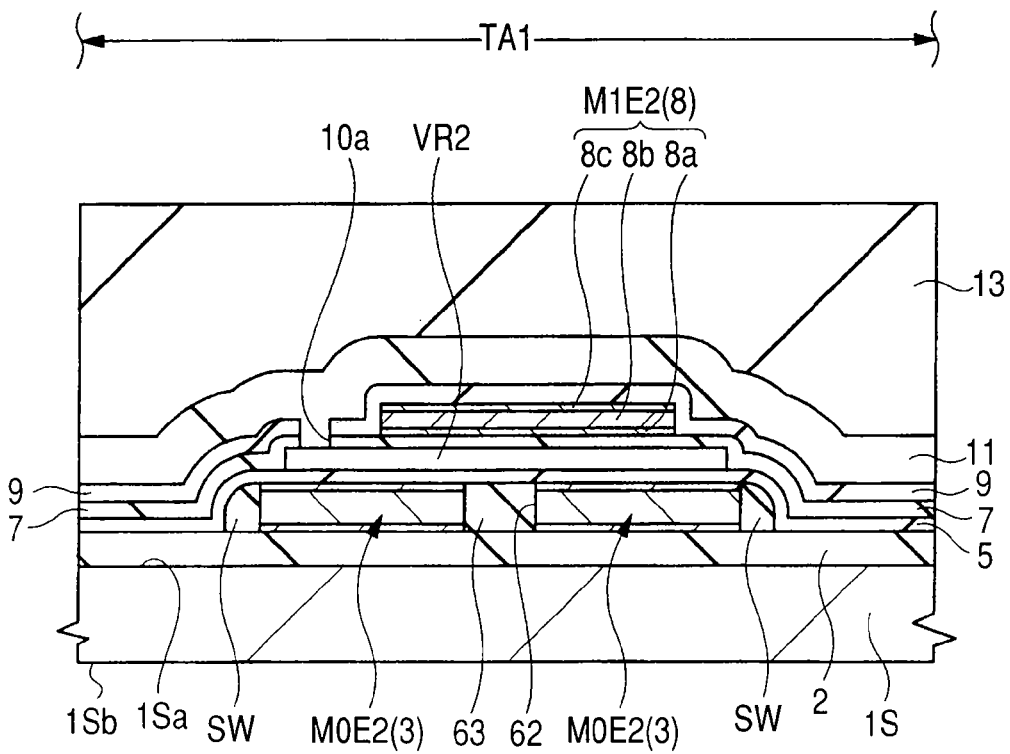
FIG. 38 is a cross sectional view showing an essential portion of the semiconductor device of the fifth embodiment of this invention.

FIG. 37 is a cross sectional view (essential cross sectional view of the TEG region TA1) showing an essential portion of the process for manufacturing the semiconductor device of this embodiment. FIG. 38 is a cross sectional view (essential cross sectional view of the TEG region TA1) of the semiconductor device of this embodiment. FIG. 37 corresponds to the structure in FIG. 35 of the sixth embodiment. FIG. 38 corresponds to the structure in FIG. 36 of the sixth embodiment.

In the present embodiment, just as in the sixth embodiment, the etched state of the sacrificial pattern 6a on the TEG region TE1, is observed in step S2c from the rear surface side 1Sb of the semiconductor substrate (semiconductor wafer) 1S, or namely from the direction 61 of FIG. 35. Therefore in this embodiment, the semiconductor substrate (semiconductor wafer) 1S is preferably transparent to light, the same as in the first embodiment. The semiconductor substrate (semiconductor wafer) 1S for example can be made a quartz substrate, etc.

However, though no metallic layer that is the same layer as the lower electrode wiring M0 (lower electrode M0E) was formed below the sacrificial pattern 6a (dummy cavity VR2) on the TEG region in the sixth embodiment; in the present embodiment, a metallic layer (here, a dummy lower electrode M0E) that is the same layer as the lower electrode wiring M0 (lower electrode M0E) was formed below the sacrificial pattern 6a as shown in FIG. 37 and FIG. 38.

However, when a dummy lower electrode M0E2 was formed below the entire sacrificial pattern 6a (dummy cavity VR2), then this dummy lower electrode M0E2 interferes with observation of the etched state of the sacrificial pattern 6a on the TEG region TE1 from the rear side surface of the semiconductor substrate (semiconductor wafer) 1S (namely from direction 61 in FIG. 37), so that observing the etched state of the sacrificial pattern 6a is impossible.

Therefore in this embodiment, a dummy lower electrode M0E2 made from a metallic layer (here, the laminated film 3) that is the same layer as the lower electrode wiring M0 is formed below the sacrificial pattern 6a (dummy cavity VR2) on the TEG region TE1. However, among these sacrificial patterns 6a (dummy cavities VR2), no dummy lower electrode M0E2 is formed in particular, above the position located farthest from where the hole 10a reaches that particular sacrificial pattern 6a. For example as shown in FIG. 37 and FIG. 38, among the sacrificial patterns 6a (dummy cavities VR2), a window 62 (opening) is formed in the dummy electrode M0E2 below the position (position equivalent to the position 41a in FIG. 25 and FIG. 26) located farthest from where the hole 10a reaches that particular sacrificial pattern 6a (dummy cavity VR2), and no dummy lower electrode M0E2 is formed at that position.

In other words, in this embodiment, a window 62 is formed in the dummy lower electrode M0E2 to allow observing the etched state of the sacrificial pattern 6a from the rear (back) side of the semiconductor substrate 1S in step S2c. This embodiment is similar to the second embodiment where a window 41 was formed in the dummy upper electrode M1E2 to allow observing the etched state of the sacrificial pattern 6a from the front side of the semiconductor substrate 1S in step S2c.

A check can in this way be made in step S2c to confirm there are no non-etched remainders, after the sacrificial pattern 6a was entirely removed in step S2a. By therefore verifying that there in no non-etched remainder on the sacrificial pattern 6a on the TEG region TA1, one can estimate that there is also no non-etched remainder on the sacrificial pattern 6 on the sensor region SA. The semiconductor substrate (semiconductor wafer) 1S can therefore be sent to the next process (process for forming the insulating film 11) in a state where no non-etched remainder is present on the sacrificial pattern 6 on the sensor region SA. Non-etched remainders can in this way be prevented on the sacrificial pattern 6 on sensor region SA, and a cavity VR1 can be accurately formed on the sensor region SA. Consequently, the productivity when manufacturing this semiconductor device is improved, and the performance and the reliability of the semiconductor device also improved.

In the case of the sixth embodiment, absolutely no metallic layer that is the same layer as the lower electrode wiring M0 is formed, below the sacrificial pattern 6a (dummy cavity VR2) on the TEG region TA1. The etched state of the sacrificial pattern 6a can therefore be observed in greater detail, also the etched states of the sacrificial pattern 6a can also be identified in detail while the etching is in progress.

Forming a window 62 in the dummy lower electrode M0E2 in this embodiment, requires first of all forming a dummy lower electrode M0E2, and after embedding the window 62 in an insulating film 63 made for example from silicon oxide film, planarizing the upper surface of the insulating film 63 and the upper surface of the dummy lower electrode M0E2, and then performing the process to form the insulating film 5. In the sixth embodiment on the other hand, the manufacturing process is simple since no process for embedding and planarizing the insulating film 63 is required.

Other sections of the structure of the semiconductor device of this embodiment are identical to the structure of the sixth embodiment, and therefore their description is omitted. The structure of the sensor region SA of this semiconductor device of this embodiment is therefore the same as the first embodiment. Also, other than the fact that the etched state of the sacrificial pattern 6a on the TEG region TA1 is observed in step S2c from a different direction, the process for manufacturing the semiconductor device of this embodiment is essentially identical to the first embodiment so a description is omitted here.

In this way, in both the sixth and seventh embodiments, besides forming a cavity VR1 (sacrificial pattern 6) in the sensor region SA, a dummy cavity VR2 (sacrificial pattern 6a) is also formed outside the sensor region SA (here, the TEG region). However, in the first and second embodiments, no conducting layer that is the same layer as the upper electrode M1E (upper electrode wiring M1) is formed among these dummy cavities VR2, above a (dummy cavity VR2) position farthest from the hole 10a; and in the first embodiment in particular, no conducting layer is formed on the same layer as the upper electrode M1E (upper electrode wiring M1) above the dummy cavity VR2. In the embodiments 6, 7 on the other hand, no conducting layer that is the same layer as the lower electrode M0E (lower electrode wiring M0) is formed below the position farthest from the hole 10a, among the dummy cavities VR2. In the seventh embodiment in particular, no conducting layer that is the same layer as the lower electrode M0E (lower electrode wiring M0) formed below the dummy cavity VR2.

In the seventh embodiment, the same as in the sixth embodiment, defects such as due to scratches and to foreign objects adhering to the sensor surface (sensor region SA) formed on the semiconductor substrate (semiconductor wafer) 1S must be prevented during observation of the etched state of the sacrificial pattern 6a on the TEG region TA1 from the rear side of the semiconductor substrate (semiconductor wafer) 1S in step S2c.

This embodiment can also be combined with the third through the fifth embodiments.

A specific description of the invention and the embodiments as contrived by the present inventors was given above. However this invention is not limited to these embodiments, and needless to say is changeable and adaptable in multiple variations not departing from the spirit and scope of the invention.

The above invention as rendered by the inventors was mainly described in regards to the background and applicable field of the invention as applied to a semiconductor device including an ultrasonic sensor and a method for manufacturing that semiconductor device. However the invention is not limited to this description and may be applied in a variety of ways and forms including a semiconductor device and a manufacturing method for that semiconductor device including other sensors with cavities between the electrodes such as pressure sensors and microphones, etc.

This invention is for example ideal for semiconductor devices including sensors utilizing MEMS technology and manufacturing technology for such semiconductor devices.

What is claimed is:

1. A semiconductor device whose main surface contains a sensor region where multiple sensor cells are formed, comprising:
   a semiconductor substrate;
   a first insulating film formed on the semiconductor substrate;
   a second insulating film formed on the first insulating film;
   a patterned first conducting layer formed on the second insulating film;
   a third insulating film formed to cover the first conducting layer on the second insulating film; and
   a fourth insulating film formed on the third insulating film, wherein each of the multiple sensor cells in the sensor region includes:
a first cavity formed between the first insulating film and the second insulating film; and
a first electrode formed from the first conducting layer, above the first cavity,
wherein a first opening is formed on the second and the third insulating films to reach the first cavity by penetrating through the second and the third insulating films,
wherein the fourth insulating film blocks the first opening,
wherein a second cavity is formed between the first insulating film and the second insulating film, on a first region other than the sensor region on the main surface of the semiconductor device,
wherein a second opening is formed in the second and the third insulating films to reach the second cavity by penetrating through the second and the third insulating films,
wherein the fourth insulating film blocks the second opening, and
wherein among the second cavities, no first conducting layer is formed over the second cavity position farthest from the second opening.

2. A semiconductor device according to claim 1, further comprising:
a patterned second conducting layer formed on the semiconductor substrate,
wherein the first insulating film is formed to cover the second conducting layer on the semiconductor substrate,
wherein each of the multiple sensor cells is formed from the second conducting layer on the sensor region, and
wherein the semiconductor device further comprises a second electrode formed below the first cavity.

3. A semiconductor device according to claim 2, wherein a second conducting layer is formed below the second cavity.

4. A semiconductor device according to claim 2, wherein each of the multiple sensor cells is a variable capacitive sensor including: a first electrode, a second electrode, a first insulating film between the first electrode and the second electrode, and a first cavity and the second insulating film.

5. A semiconductor device according to claim 1, wherein no first conducting layer is formed over the second cavity.

6. A semiconductor device according to claim 1, wherein the first cavity and the second cavity are the same thickness.

7. A semiconductor device according to claim 1, wherein the second cavity is a cavity not utilized as a sensor.

8. A semiconductor device according to claim 1, wherein the first cavity and the second cavity are the same flat shape.

9. A semiconductor device according to claim 8, wherein the position of the first opening versus the first cavity, and the position of the second opening versus the second cavity are the same.

10. A semiconductor device according to claim 1, wherein a second distance from a second position farthest from the second opening, to the second opening nearest the second position in the second cavity, is larger than a first distance from a first position farthest from the first opening, to the first opening nearest the first position in the first cavity.

11. A semiconductor device according to claim 10, wherein the first cavity and the second cavity are similar flat shapes, and the second cavity is larger than the first cavity.

12. A semiconductor device according to claim 10, wherein the flat shape of the second cavity extends in one direction, and the second opening is formed near the edge of that second cavity.

13. A semiconductor device according to claim 12, further comprising a scaled pattern formed near the second cavity.

14. A semiconductor device according to claim 1,
wherein a first cavity pattern containing multiple connected first cavities formed in respective sensor cells, is formed in a sensor region,
wherein a second cavity pattern containing multiple connected second cavities and the same shape as the first cavity pattern is formed on a first region, and
wherein a position for a first opening on a first cavity pattern and, a position for a second opening on a second cavity pattern are the same.

15. A semiconductor device whose main surface contains a sensor region formed from multiple sensor cells, comprising:
a semiconductor substrate;
a patterned second conducting layer formed on the semiconductor substrate;
a first insulating film formed to cover the second conducting layer on the semiconductor substrate;
a second insulating film formed on the first insulating film;
a patterned first conducting layer formed on the second insulating film;
a third insulating film formed to cover the first conducting layer on the second insulating film; and
a fourth insulating film formed on the third insulating film,
wherein each of the multiple sensor cells in the sensor region includes:
a second electrode formed from the second conducting layer;
a first electrode formed from the first conducting layer to face the second electrode; and
a first cavity formed between the first electrode and the second electrode, and between the first insulating film and the second insulating film,
wherein a first opening is formed on the second and the third insulating films to reach the first cavity by penetrating through the second and the third insulating films,
wherein the fourth insulating film blocks the first opening,
wherein a second cavity is formed between the first insulating film and the second insulating film, on a first region other than the sensor region on the main surface of the semiconductor device,
wherein a second opening is formed in the second and the third insulating films to reach the second cavity by penetrating through the second and the third insulating films,
wherein the fourth insulating film blocks the second opening, and
wherein among the second cavities, no second conducting layer is formed below the second cavity position farthest from the second opening.

16. A semiconductor device according to claim 15, wherein no second conducting layer is formed below the second cavity.

17. A semiconductor device according to claim 16, wherein the semiconductor substrate is transparent to light.

* * * * *